(12) United States Patent
Shiihara et al.

(10) Patent No.: US 12,396,277 B2
(45) Date of Patent: Aug. 19, 2025

(54) IMAGING DEVICE

(71) Applicant: SONY SEMICONDUCTOR SOLUTIONS CORPORATION, Kanagawa (JP)

(72) Inventors: Yu Shiihara, Kanagawa (JP); Takashi Machida, Tokyo (JP); Yusuke Oike, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 447 days.

(21) Appl. No.: 17/773,824

(22) PCT Filed: Apr. 23, 2020

(86) PCT No.: PCT/JP2020/017539
§ 371 (c)(1),
(2) Date: May 2, 2022

(87) PCT Pub. No.: WO2021/095285
PCT Pub. Date: May 20, 2021

(65) Prior Publication Data
US 2022/0375975 A1 Nov. 24, 2022

(30) Foreign Application Priority Data
Nov. 15, 2019 (JP) .................... 2019-207287

(51) Int. Cl.
*H01L 27/146* (2006.01)
*H10F 39/00* (2025.01)

(52) U.S. Cl.
CPC ....... *H10F 39/8037* (2025.01); *H10F 39/809* (2025.01)

(58) Field of Classification Search
CPC ......... H01L 27/14612; H01L 27/14634; H01L 27/14623; H01L 27/14627;
(Continued)

(56) References Cited

U.S. PATENT DOCUMENTS 10,334,191 B1 * 6/2019 Yang .................. H04N 25/75
11,189,655 B1 * 11/2021 Mun .................. H01L 21/76229
(Continued)

FOREIGN PATENT DOCUMENTS

CN 102280462 A 12/2011
CN 107851655 A 3/2018
(Continued)

OTHER PUBLICATIONS

International Search Report prepared by the European Patent Office on Jul. 7, 2020, for International Application No. PCT/JP2020/017539, 3 pgs.
(Continued)

*Primary Examiner* — Tony Ko
(74) *Attorney, Agent, or Firm* — SHERIDAN ROSS P.C.

(57) ABSTRACT

There is provided an imaging device including a first semiconductor substrate of a first conductivity type that includes a first surface and a second surface on an opposite side from the first surface, a photoelectric conversion unit of a second conductivity type, embedded into the first surface of the first semiconductor substrate, that generates a charge corresponding to an amount of received light by photoelectric conversion, a first charge storage unit and a second charge storage unit of the second conductivity type, embedded in parallel into the second surface of the first semiconductor substrate, that store the charge generated in the photoelectric conversion unit, a first charge transfer unit that transfers the charge from the photoelectric conversion unit to the first charge storage unit, and a second charge transfer unit that transfers the charge from the photoelectric conversion unit to the second charge storage unit.

20 Claims, 41 Drawing Sheets

(58) Field of Classification Search
CPC ......... H01L 27/14603; H01L 27/14614; H01L 27/14636; H01L 27/14641; H01L 27/1463; H01L 27/1464; H01L 27/14683; H04N 25/771
See application file for complete search history.

(56) References Cited

U.S. PATENT DOCUMENTS

| | | |
|---|---|---|
| 2018/0213174 A1 | 7/2018 | Sano |
| 2019/0104268 A1 | 4/2019 | Shirini et al. |
| 2019/0148448 A1 | 5/2019 | Lee |
| 2020/0092505 A1 | 3/2020 | Sano |

FOREIGN PATENT DOCUMENTS

| | | |
|---|---|---|
| CN | 110383480 A | 10/2019 |
| JP | 2017-220896 | 12/2017 |
| TW | 201834227 A | 9/2018 |
| WO | WO 2017/183477 | 10/2017 |
| WO | WO 2016/129410 | 11/2017 |
| WO | WO 2019/181489 | 9/2019 |

OTHER PUBLICATIONS

Written Opinion prepared by the European Patent Office on Jul. 7, 2020, for International Application No. PCT/JP2020/017539, 4 pgs.

* cited by examiner

[Fig. 37]
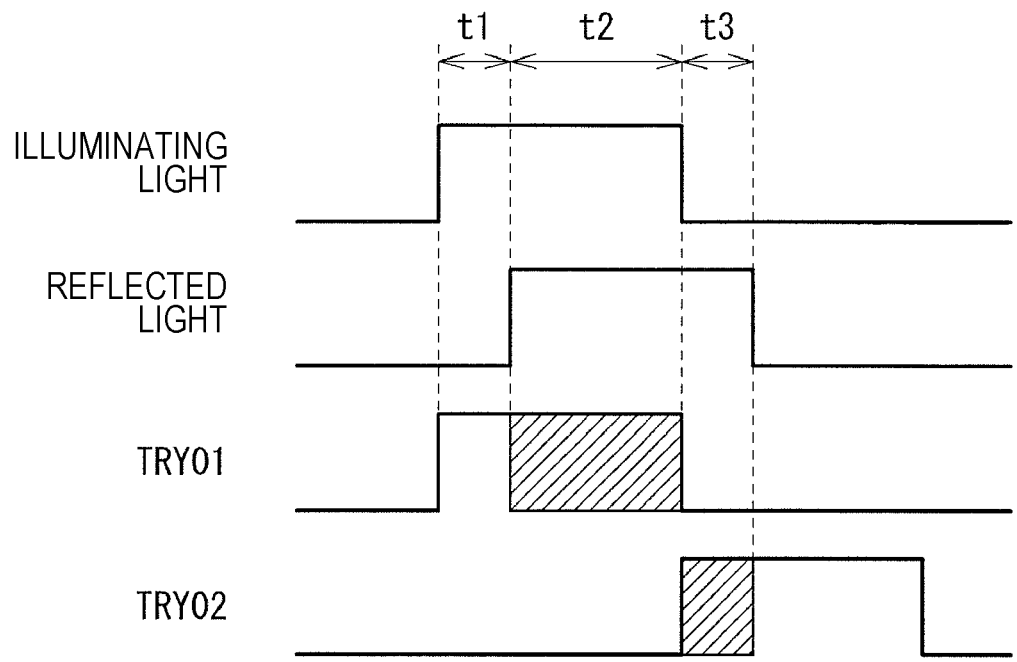

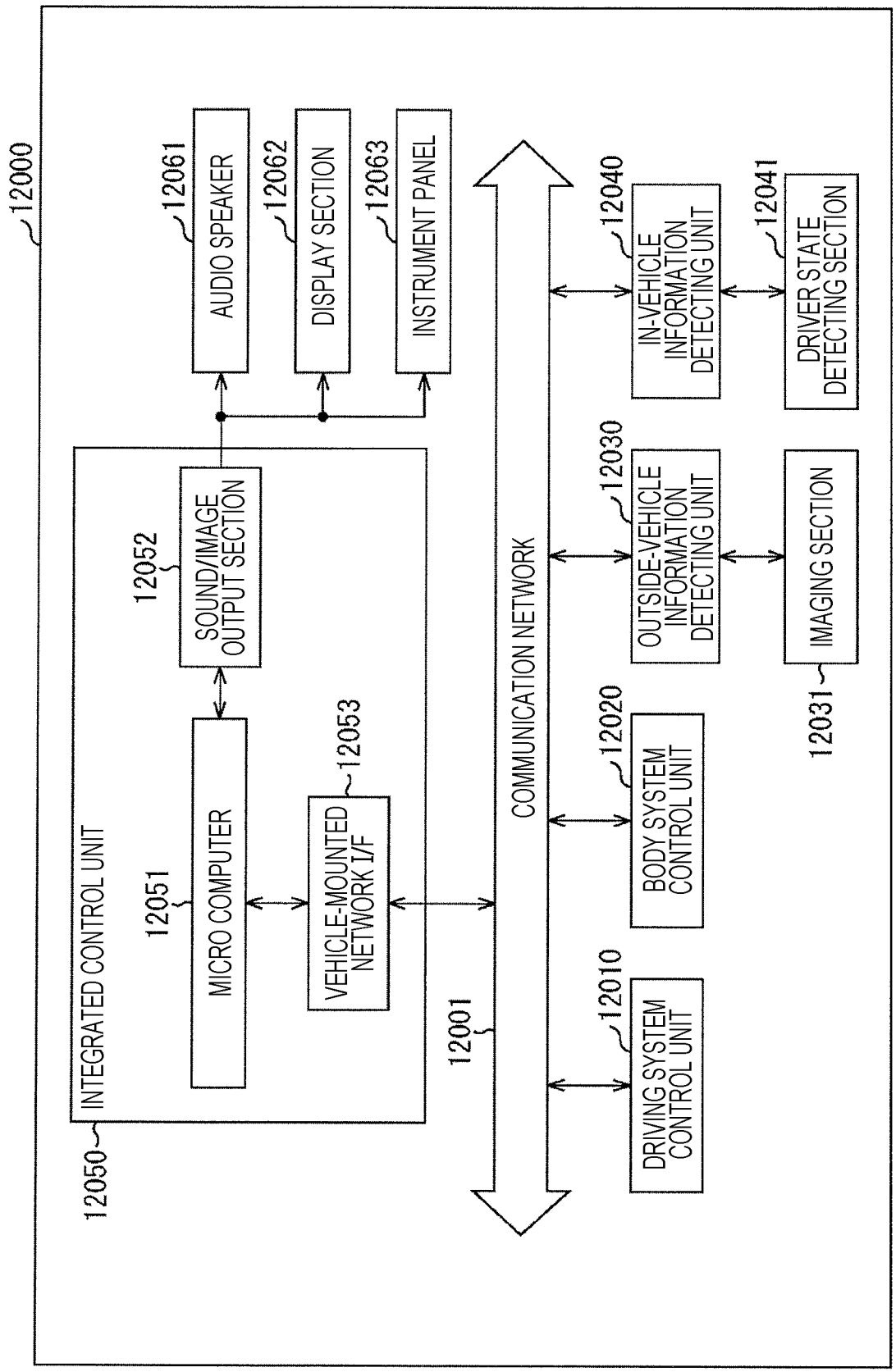

[Fig. 39]
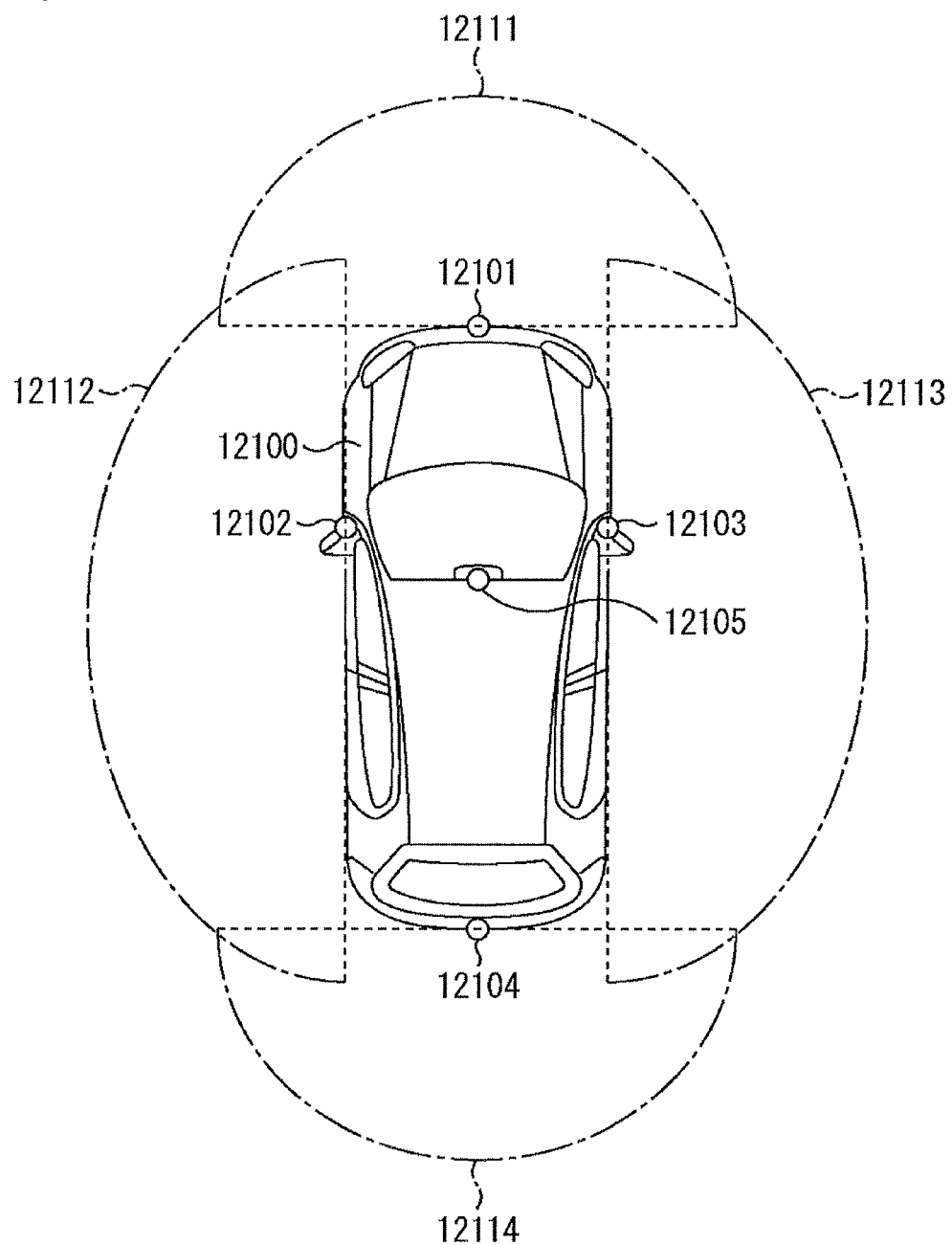

IMAGING DEVICE

CROSS REFERENCE TO RELATED APPLICATIONS

This application is a national stage application under 35 U.S.C. 371 and claims the benefit of PCT Application No. PCT/JP2020/017539, having an international filing date of 23 Apr. 2020, which designated the United States, which PCT application claimed the benefit of Japanese Priority Patent Application JP 2019-207287, filed 15 Nov. 2019, the entire disclosures of each of which are incorporated herein by reference.

TECHNICAL FIELD

The present disclosure relates to an imaging device that takes an image by performing photoelectric conversion.

BACKGROUND ART

Heretofore, a solid-state image sensor that achieves a global shutter by providing a charge holding unit (memory unit) between a photoelectric conversion unit and a floating diffusion has been proposed. For example, Patent Literature 1 discloses an imaging device provided with two holding units in a unit pixel, in which the imaging device achieves the storage of a signal charge over a long period of time by performing a transfer of charge from the photoelectric conversion unit to the holding units a plurality of times for each holding unit during an exposure period. For example, Patent Literature 2 discloses an image sensor provided with two or more charge storage units with respect to a single photoelectric conversion unit, in which the image sensor is capable of taking a high dynamic range image by repeatedly transferring charge over different exposure times.

CITATION LIST

Patent Literature

PTL 1: JP 2017-220896A
PTL 2: JP 2016-574723A

SUMMARY

Technical Problem

Meanwhile, in imaging devices, there is demand for a larger saturation charge and an improvement in sensitivity.

It is desirable to provide an imaging device capable of having a larger saturation charge and also improved sensitivity.

Solution to Problem

According to one embodiment of the present disclosure, there is provided an imaging device including a first semiconductor substrate of a first conductivity type that includes a first surface and a second surface on an opposite side from the first surface, a photoelectric conversion unit of a second conductivity type, embedded into the first surface of the first semiconductor substrate, that generates a charge corresponding to an amount of received light by photoelectric conversion, a first charge storage unit and a second charge storage unit both which are the second conductivity type, embedded in parallel into the second surface of the first semiconductor substrate, that store the charge generated in the photoelectric conversion unit, a first charge transfer unit that transfers the charge from the photoelectric conversion unit to the first charge storage unit, and a second charge transfer unit that transfers the charge from the photoelectric conversion unit to the second charge storage unit.

In the imaging device according to one embodiment of the present disclosure, two charge storage units (a first charge storage unit and a second charge storage unit) are provided with respect to a single photoelectric conversion unit, the photoelectric conversion unit being disposed on a first surface of a semiconductor substrate while the two charge storage units are disposed on a second surface of the semiconductor substrate. With this arrangement, the area of the photoelectric conversion unit and the two charge storage units inside a sensor pixel is expanded.

BRIEF DESCRIPTION OF DRAWINGS

FIG. 28 is a circuit diagram illustrating a circuit configuration of the imaging device illustrated in FIG. 26 or the like.

FIG. 29 is a timing chart illustrating an example of operations by the imaging device illustrated in FIG. 26 or the like.

FIG. 37 is a timing chart illustrating an example of operations by the distance measuring device illustrated in FIG. 35.

FIG. 38 is a block diagram illustrating an example of a schematic configuration of a vehicle control system.

FIG. 39 is an explanatory diagram illustrating an example of installation positions of an outside-vehicle information detecting unit and the imaging section.

DESCRIPTION OF EMBODIMENTS

Figure 1A:
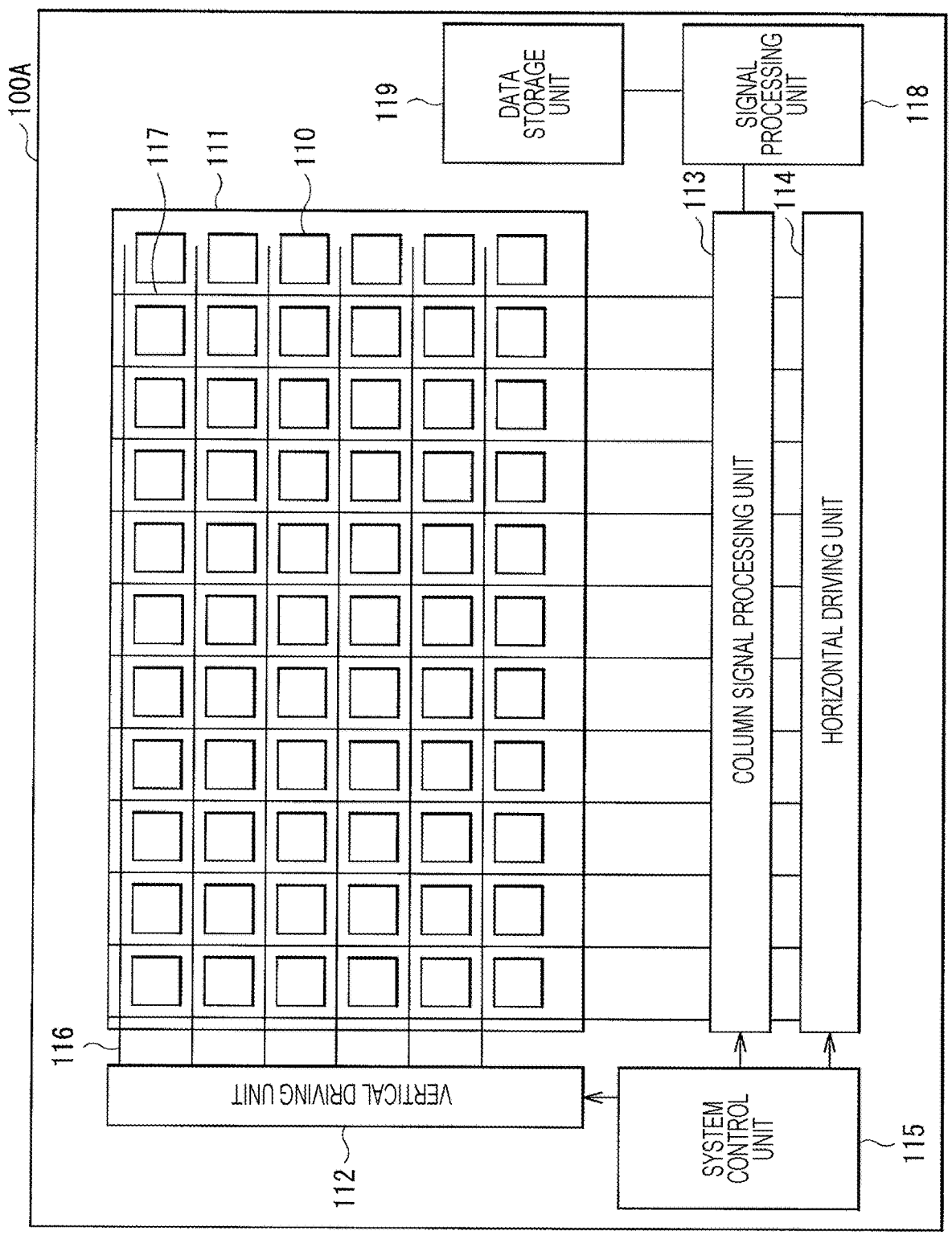
FIG. 1A is a block diagram illustrating an exemplary configuration of functions of an imaging device according to a first embodiment of the present disclosure.

Hereinafter, an embodiment according to the present disclosure will be described in detail and with reference to the drawings. The following description is a specific example of the present disclosure, and the present disclosure is not limited to the following form. Additionally, the present disclosure is not limited to properties such as the arrangement, dimensions, and ratios of dimensions for the components illustrated in the drawings. Hereinafter, the description will proceed in the following order.

1. First embodiment
(example of semiconductor device in which one photoelectric conversion unit and two charge storage units are stacked in semiconductor substrate)
1-1. Schematic configuration of imaging device
1-2. Specific configuration of imaging device
1-3. Operations by imaging device
1-4. Action and effects
2. Second embodiment
(example of semiconductor device in which pixel transistors except transfer transistor are formed on separate substrate and stacked)
3. Modifications
3-1. Modification 1 (example of sticking two semiconductor substrates face-to-back)
3-2. Modification 2 (example of providing third transfer transistor containing vertical transistor)
3-3. Modification 3 (example of forming first transfer transistor as vertical transistor)
3-4. Modification 4 (example of additionally providing discharge transistor)
3-5. Modification 5 (example of additionally providing fourth transfer transistor)
3-6. Modification 6 (example of sharing two FDs between neighboring sensor pixels)
3-7. Modification 7 (example of providing two MEMs with mutually different areas)
3-8. Modification 8 (example of forming one MEM with FD)
3-9. Modification 9 (example of providing four MEMs in one PD)
4. Examples of application
5. Examples of practical use

1. FIRST EMBODIMENT (1-1. Schematic Configuration of Imaging Device)

FIG. 1A is a block diagram illustrating an exemplary configuration of functions of an imaging device 100A according to a first embodiment of the present disclosure.

The imaging device 100A is what is referred to as a back-illuminated image sensor of the global shutter method, such as a complementary metal-oxide semiconductor (CMOS) image sensor for example. The imaging device 100A takes an image by receiving light from a subject, performing photoelectric conversion, and generating an image signal.

The global shutter method refers to a method of performing a global exposure, in which basically exposure is started for all pixels at the same time and exposure is ended for all pixels at the same time. Herein, all pixels refer to all of the pixels in a portion where an image appears, and exclude areas such as dummy pixels. Also, if the time difference and image distortion are sufficiently small enough not to pose a problem, the global shutter method includes a method of moving a global exposure region while performing a global exposure in units of plural rows (for example, several dozen rows) rather than on all pixels at the same time. Also, the global shutter method includes a method of performing a global exposure on pixels in a predetermined region rather than on all pixels in the portion where an image appears.

A back-illuminated image sensor refers to an image sensor configured such that a photoelectric conversion unit, such as a photodiode that receives light from a subject and converts the light into an electrical signal, is provided between a light-receiving face on which the light from the subject is incident and an interconnect layer where wiring elements such as transistors for driving each pixel are provided.

For example, the imaging device 100A is provided with a pixel array unit 111, a vertical driving unit 112, a column signal processing unit 113, a data storage unit 119, a horizontal driving unit 114, a system control unit 115, and a signal processing unit 118.

In the imaging device 100A, the pixel array unit 111 is formed on a semiconductor substrate 10 (described later). Peripheral circuits such as the vertical driving unit 112, the column signal processing unit 113, the data storage unit 119, the horizontal driving unit 114, the system control unit 115, and the signal processing unit 118 are formed on the same semiconductor substrate 10 as the pixel array unit 111, for example.

The pixel array unit 111 includes a plurality of sensor pixels 110 including a photoelectric conversion unit 11 (described later) that generates and stores charge according to the amount of incident light from the subject. As illustrated in FIG. 1, the sensor pixels 110 are arrayed in each of a horizontal direction (row direction) and a vertical direction (column direction). In the pixel array unit 111, a pixel driving line 116 is laid out in the row direction for every pixel row containing the sensor pixels 110 arrayed in a single line in the row direction, and a vertical signal line (VSL) 117 is laid out in the column direction for every pixel column containing the sensor pixels 110 arrayed in a single line in the column direction.

The vertical driving unit 112 includes components such as a shift register and an address decoder. By respectively supplying information such as a signal to the plurality of the sensor pixels 110 through the plurality of the pixel driving lines 116, the vertical driving unit 112 drives all of the plurality of sensor pixels 110 in the pixel array unit 111 at the same time or driven in units of pixel rows.

The signals output from the unit pixels of a pixel row selectively scanned by the vertical driving unit 112 are supplied to the column signal processing unit 113 through each of the VSLs 117. For every pixel column of the pixel array unit 111, the column signal processing unit 113 performs predetermined signal processing on the signals output through the VSLs 117 from the unit pixels on the selected row, and also temporarily holds the processed pixel signals.

Specifically, the column signal processing unit 113 contains components such as a shift register and an address decoder for example, performs processes such as a noise removal process, a correlated double sampling process, and an analog/digital (A/D) conversion process on an analog pixel signal, and generates a digital pixel signal. The column signal processing unit 113 supplies the generated pixel signal to the signal processing unit 118.

The horizontal driving unit 114 contains components such as a shift register and an address decoder, and sequentially selects a unit circuit corresponding to a pixel column of the column signal processing unit 113. Pixel signals processed by each unit circuit in the column signal processing unit 113 by a selective scan by the horizontal driving unit 114 are sequentially output to the signal processing unit 118.

The system control unit 115 contains components such as a timing generator that generates various timing signals. The system control unit 115 controls the driving of the vertical driving unit 112, the column signal processing unit 113, and the horizontal driving unit 114 on the basis of the timing signals generated by the timing generator.

The signal processing unit 118 performs signal processing such as arithmetic processing on pixel signals supplied from the column signal processing unit 113 while temporarily storing data in the data storage unit 119 as necessary, and outputs an image signal containing each of the pixel signals.

During the signal processing by the signal processing unit 118, the data storage unit 119 temporarily stores data necessary for the signal processing.

Figure 1B:
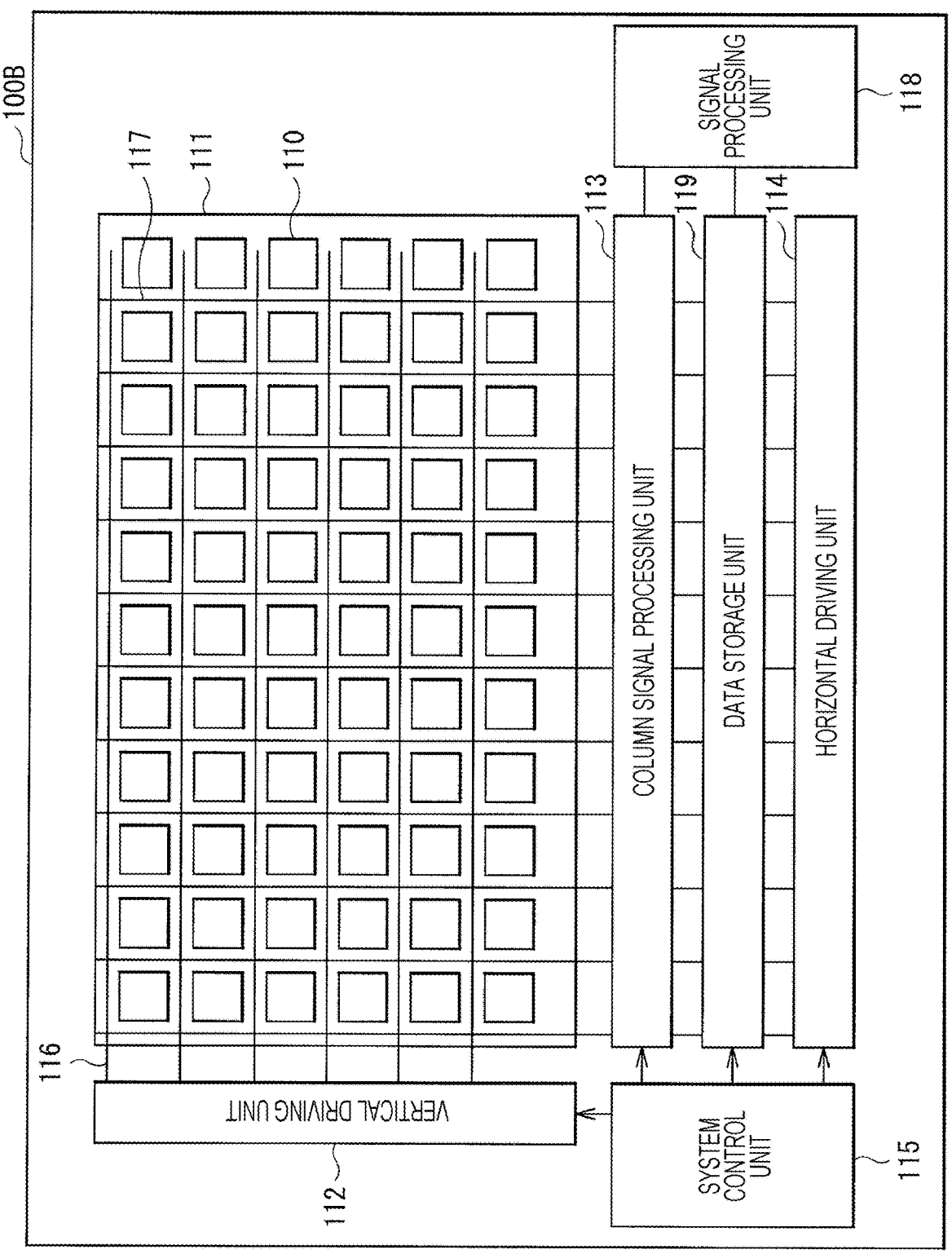
FIG. 1B is a block diagram illustrating an exemplary configuration of functions of an imaging device as a first modification of the first embodiment.
Figure 1C:
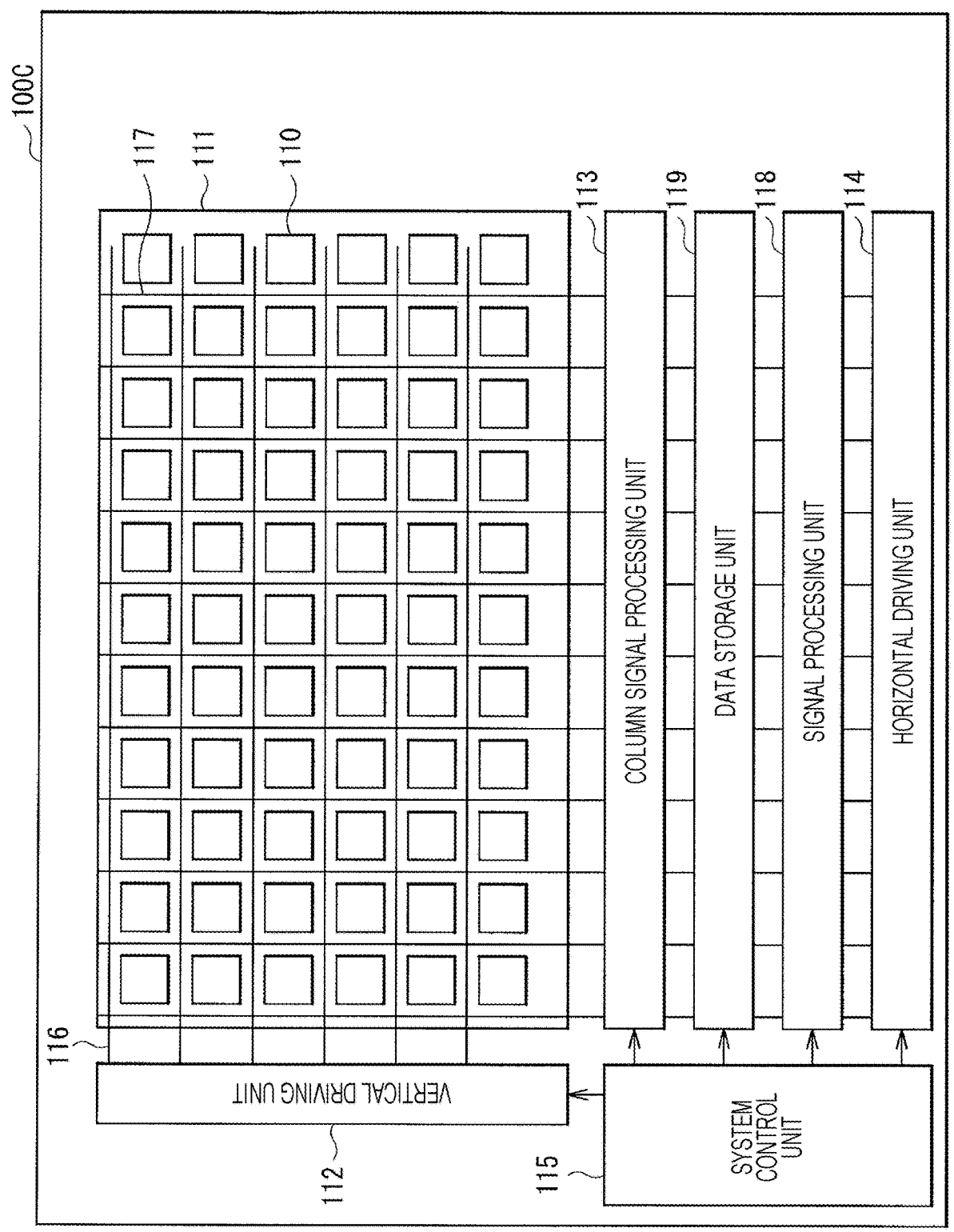
FIG. 1C is a block diagram illustrating an exemplary configuration of functions of an imaging device as a second modification of the first embodiment.

Note that the imaging device of the present disclosure is not limited to the imaging device 100A illustrated in FIG. 1A, and may also have a configuration like that of the imaging device 100B illustrated in FIG. 1B or the imaging device 100C illustrated in FIG. 1C, for example. FIG. 1B is a block diagram illustrating an exemplary configuration of functions of the imaging device 100B as a first modification according to the first embodiment of the present disclosure. FIG. 1C is a block diagram illustrating an exemplary configuration of functions of the imaging device 100C as a second modification according to the first embodiment of the present disclosure.

In the imaging device 100B of FIG. 1B, the data storage unit 119 is disposed between the column signal processing unit 113 and the horizontal driving unit 114, and pixel signals output from the column signal processing unit 113 are supplied to the signal processing unit 118 by going through the data storage unit 119.

Also, in the imaging device 100C of FIG. 1C, the data storage unit 119 and the signal processing unit 118 are disposed in parallel between the column signal processing unit 113 and the horizontal driving unit 114. In the imaging device 100C, the column signal processing unit 113 performs the A/D conversion that converts analog pixel signals to digital pixel signals one column of the pixel array unit 111 at a time or multiple columns of the pixel array unit 111 at a time.

(1-2. Specific Configuration of Imaging Device)

Figure 2:
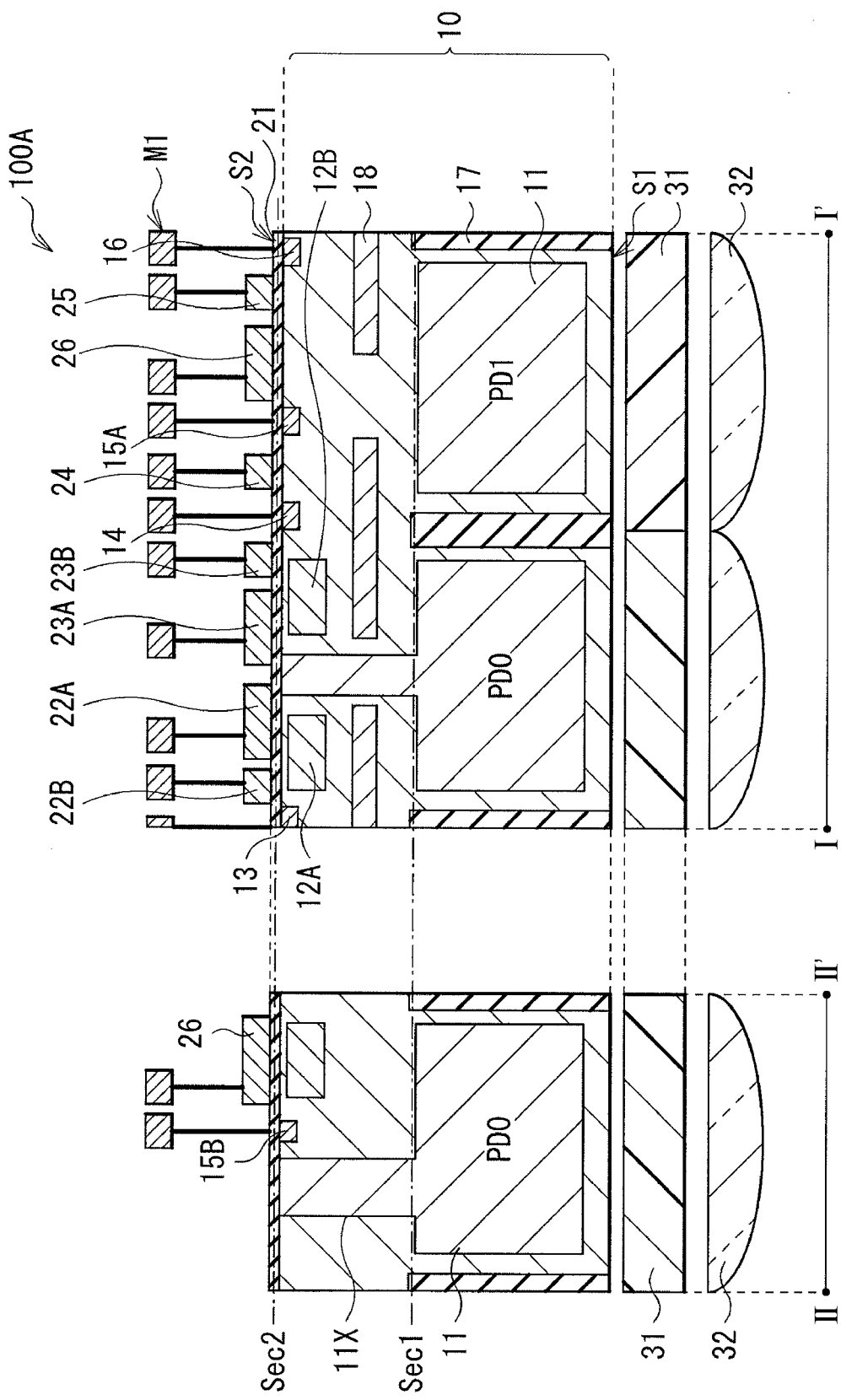
FIG. 2 is a schematic cross-section view illustrating one example of the configuration of the imaging device illustrated in FIG. 1A.

FIG. 2 is a schematic illustration of an example of a cross-sectional configuration of the pixel array unit 111 in the imaging device 100A illustrated in FIG. 1A, for example. Fig. is a schematic illustration of an example of a plan-view configuration of four sensor pixels 110 (sensor pixels 1100, 1101, 1102, and 1103) in Sec1 ((A) of FIG. 3) and Sec2 ((B) of FIG. 3) illustrated in FIG. 2 for example in the pixel array unit 111 of the imaging device 100A illustrated in FIG. 1A, for example. Note that the cross-section views in FIG. 2 correspond to the line I-I' and the line II-II' illustrated in FIG. 3. FIG. 4 is an illustration of an example of a circuit configuration of the sensor pixels 110 in the imaging device 100A illustrated in FIG. 1A for example, and illustrates an exemplary circuit configuration of the sensor pixel 1100 and the sensor pixel 1102 illustrated in FIG. 3.

The sensor pixels 110 in the pixel array unit 111 achieve a memory-holding global shutter. Each sensor pixel 110 of the present embodiment includes two charge storage units (MEM) 12A and 12B with respect to one photoelectric conversion unit (PD) 11, which are stacked in the semiconductor substrate 10. Specifically, the photoelectric conversion unit 11 is formed embedded into a first surface (back surface: surface S1) of the semiconductor substrate 10, while the charge storage units 12A and 12B are formed embedded into a second surface (front surface: surface S2) of the semiconductor substrate 10. The charge storage units 12A and 12B are disposed in parallel in the direction of the line I-I' illustrated in FIG. 3.

Figure 3:
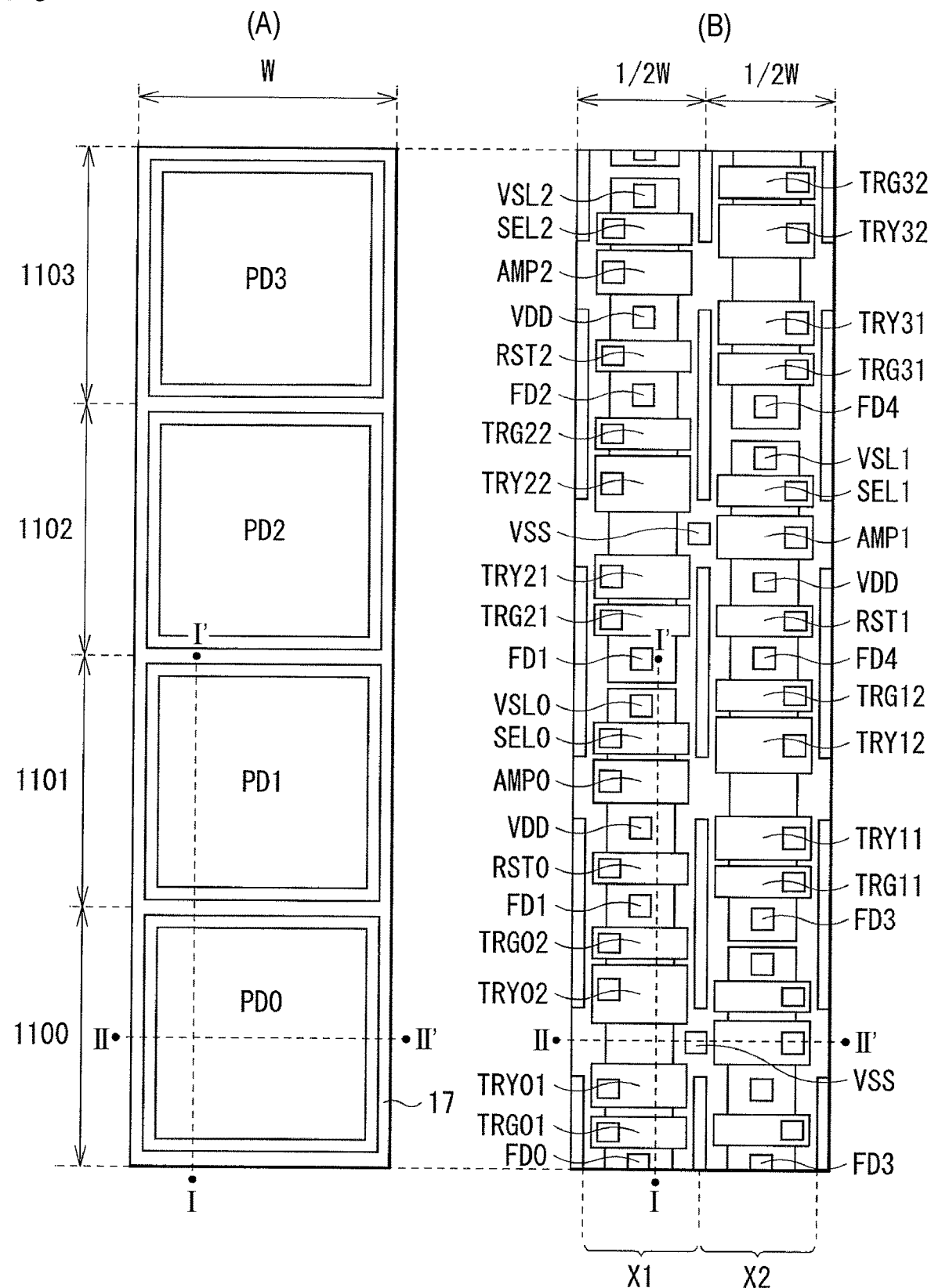
FIG. 3 is a schematic plan view illustrating one example of the configuration of sensor pixels in the imaging device illustrated in FIG. 1A.
Figure 4:
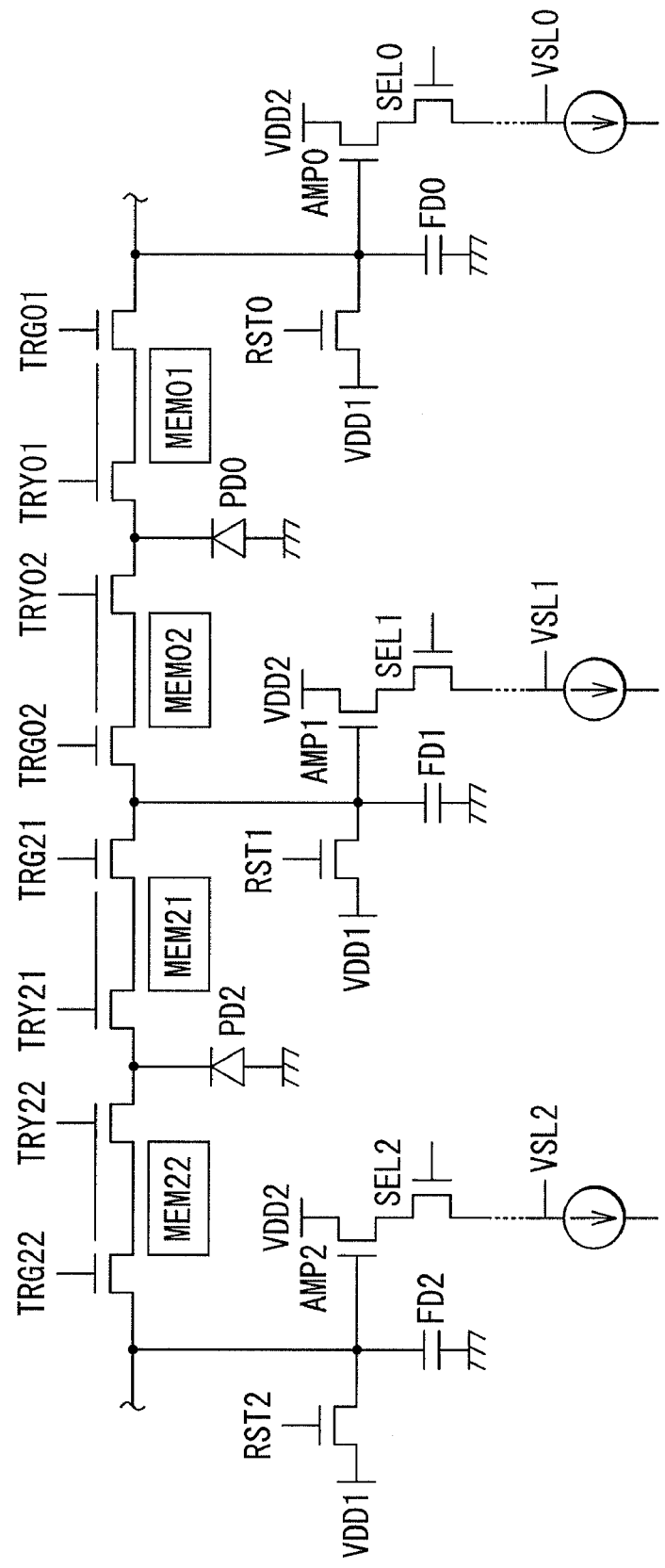
FIG. 4 is a circuit diagram illustrating a circuit configuration of the imaging device illustrated in FIG. 1A.

Although details are described later, in the present embodiment, the pitch of the photoelectric conversion unit 11 and the charge storage units 12A and 12B in the direction of the line II-IT illustrated in FIG. 3 is formed such that the photoelectric conversion unit 11 has a pitch (W) and the charge storage units 12A and 12B have approximately half-pitch (½W). On the second surface (surface S2) of the semiconductor substrate 10, pixel transistors described later are disposed in parallel spanning two adjacent sensor pixels for example along one direction (the direction of the line II-II') at approximately half-pitch of the photoelectric conversion unit 11, similarly to the charge storage units 12A and 12B. For this reason, in FIGS. 3 and 4, to distinguish the components of each sensor pixel 110 from each other, identification numbers (0, 1, 2, 3) are appended to the signs of the components of each sensor pixel 110. However, as an exception to the above, because two transfer transistors each (first transfer transistors TRY and second transistors TRG) are provided with respect to each sensor pixel 110, identification numbers (0, 1, 2, 3) are prepended to the signs. In the following, in a case where it is necessary to distinguish between the components of each sensor pixel 110, identification numbers will be prepended or appended to the signs of the components of each sensor pixel 110, but in a case where it is unnecessary to distinguish between the components of each sensor pixel 110, the identification numbers will be omitted from the end of the signs of the components of each sensor pixel 110.

First, an exemplary configuration of the circuit (pixel circuit) of each sensor pixel 110 provided in the pixel array unit 111 will be described with reference to FIG. 4. For example, each sensor pixel 110 includes power lines VDD1 and VDD2, a photoelectric conversion unit (PD), two charge storage units (MEM1 and MEM2), two charge-voltage conversion units (floating diffusions FD), and pixel transistors. The pixel transistors form a readout circuit that reads out signals output from the floating diffusions FD, and include first transfer transistors TRY1 and TRY2, second transfer transistors TRG1 and TRG2, a reset transistor RST, a select transistor SEL, and an amplification transistor AMP, for example.

In this example, the first transfer transistors TRY1 and TRY2, the second transfer transistors TRG1 and TRG2, the amplification transistor AMP, the select transistor SEL, and the reset transistor RST are all N-type MOS transistors, and each gate electrode is formed using polysilicon (poly-Si) for example. Each gate electrode of the first transfer transistors TRY1 and TRY2, the second transfer transistors TRG1 and TRG2, the amplification transistor AMP, the select transistor SEL, and the reset transistor RST is supplied with respective driving signals from the vertical driving unit 112 and the horizontal driving unit 114 on the basis of driving control by the system control unit 115. The driving signals are pulse signals that go to an active state (on state) at a high level, and go to an inactive state (off state) at a low level.

The PD (photoelectric conversion unit 11) is a photoelectric conversion element containing a P-N junction photodiode for example, and is configured to receive light from a subject, and generate and store a charge corresponding to the amount of received light by photoelectric conversion. The PD is formed embedded into the first surface (surface S1) of the semiconductor substrate 10 as described above, but a part of the PD (a raised part 11X) extends toward the second surface (surface S2).

MEM1 (charge storage unit 12A) is provided between the raised part 11X of the PD and one of the two FDs (for example, the floating diffusion FD13), while MEM2 (charge storage unit 12B) is provided between the raised part 11X of the PD and the other of the two FDs (for example, the floating diffusion FD14). To achieve the global shutter function, MEM1 and MEM2 temporarily hold charge while the charge generated and stored in the PD is transferred to the two FDs. MEM1 corresponds to a specific example of a "first charge storage unit" of the present disclosure, while MEM2 corresponds to a specific example of a "second charge storage unit" of the present disclosure. Also, the two FDs correspond to a specific example of a "first charge-voltage conversion unit" and a "second charge-voltage conversion unit" of the present disclosure.

The first transfer transistor TRY1 is disposed between the raised part 11X of the PD and MEM1, while the second transfer transistor TRG1 is disposed between MEM1 and one of the floating diffusions FD. The first transfer transistor TRY2 is disposed between the raised part 11X of the PD and MEM2, while the second transfer transistor TRG2 is disposed between MEM2 and the other floating diffusion FD. The first transfer transistors TRY1 and TRY2 are configured to transfer the charge stored in the PD to MEM1 and MEM2, respectively, according to driving signals applied to the gate electrodes of the first transfer transistors TRY1 and TRY2. The second transfer transistors TRG1 and TRG2 are configured to transfer the charge temporarily held in MEM1 and MEM2 to the respectively connected FDs, according to driving signals applied to the gate electrodes of the second transfer transistors TRG1 and TRG2. The first transfer transistor TRY1 and the second transfer transistor TRG1 correspond to a specific example of a "first charge transfer unit" of the present disclosure, while the first transfer transistor TRY2 and the second transfer transistor TRG2 correspond to a specific example of a "second charge transfer unit" of the present disclosure. In each sensor pixel 110, when the first transfer transistors TRY1 and TRY2 are turned off and the second transfer transistors TRG1 and TRG2 are turned on, for example, the charge stored in MEM1 and MEM2 is transferred to each of the FDs through the second transfer transistors TRG1 and TRG2.

The two FDs are floating diffusion regions that respectively convert the charge transferred from the PD through the first transfer transistor TRY1, MEM1, and the second transfer transistor TRG1, or the charge transferred from the PD through the first transfer transistor TRY2, MEM2, and the second transfer transistor TRG2, into an electrical signal (for example, a voltage signal) and output the electrical signal.

In the present embodiment, the two FDs are each shared by sensor pixels 110 two pixels away from each other. This point will be described using the sensor pixel 1100 and the sensor pixel 1102 illustrated in FIG. 3. The cathode of PD0 of the sensor pixel 1100 is electrically connected to the source of each of the first transfer transistors TRY01 and TRY02, while the anode of the PD0 is electrically connected to a reference potential line (for example, ground). The drains of the first transfer transistors TRY01 and TRY02 are electrically connected to the sources of the second transfer transistors TRG01 and TRG02, respectively. The drain of the second transfer transistor TRG01 is electrically connected to FD0, and the drain of the second transfer transistor TRG02 is electrically connected to FD1. The cathode of PD2 of the sensor pixel 1102 is electrically connected to the source of each of the first transfer transistors TRY21 and TRY22, while the anode of the PD2 is electrically connected to a reference potential line (for example, ground). The drains of the first transfer transistors TRY21 and TRY22 are electrically connected to the sources of the second transfer transistors TRG21 and TRG22, respectively. The drain of the second transfer transistor TRG21 is electrically connected to FD1, and the drain of the second transfer transistor TRG22 is electrically connected to FD2. In other words, FD1 is shared by the sensor pixel 1100 and the sensor pixel 1102. Also, although not illustrated in FIG. 4, FD0 is shared by the sensor pixel 1100 and a neighboring sensor pixel two pixels away on the opposite side from the sensor pixel 1102 (hereinafter referred to as the sensor pixel—1102 for convenience). FD2 is shared by the sensor pixel 1101 and a neighboring sensor pixel two pixels away on the opposite side from the sensor pixel 1100 (hereinafter referred to as the sensor pixel 1104 for convenience).

The reset transistor RST is connected to each of the two FDs, and in addition, the amplification transistor AMP and the select transistor SEL are connected to each of the two FDs through the VSLs (VSLs 117).

The reset transistor RST has a drain connected to the power line VDD1 and a source connected to one of the FDs. The reset transistor RST initializes, or in other words resets, the FD according to a driving signal applied to the gate electrode of the reset transistor RST. For example, when the reset transistor RST is turned on, the potential of the FD is reset to the voltage level of the power line VDD1. In other words, the FD is initialized.

The amplification transistor AMP outputs an electrical signal corresponding to the potential of the FD. The amplification transistor AMP forms a source follower circuit with a constant current source provided in the column signal processing unit 113 for example.

The select transistor SEL is turned on when the sensor pixel 110 is selected, and outputs an electrical signal from the FD through the amplification transistor AMP to the column signal processing unit 113 via the VSL 117.

Next, FIGS. 2, 3A, and 3B will be used to describe a cross-sectional configuration and a plan-view configuration of the sensor pixels 110 provided in the pixel array unit 111 of FIG. 1A.

Each sensor pixel 110 includes the semiconductor substrate 10 formed using a semiconductor material such as silicon (Si) for example, the photoelectric conversion unit 11, and the two charge storage units 12A and 12B. The semiconductor substrate 10 is P-type (a first conductivity type) for example, while the photoelectric conversion unit 11 and the charge storage units 12A and 12B are N-type (a second conductivity type). The photoelectric conversion unit 11 is formed embedded in the first surface (surface S1) of the semiconductor substrate 10, while the two charge storage units 12A and 12B are formed embedded in the second surface (surface S2) of the semiconductor substrate 10, disposed in parallel along the direction of the line I-I' illustrated in FIG. 3, for example. In other words, the photoelectric conversion unit 11 and the two charge storage units 12A and 12B are stacked in the semiconductor substrate 10. Specifically, the charge storage units 12A and 12B are formed embedded in parallel along the line I-I' for example, with the raised part 11X of the photoelectric conversion unit 11 in between. The charge generated by the photoelectric conversion unit 11 follows the raised part 11X toward the second surface (surface S2) of the semiconductor substrate 10 due to a potential gradient, and is distributed to the charge storage units 12A and 12B. In other words, the charge generated by the photoelectric conversion unit 11 is transferred in opposite directions with the raised part 11X of the photoelectric conversion unit 11 in between.

Also, on the second surface (surface S2) of the semiconductor substrate 10, floating diffusions FD13 and FD14, a VDD contact region 15A connected to the power line VDD, a VSS contact region 15B connected to a power line VSS, and a VSL contact region 16 connected to the VSL are provided.

Furthermore, as pixel transistors on the second surface (surface S2) side, each sensor pixel 110 includes, for example, first transfer transistors 22A (TRY1) and 23A (TRY2), second transfer transistors 22B (TRG1) and 23B (TRG2), a reset transistor 24 (RST), a select transistor 25 (SEL), and an amplification transistor 26 (AMP). Like the charge storage units 12A and 12B, the first transfer transistors 22A and 23A, the second transfer transistors 22B and 23B, the reset transistor 24, the select transistor 25, and the amplification transistor 26 are disposed along the line II-IT, spanning two adjacent sensor pixels, for example.

Specifically, the first transfer transistor 22A is disposed between the raised part 11X of the photoelectric conversion unit 11 and the charge storage unit 12A, while the second transfer transistor 22B is disposed between the charge storage unit 12A and the floating diffusion FD13. The first transfer transistor 23A is disposed between the raised part 11X of the photoelectric conversion unit 11 and the charge storage unit 12B, while the second transfer transistor 23B is disposed between the charge storage unit 12B and the floating diffusion FD14. The reset transistor 24 is disposed beside the second transfer transistor 23B with the floating diffusion FD14 in between. The amplification transistor 26 and the select transistor 25 are disposed in that order beside the reset transistor 24 with the VDD contact region 15A in between.

In the present embodiment, as above, the charge storage units 12A and 12B and the pixel transistors are formed at approximately half-pitch (½W) with respect to the pitch (W) of the photoelectric conversion unit 11, and the pixel transistors are disposed spanning two adjacent sensor pixels. Specifically, as illustrated in FIG. 3 for example, the pixel transistors of the sensor pixel 1100 (TRY01, TRY02, TRG01, TRG02, RST01, AMP01, and SEL01) are provided spanning the sensor pixel 1100 and the sensor pixel 1101 in a region X1 obtained by dividing the plurality of sensor pixels 110 into two sections in the direction of the line I-I', while the pixel transistors of the sensor pixel 1101 (TRY11, TRY12, TRG11, TRG12, RST11, AMP11, and SEL11) are provided spanning the sensor pixel 1100 and the sensor pixel 1101 in a region X2 obtained by dividing the plurality of sensor pixels 110 into two sections in the direction of the line I-I'. Also, the pixel transistors of the sensor pixel 1102 (TRY21, TRY22, TRG21, TRG22, RST21, AMP21, and SEL21) are provided spanning the sensor pixel 1101 and the sensor pixel 1102 in the region X1 obtained by dividing the plurality of sensor pixels 110 into two sections in the direction of the line I-I'. In other words, the pixel transistors of the sensor pixels 110 adjacent to each other in the direction of the line I-I' are respectively disposed alternating between one region and the other region obtained by dividing the plurality of sensor pixels 110 into two sections in the direction of the line I-I', and shifted by one sensor pixel.

An insulating film 21 containing an oxide or the like is provided between the semiconductor substrate 10 and the pixel transistors, for example. An interconnect layer containing components such as the gate electrodes of the pixel transistors (for example, an interconnect layer 20 described later; see FIG. 6) is provided on the insulating film 21. Inside the interconnect layer, in addition to the gate electrodes of the pixel transistors, interconnects M1 for applying driving signals to the gate electrodes are provided, for example. Furthermore, the semiconductor substrate 10 is provided with a pixel isolation part 17 that surrounds the photoelectric conversion unit 11, and an isolating film 18 that blocks light between the photoelectric conversion unit 11 and the charge storage units 12A and 12B, for example.

The pixel isolation part 17 is for optically and electrically isolating adjacent sensor pixels 110 from each other, and is provided between adjacent photoelectric conversion units 11 proceeding from the first surface (surface S1) to the second surface (surface S2) of the semiconductor substrate 10. For example, the pixel isolation part 17 contains a metal film such as tungsten (W) surrounded by an oxide film such as silicon oxide ($SiO_2$), hafnium oxide ($HfO_2$), zirconium oxide ($ZrO_2$), aluminum oxide ($Al_2O_3$), titanium oxide ($TiO_2$), or tantalum oxide ($Ta_2O_5$). With this arrangement, oblique incident light at risk of being incident from an adjacent pixel P is blocked by the metal film to achieve optical isolation, while in addition, adjacent sensor pixels are electrically isolated from each other by the oxide film.

The isolating film 18 electrically and optically isolates the photoelectric conversion unit 11 from the charge storage units 12A and 12B. For example, like the pixel isolation part 17, the isolating film 18 contains a metal film such as tungsten (W) or the like surrounded by an oxide film such as silicon oxide ($SiO_2$) or the like. By providing the isolating film 18 between the photoelectric conversion unit 11 and the charge storage units 12A and 12B, the incidence of light onto the charge storage units 12A and 12B is suppressed, and noise can be reduced. With this arrangement, the parasitic light sensitivity (PLS) characteristics are improved.

Furthermore, each sensor pixel 110 may also include a color filter 31 and an on-chip lens 32 on the first surface (surface S1) of the semiconductor substrate 10, or in other words, on the light-incident side.

The color filter 31 includes a red filter that transmits light in a red wavelength band, a green filter that transmits light in a green wavelength band, and a blue filter that transmits light in a blue wavelength band for example, and these filters are provided in a regular color array (such as a Bayer array) inside the pixel array unit 111 for example. A light-shielding part for example may also be provided between adjacent pixels of the color filter 31.

The on-chip lens 32 condenses light incident from the first surface (surface S1) side of the semiconductor substrate 10 onto the photoelectric conversion unit 11. The on-chip lens 32 is formed using a material having a high refractive index, specifically an inorganic material such as silicon oxide ($SiO_2$) or silicon nitride (SiN) for example. Otherwise, an organic material having a high refractive index such as episulfide resins or titanium compounds and their resins may be used. The shape of the on-chip lens 32 is not particularly limited, and any of various lens shapes such as hemispherical shapes and semicylindrical shapes can be used. As illustrated in FIG. 2, the on-chip lens 32 may be provided for every sensor pixel 110, or a single on-chip lens may be provided for a plurality of sensor pixels 110, for example.

(1-3. Operations by Imaging Device)

Figure 5:
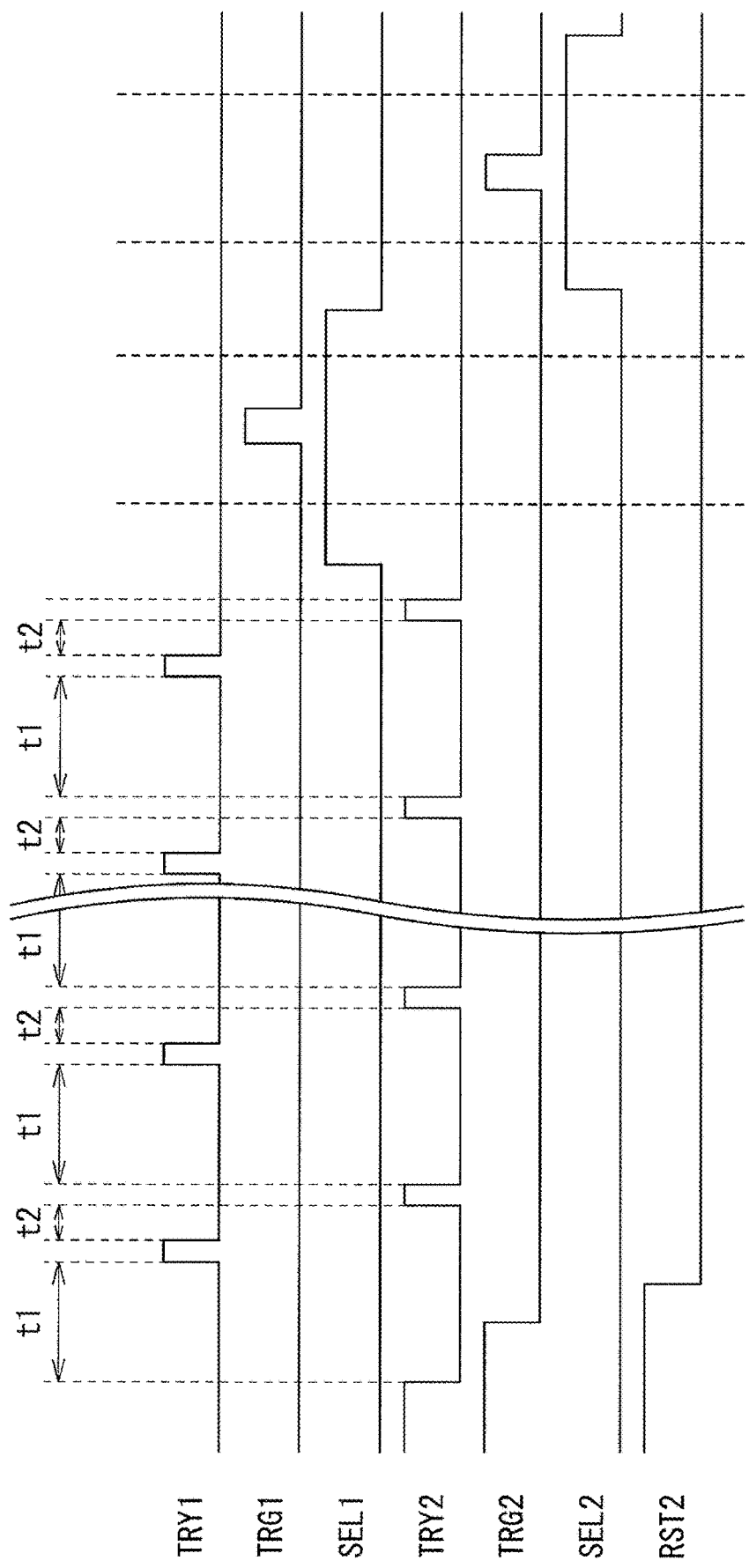
FIG. 5 is a timing chart illustrating an example of operations by the imaging device illustrated in FIG. 1A.

FIG. 5 illustrates an example of a timing chart for driving the sensor pixels 110 of the imaging device 100A.

In the imaging device 100A of the present embodiment, the reset of the PD is performed through MEM2, for example. First, after the first transfer transistor TRY2 is turned off, exposure in the sensor pixel 1100 is started, and the generation and storage of charge in the PD is started.

Thereafter, by turning on the first transfer transistor TRY1 after t1 seconds, the charge is transferred from the PD to MEM1. Next, after the first transfer transistor TRY1 is turned off, exposure in the sensor pixel 1100 is started, and the generation and storage of charge in the PD is resumed. Thereafter, by turning on the first transfer transistor TRY2 after t2 seconds, the charge is transferred from the PD to MEM2. This series of driving processes is repeated during a global transfer period.

After the global transfer period ends, the charge stored in each of MEM1 and MEM2 is transferred to each FD and output to the VSLs as voltage signals sequentially according to a rolling readout. At this time, a pseudo-sensitivity ratio can be imparted to the two units MEM1 and MEM2 according to the time difference between t1 and t2. With this arrangement, signals of different sensitivity can be stored at the same time and read out separately.

(1-4. Action and Effects)

In the imaging device 100A of the present embodiment, the two units MEM1 (charge storage unit 12A) and MEM2 (charge storage unit 12B) are provided with respect to the one PD (photoelectric conversion unit 11), the PD is disposed on the first surface (surface S1) of the semiconductor substrate 10, and the two units MEM1 and MEM2 are disposed on the second surface (surface S2) of the semiconductor substrate 10. With this arrangement, the area efficiency of the PD and the two units MEM1 and MEM2 in each sensor pixel 110 is increased. Hereinafter, the above point will be explained.

As described earlier, in an image sensor implementing a global shutter, a structure has been proposed in which two or more charge storage units (MEMs) are provided with respect to one photoelectric conversion unit (PD). In the image sensor, charge over a long time is stored, or in other words, a high dynamic range image is taken, by transferring charge a plurality of times for each MEM during the exposure period.

However, in the above image sensor, because the PD and the two MEMs are disposed on the same planar surface, the area of the PD and the MEMs inside a single pixel is decreased. This creates the problems of reduced saturation charge (Qs), lower sensitivity, and a lower degree of freedom in layout.

In contrast, in the present embodiment, the PD is formed embedded into the first surface (surface S1) of the semiconductor substrate 10, while the two units MEM1 and MEM2 are formed embedded into the second surface (surface S2) of the semiconductor substrate 10. In other words, the one PD and the two units MEM1 and MEM2 are stacked in the semiconductor substrate 10. This arrangement makes it possible to increase the area of the PD and the two units MEM1 and MEM2 in each sensor pixel 110.

According to the above, in the imaging device 100A of the present embodiment, the saturation charge (Qs) and the sensitivity can be improved. Consequently, it is possible to provide an imaging device having a greater saturation charge as well as higher sensitivity.

Moreover, in the imaging device 100A of the present embodiment, it is also possible to improve the degree of freedom in layout.

Also, in the imaging device 100A of the present embodiment, by providing the light-shielding isolating film 18 between the PD (photoelectric conversion unit 11) and the two units MEM1 (charge storage unit 12A) and MEM2 (charge storage unit 12B) stacked in the semiconductor substrate 10, the incidence of light transmitted through the PD into MEM1 and MEM2 is reduced. Consequently, it is possible to reduce the occurrence of false signals in MEM1 and MEM2.

Next, a second embodiment and Modifications 1 to 9 of the present disclosure will be described. In the following, components that are similar to those of the first embodiment above are denoted with the same signs, and the description of such components is omitted where appropriate.

2. SECOND EMBODIMENT

Figure 6:
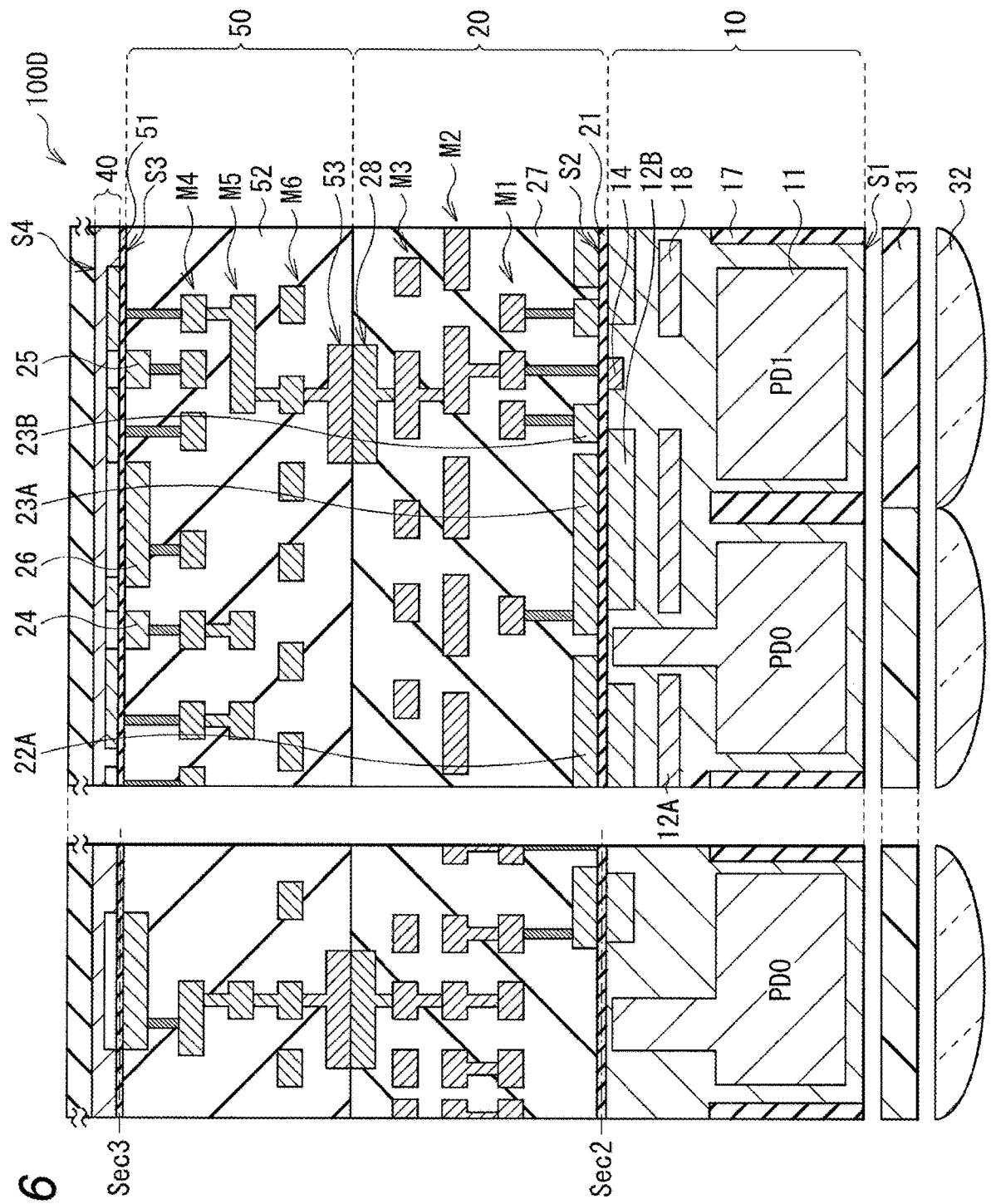
FIG. 6 is a schematic cross-section view illustrating an example of a configuration of an imaging device according to a second embodiment of the present disclosure.
Figure 7:
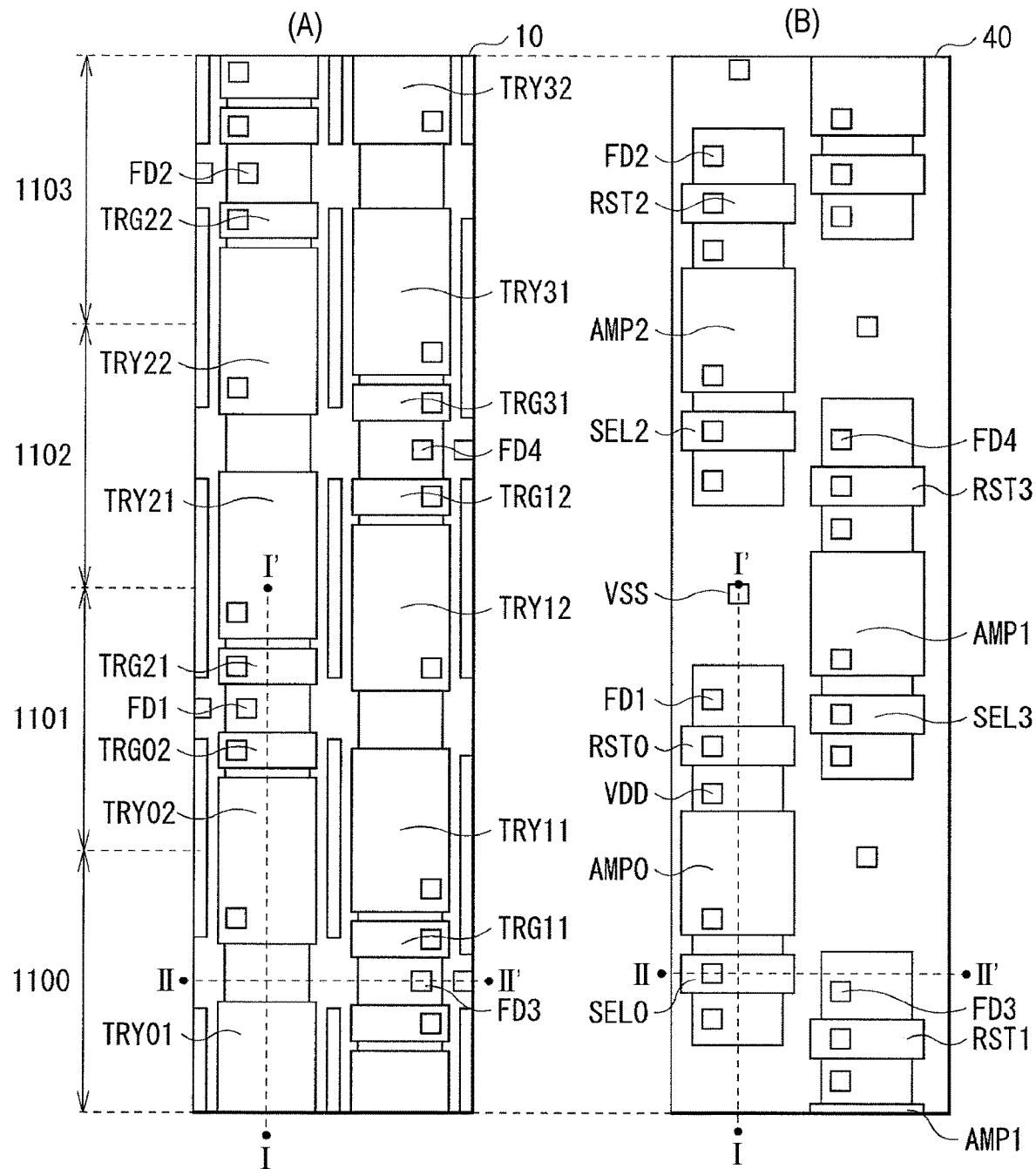
FIG. 7 is a schematic plan view illustrating one example of the configuration of sensor pixels in the imaging device illustrated in FIG. 6.

FIG. 6 is a schematic illustration of an example of a cross-sectional configuration of the pixel array unit 111 in the imaging device 100D according to a second embodiment of the present disclosure. FIG. 7 is a schematic illustration of an example of a plan-view configuration of four sensor pixels 110 (sensor pixels 1100, 1101, 1102, and 1103) in Sec2 ((A) of FIG. 7) and Sec3 ((B) of FIG. 7) illustrated in FIG. 6 for example in the pixel array unit 111 of the imaging device 100D illustrated in FIG. 6. Note that the cross-section views in FIG. 6 correspond to the line I-I' and the line II-IT illustrated in FIG. 7.

In the imaging device 100A of the first embodiment above, pixel transistors are provided on the second surface (surface S2) of the semiconductor substrate 10, namely the first transfer transistors 22A (TRY1) and 23A (TRY2), the second transfer transistors 22B (TRG1) and 23B (TRG2), the reset transistor 24 (RST), the select transistor 25 (SEL), and the amplification transistor 26 (AMP). In contrast, in an imaging device 100D of the present embodiment, among the above pixel transistors, the reset transistor 24 (RST), the select transistor 25 (SEL), and the amplification transistor 26 (AMP) are provided on a separate substrate from the semiconductor substrate 10, such as a semiconductor substrate 40, and the semiconductor substrates are stuck together by Cu—Cu bonding, for example.

Specifically, the photoelectric conversion unit 11 is formed embedded into the first surface (surface S1) of the semiconductor substrate 10 while the charge storage units 12A and 12B are formed embedded into the second surface (surface S2) of the semiconductor substrate 10, like the first embodiment above. Additionally, the insulating film 21 is provided on the second surface (surface S2) of the semiconductor substrate 10. Through the insulating film 21, the first transfer transistors 22A (TRY1) and 23A (TRY2) and the second transfer transistors 22B (TRG1) and 23B (TRG2) are provided on the second surface (surface S2) of the semiconductor substrate.

An interconnect layer 20 containing the insulating film 21 and a plurality of interconnects in addition to the gate electrodes of the first transfer transistors 22A (TRY1) and 23A (TRY2) and the second transfer transistors 22B (TRG1) and 23B (TRG2) is provided on the second surface (surface S2) of the semiconductor substrate 10. In the interconnect layer 20, interconnects M1, M2, and M3 are formed as a plurality of interconnects inside an interlayer insulating film 27. A plurality of pad electrodes 28 containing copper (Cu) for example is exposed on the surface of the interlayer insulating film 27.

The semiconductor substrate 40 is formed using a semiconductor material such as silicon (Si) for example, and has a first surface (front surface: surface S3) and a second surface (back surface: surface S4) which oppose each other. On the first surface (surface S3) of the semiconductor substrate, the reset transistor 24 (RST), the select transistor 25 (SEL), and the amplification transistor 26 (AMP) are provided via an insulating film 51 containing a material such as an oxide, for example.

An interconnect layer 50 containing the insulating film 51 and a plurality of interconnects in addition the gate electrodes of the reset transistor 24 (RST), the select transistor 25 (SEL), and the amplification transistor 26 (AMP) is provided on the first surface (surface S3) of the semiconductor substrate 40. In the interconnect layer 50, interconnects M4, M5, and M6 are formed as a plurality of interconnects inside an interlayer insulating film 52. A plurality of pad electrodes 53 containing copper (Cu) for example is exposed on the surface of the interlayer insulating film 52.

The semiconductor substrate 10 and the semiconductor substrate 40 are stuck together by causing the second surface (surface S2) of the semiconductor substrate 10 and the first surface (surface S3) of the semiconductor substrate 40 to face opposite each other, and bonding the plurality of the pad electrodes 28 and pad electrodes exposed on the surfaces of the interconnect layer 20 and the interconnect layer 50 respectively provided on each surface. In other words, the semiconductor substrate 10 and the semiconductor substrate 40 are stuck together in what is referred to as a face-to-face configuration.

Like the first embodiment above, the charge storage units 12A and 12B and the pixel transistors are formed at approximately half-pitch (½W) with respect to the pitch (W) of the photoelectric conversion unit 11. Also, in the present embodiment, the first transfer transistors 22A (TRY1) and 23A (TRY2) and the second transfer transistors 22B (TRG1) and 23B (TRG2) formed on the semiconductor substrate 10 are disposed in parallel spanning two adjacent sensor pixels. Similarly, the reset transistor 24 (RST), the select transistor 25 (SEL), and the amplification transistor 26 (AMP) formed on the semiconductor substrate 40 are also disposed in parallel spanning two adjacent sensor pixels. In other words, the area of the first transfer transistors 22A (TRY1) and 23A (TRY2) and the second transfer transistors 22B (TRG1) and 23B (TRG2) can be increased. This arrangement makes it possible to maximize the area of the charge storage units 12A and 12B.

In this way, in the imaging device 100D of the present embodiment, among the pixel transistors, the reset transistor 24 (RST), the select transistor 25 (SEL), and the amplification transistor 26 (AMP) excluding the first transfer transistors 22A (TRY1) and 23A (TRY2) and the second transfer transistors 22B (TRG1) and 23B (TRG2) are provided on a separate substrate (semiconductor substrate 40), thereby making it possible to further increase the area of the two units MEM1 (charge storage unit 12A) and MEM2 (12B). Consequently, compared to the imaging device 100A of the first embodiment above, the saturation charge (Qs) and the sensitivity can be improved further. Additionally, the degree of freedom in layout can be improved further.

3. MODIFICATIONS (3-1. Modification 1)

Figure 8:
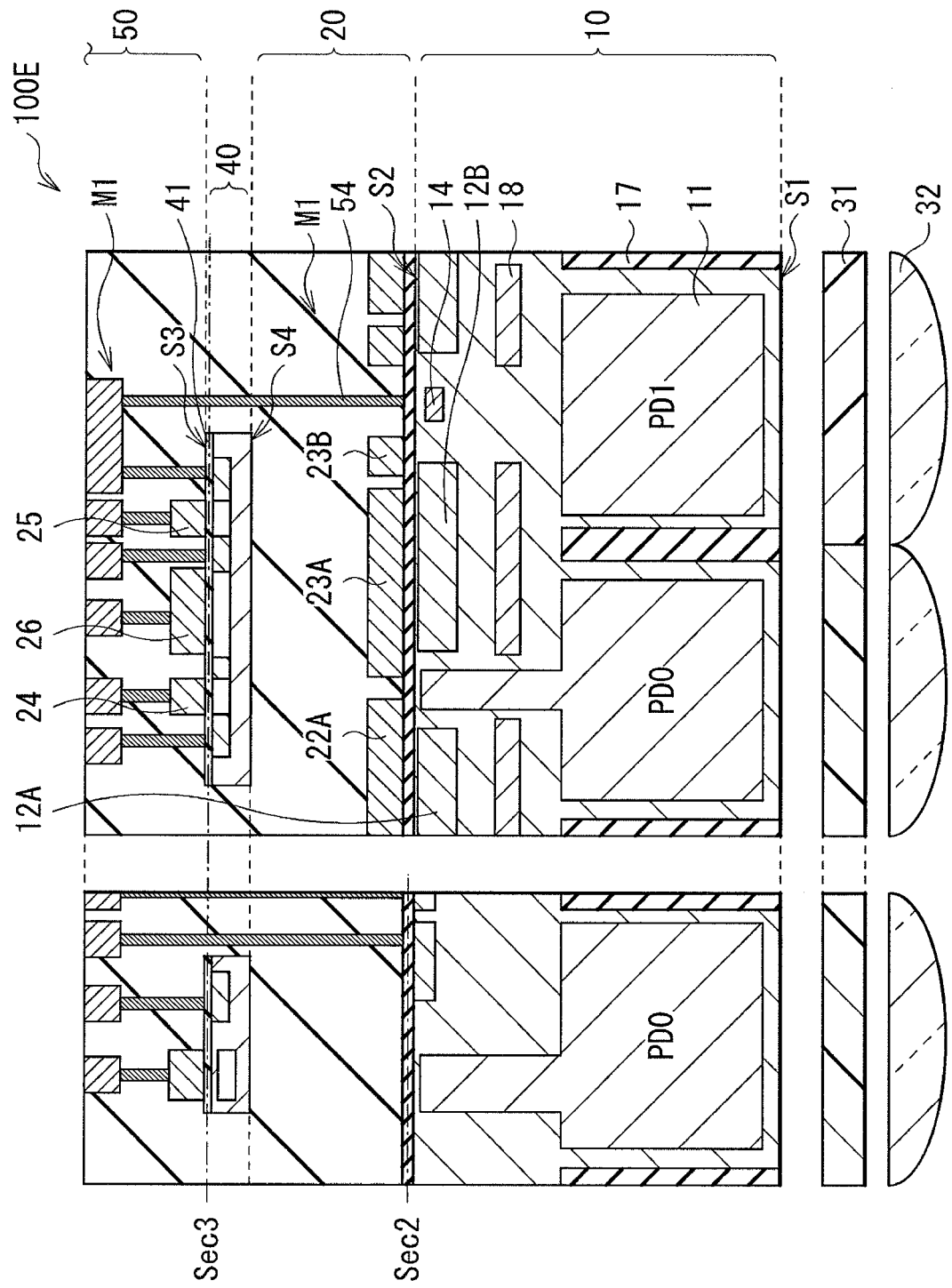
FIG. 8 is a schematic cross-section view illustrating an example of a configuration of an imaging device according to Modification 1 of the present disclosure.
Figure 9:
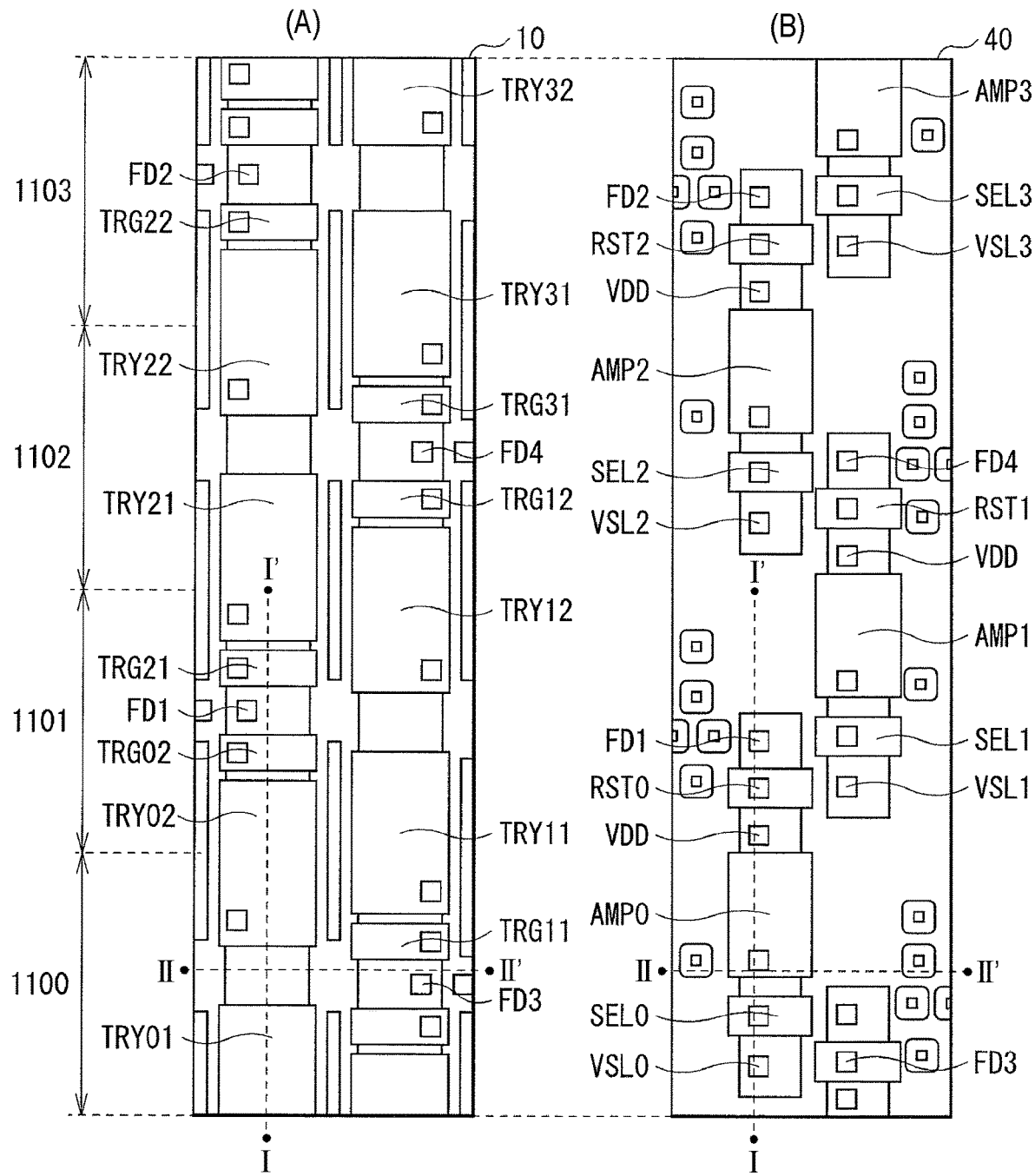
FIG. 9 is a schematic plan view illustrating one example of the configuration of sensor pixels in the imaging device illustrated in FIG. 8.

FIG. 8 is a schematic illustration of an example of a cross-sectional configuration of the pixel array unit 111 in the imaging device 100E according to Modification 1 of the present disclosure. FIG. 9 is a schematic illustration of an example of a plan-view configuration of four sensor pixels 110 (sensor pixels 1100, 1101, 1102, and 1103) in Sec2 ((A) of FIG. 9) and Sec3 ((B) of FIG. 9) illustrated in FIG. 8 for example in the pixel array unit 111 of the imaging device 100E illustrated in FIG. 8. Note that the cross-section views in FIG. 8 correspond to the line I-I' and the line II-IT illustrated in FIG. 9.

Like the imaging device 100D of the second embodiment above, in the imaging device 100E of the present modification, among the pixel transistors, the reset transistor 24 (RST), the select transistor 25 (SEL), and the amplification transistor 26 (AMP) are provided on a separate substrate (semiconductor substrate 40) from the semiconductor substrate 10 provided with the photoelectric conversion unit 11 (PD), the charge storage units 12A (MEM1) and 12B (MEM2), the first transfer transistors 22A (TRY1) and 23A (TRY2), and the second transfer transistors 22B (TRG1) and 23B (TRG2). Like the second embodiment above, among the pixel transistors, the reset transistor 24 (RST), the select transistor 25 (SEL), and the amplification transistor 26 (AMP) are formed on the first surface (surface S3) of the semiconductor substrate 40. The imaging device 100E of the present modification differs from the second embodiment above in that the semiconductor substrate 10 and the semiconductor substrate 40 are stuck together in what is referred to as a face-to-back configuration, in which the second surface (front surface: surface S2) of the semiconductor substrate 10 and the second surface (back surface: surface S4) of the semiconductor substrate 40 are made to oppose each other.

The imaging device 100E can be formed as follows, for example. First, the gate electrodes of the first transfer transistors 22A (TRY1) and 23A (TRY2) and the second transfer transistors 22B (TRG1) and 23B (TRG2) are formed on the second surface (surface S2) of the semiconductor substrate 10. Thereafter, the interconnect layer 20 is formed by covering the gate electrodes with the interlayer insulating film 27. Next, after flattening the surface of the interconnect layer 20, the semiconductor substrate 40 is stuck to the semiconductor substrate 10 using the second surface (surface S4) as the bonding surface, causing the semiconductor substrate 40 to become thinner. Thereafter, components such as the reset transistor 24 (RST), the select transistor 25 (SEL), and the amplification transistor 26 (AMP) are formed on the first surface (surface S3) of the semiconductor substrate. Note that the electrical connections between the semiconductor substrate 10 and the semiconductor substrate 40 are formed, for example, using vias 54. With this arrangement, the imaging device 100E illustrated in FIG. 8 is completed.

In this way, in the present modification, because the semiconductor substrate 10 and the semiconductor substrate 40 are stuck together in what is referred to as a face-to-back configuration, compared to the imaging device 100D of the second embodiment above, the lengths of the interconnects to the floating diffusions FD can be shortened, for example. Consequently, it is possible to improve the FD conversion efficiency in addition to the effects of the first and second embodiments above.

(3-2. Modification 2)

Figure 10:
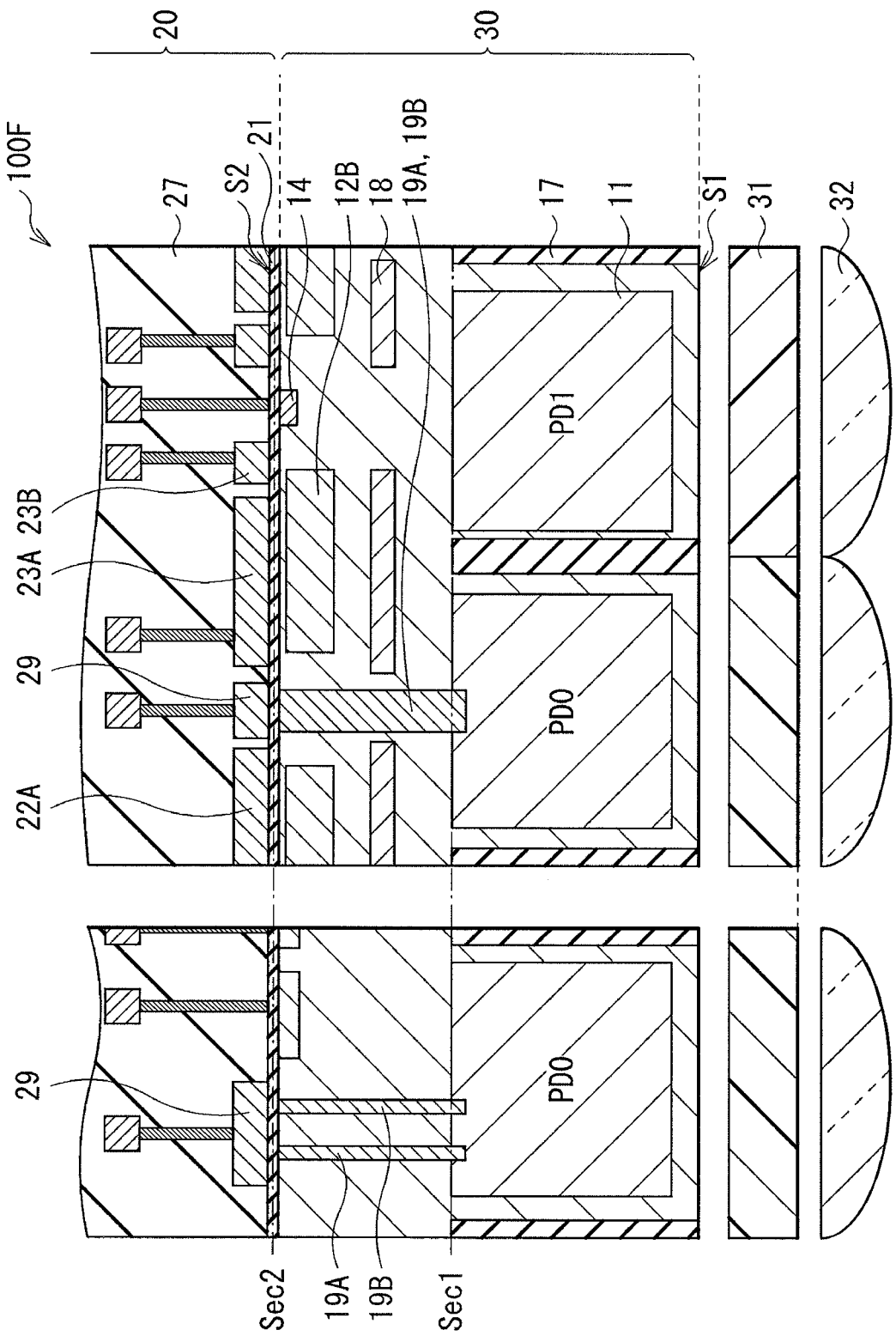
FIG. 10 is a schematic cross-section view illustrating an example of a configuration of an imaging device according to Modification 2 of the present disclosure.
Figure 11:
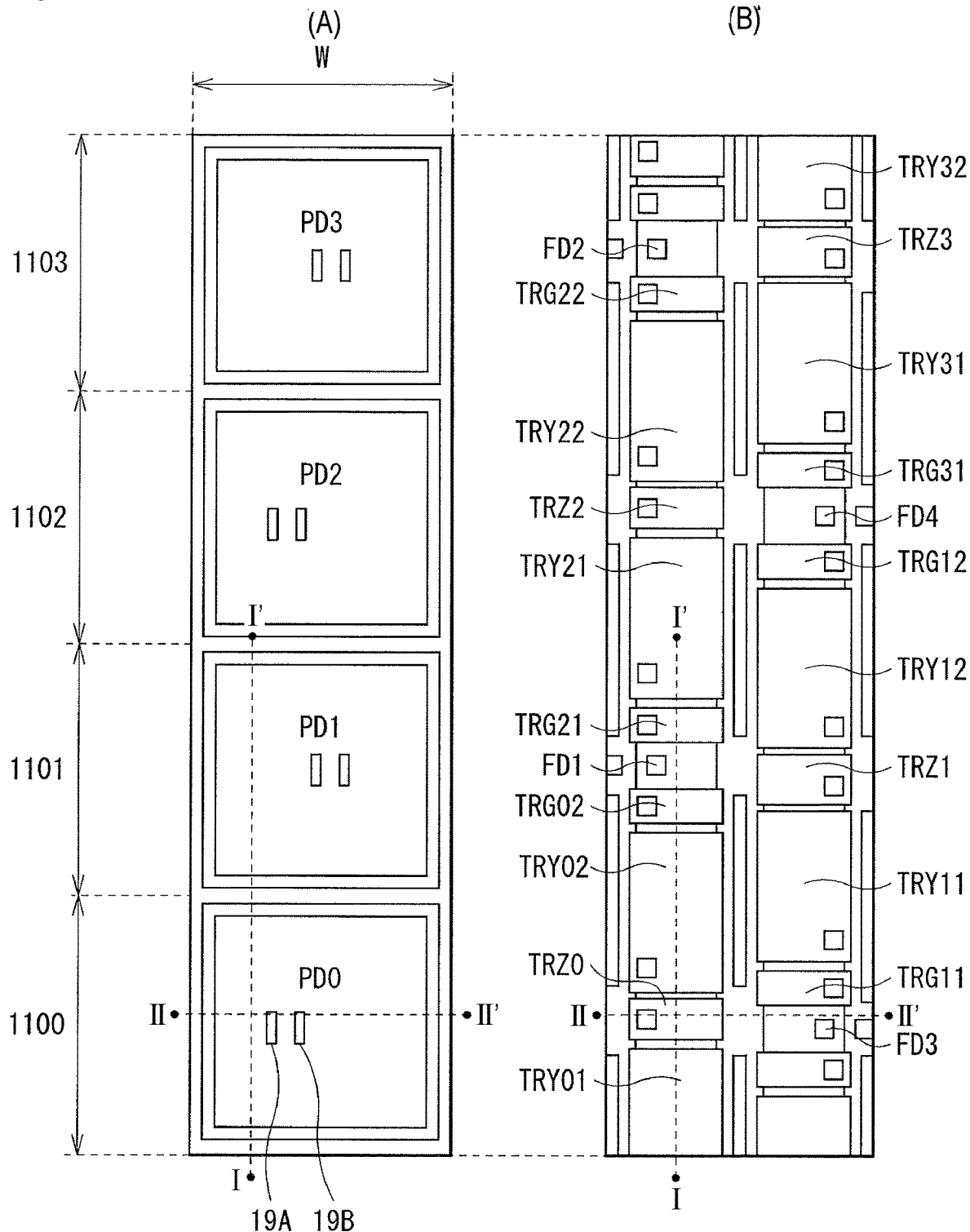
FIG. 11 is a schematic plan view illustrating one example of the configuration of sensor pixels in the imaging device illustrated in FIG. 10.
Figure 12:
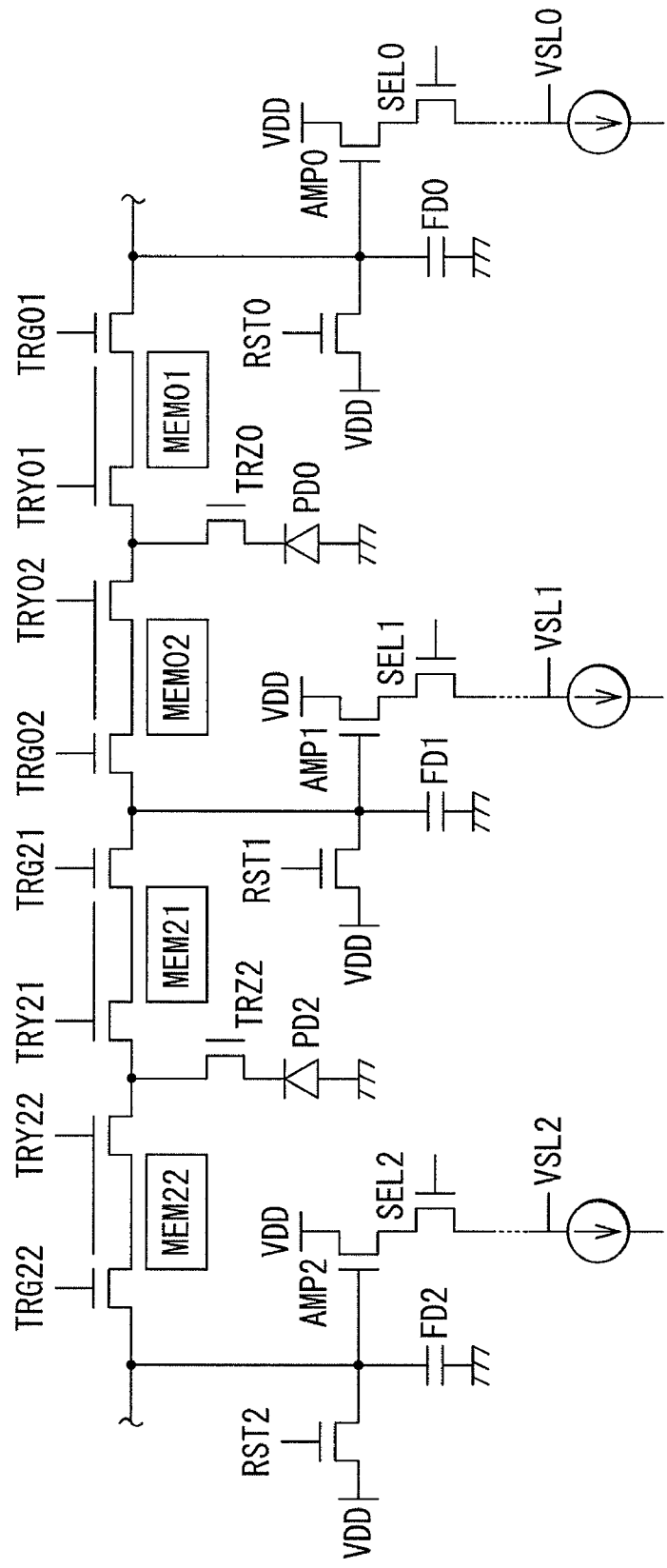
FIG. 12 is a circuit diagram illustrating a circuit configuration of the imaging device illustrated in FIG. 10.

FIG. 10 is a schematic illustration of an example of a cross-sectional configuration of the pixel array unit 111 in the imaging device 100F according to Modification 2 of the present disclosure. FIG. 11 is a schematic illustration of an example of a plan-view configuration of four sensor pixels 110 (sensor pixels 1100, 1101, 1102, and 1103) in Sec1 ((A) of FIG. 11) and Sec2 ((B) of FIG. 11) illustrated in FIG. 10, for example, in the pixel array unit 111 of the imaging device 100F illustrated in FIG. 10. Note that the cross-section views in FIG. 10 correspond to the line I-I' and the line II-IT illustrated in FIG. 1. FIG. 12 is an illustration of an example of a circuit configuration of the sensor pixels 110 in the imaging device 100F illustrated in FIG. 10.

The imaging device 100F of the present modification differs from the second embodiment above in that what is referred to as a vertical third transfer transistor (TRZ) is provided between the first transfer transistor 22A (TRY1) and the first transfer transistor 23A (TRY2).

In the imaging device 100F, the gate electrodes (transfer gate electrodes 19A and 19B) of the third transfer transistor 29 (TRZ) extend to the photoelectric conversion unit 11 formed embedded into the first surface (surface S1) of the semiconductor substrate 10. The charge generated by the photoelectric conversion unit 11 is distributed to the charge storage unit 12A (MEM1) through the transfer gate electrode 19A and to the charge storage unit 12B (MEM2) through the transfer gate electrode 19B, for example. In other words, inside the photoelectric conversion unit 11, charge can be transferred without forming a potential gradient that changes proceeding from the first surface (surface S1) to the second surface (surface S2) of the semiconductor substrate 10. Consequently, the potential of the photoelectric conversion unit 11 can be deepened, thereby making it possible to increase the saturation charge (Qs).

Note that the transfer gate electrodes 19A and 19B are formed such that a line joining the two to each other is orthogonal to the layout direction of the two charge storage units 12A (MEM1) and 12B (MEM2), for example.

Figure 13:
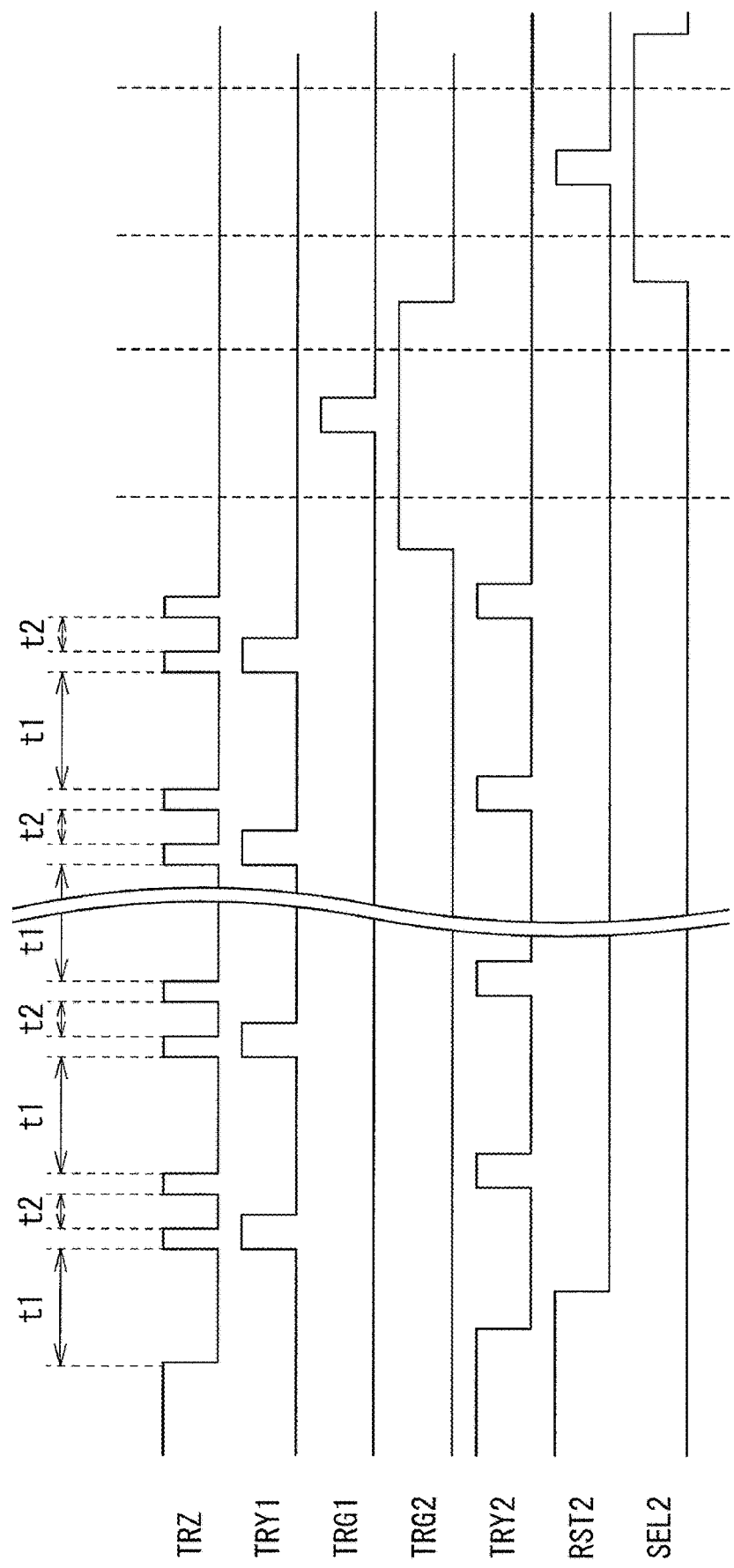
FIG. 13 is a timing chart illustrating an example of operations by the imaging device illustrated in FIG. 10.

FIG. 13 illustrates an example of a timing chart for driving the sensor pixels 110 of the imaging device 100F for example. Because the readout of charge from the photoelectric conversion unit PD is performed by the third transfer transistor TRZ, the exposure period of the photoelectric conversion unit PD is synonymous with the off period of the third transfer transistor TRZ. Consequently, it is difficult to make the exposure period t2 shorter than the period during which the driving pulse of the third transfer transistor TRZ falls completely and then fully rises again.

In this way, in the imaging device 100F of the present modification, the charge generated by the photoelectric conversion unit 11 is distributed to the charge storage units 12A and 12B using a vertical transistor (the third transfer transistor 29 (TRZ)), and therefore the potential of the photoelectric conversion unit 11 can be deepened. Consequently, it is possible to further increase the saturation charge (Qs) in addition to the effects of the first and second embodiments above.

(3-3. Modification 3)

Figure 14:
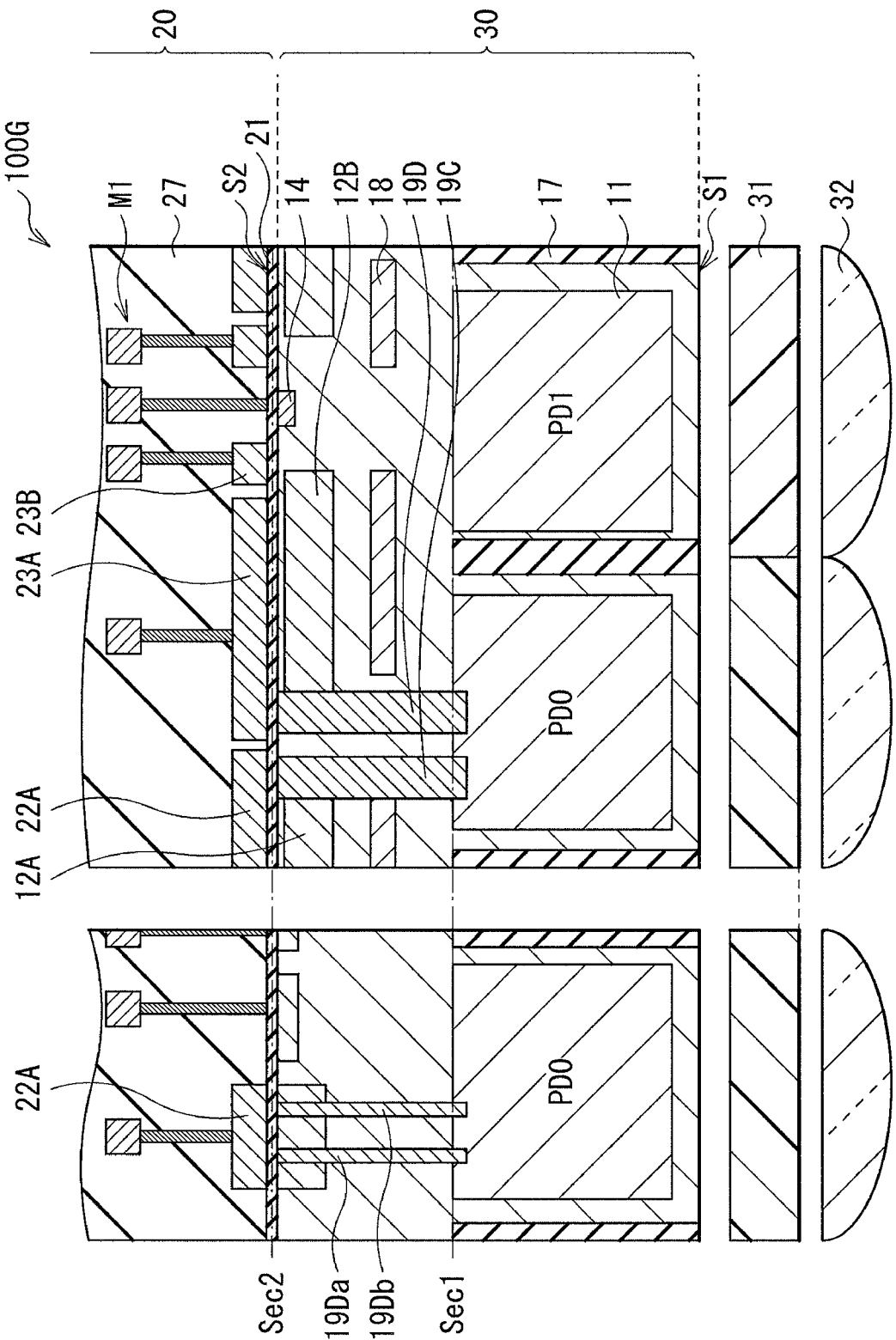
FIG. 14 is a schematic cross-section view illustrating an example of a configuration of an imaging device according to Modification 3 of the present disclosure.
Figure 15:
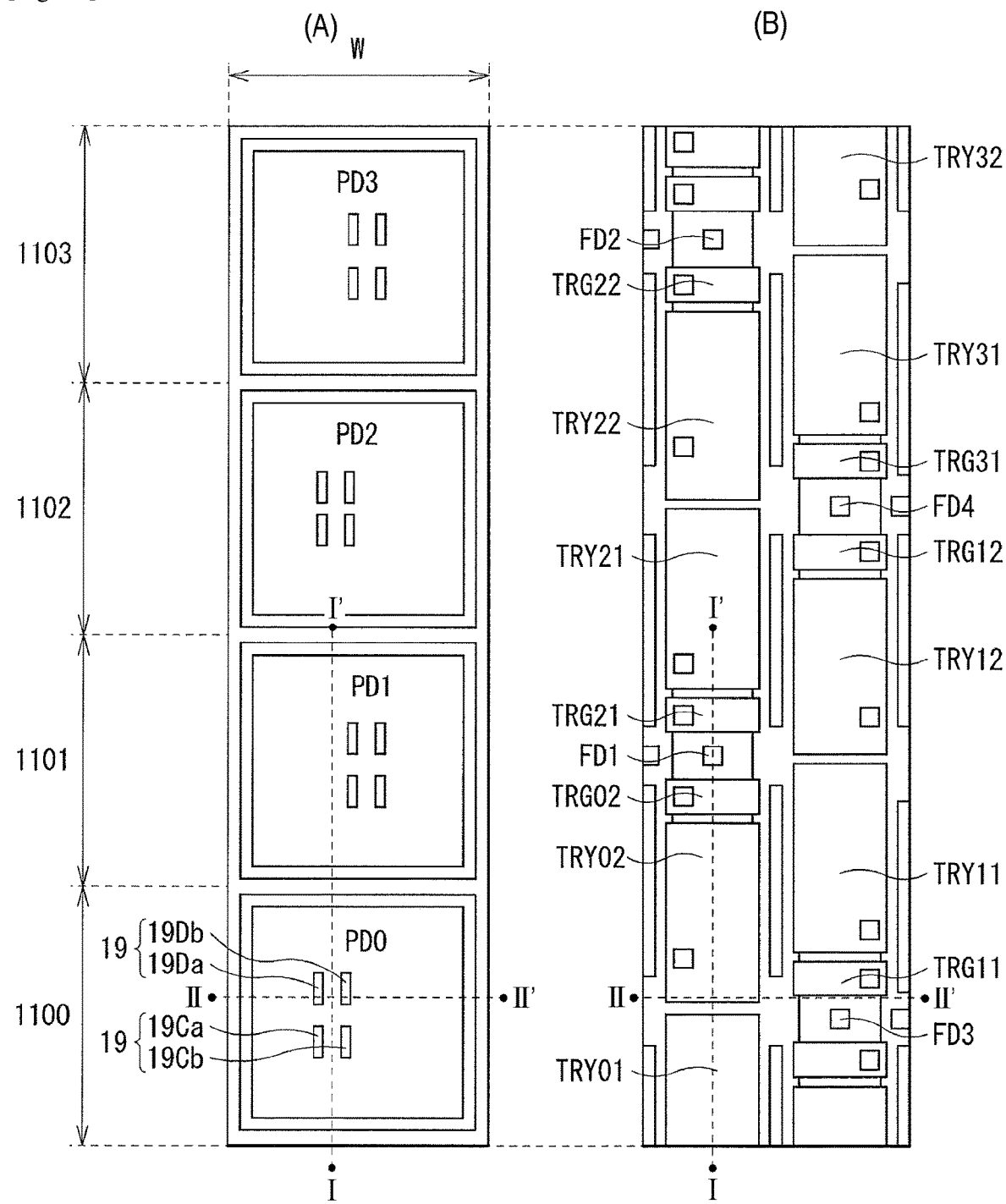
FIG. 15 is a schematic plan view illustrating one example of the configuration of sensor pixels in the imaging device illustrated in FIG. 14.

FIG. 14 is a schematic illustration of an example of a cross-sectional configuration of the pixel array unit 111 in the imaging device 100G according to Modification 3 of the present disclosure. FIG. 15 is a schematic illustration of an example of a plan-view configuration of four sensor pixels 110 (sensor pixels 1100, 1101, 1102, and 1103) in Sec1 ((A) of FIG. 15) and Sec2 ((B) of FIG. 15) illustrated in FIG. 14 for example in the pixel array unit 111 of the imaging device 100G illustrated in FIG. 14. Note that the cross-section views in FIG. 14 correspond to the line I-I' and the line II-IT illustrated in FIG. 15.

Modification 2 above illustrates an example of distributing the charge generated by the photoelectric conversion unit 11 to the charge storage units 12A and 12B by providing what is referred to as a vertical third transfer transistor (TRZ) between the first transfer transistor 22A (TRY1) and the first transfer transistor 23A (TRY2), but the first transfer transistors 22A (TRY1) and 23A (TRY2) may also double as the third transfer transistor (TRZ). The present modification differs from Modification 2 above in that the first transfer transistors 22A (TRY1) and 23A (TRY2) are formed as vertical transistors.

In the imaging device 100G, the gate electrodes (transfer gate electrodes 19C (19Ca and 19Cb) and 19D (19Da and 19Db)) of the first transfer transistor 22A (TRY1) and the first transfer transistor 23A (TRY2) extend to the photoelectric conversion unit 11 formed embedded into the first surface (surface S1) of the semiconductor substrate 10.

Note that the timing chart for driving the sensor pixels 110 in the imaging device 100G of the present modification is similar to that of the first embodiment above (FIG. 5). In other words, the exposure periods t1 and t2 are determined according to the on-interval of the first transfer transistors 22A (TRY1) and 23A (TRY2).

As above, in the imaging device 100G of the present modification, the first transfer transistors 22A (TRY1) and 23A (TRY2) are formed as vertical transistors, and therefore the exposure periods t1 and t2 can be determined according to the on-intervals of the first transfer transistors 22A (TRY1) and 23A (TRY2). Consequently, in addition to the effects of the first and second embodiments above, it is possible to further increase the saturation charge (Qs) while also shortening the on-interval of each of the first transfer transistors 22A (TRY1) and 23A (TRY2), thereby making it possible to store and distribute charge in a shorter amount of time.

(3-4. Modification 4)

Figure 16:
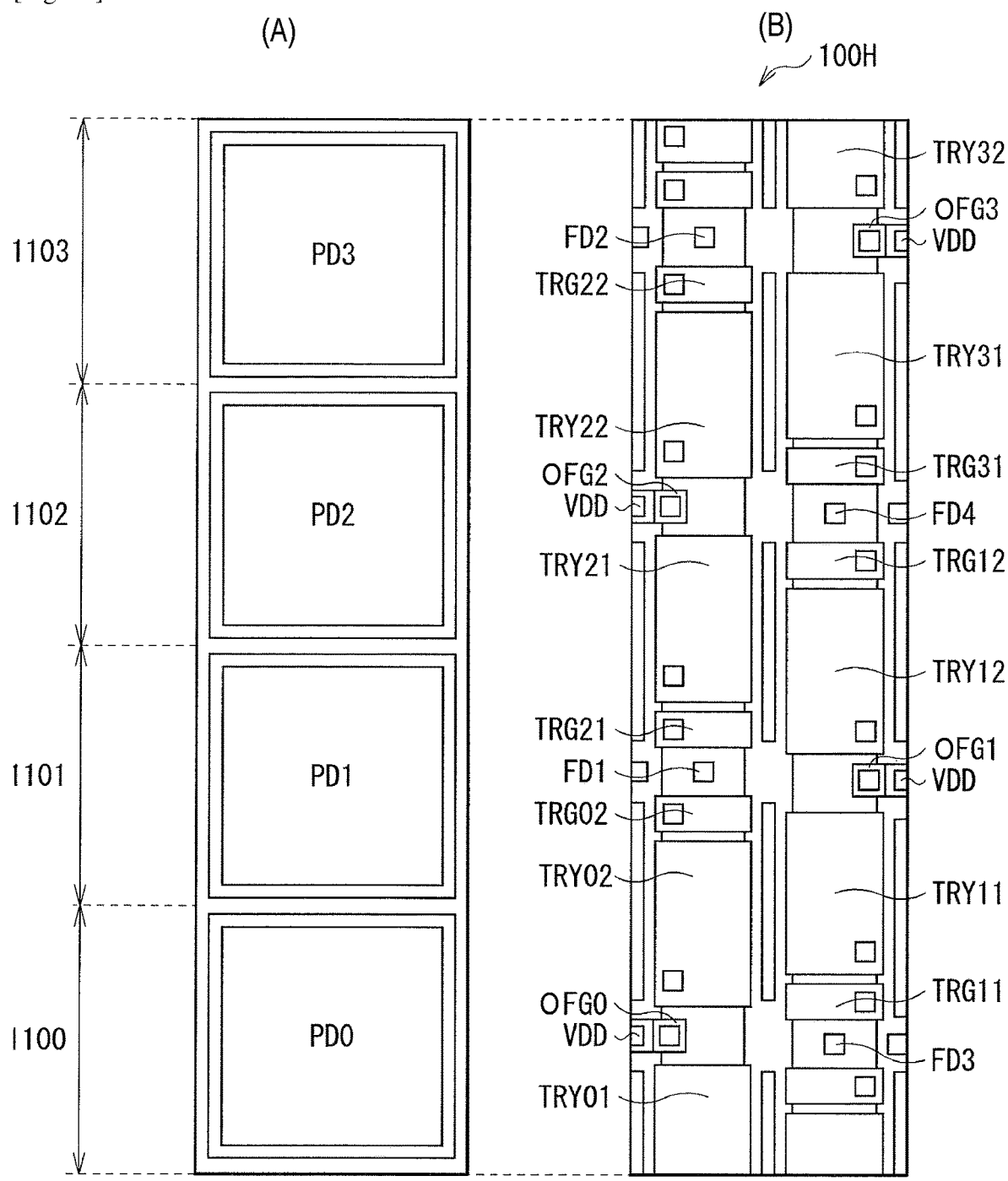
FIG. 16 is a schematic plan view illustrating one example of the configuration of sensor pixels in the imaging device according to Modification 4 of the present disclosure.
Figure 17:
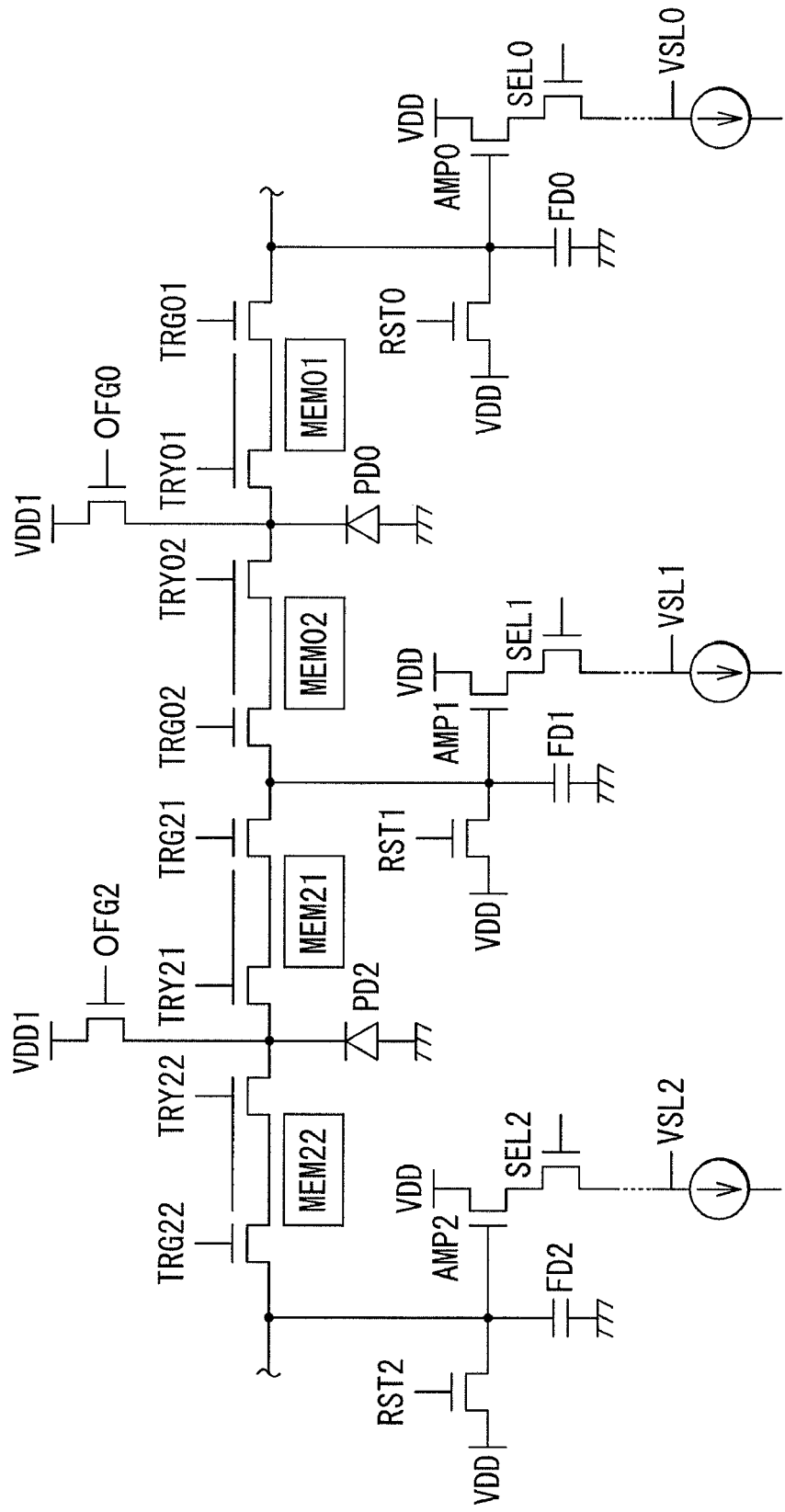
FIG. 17 is a circuit diagram illustrating a circuit configuration of the imaging device illustrated in FIG. 16.
Figure 18:
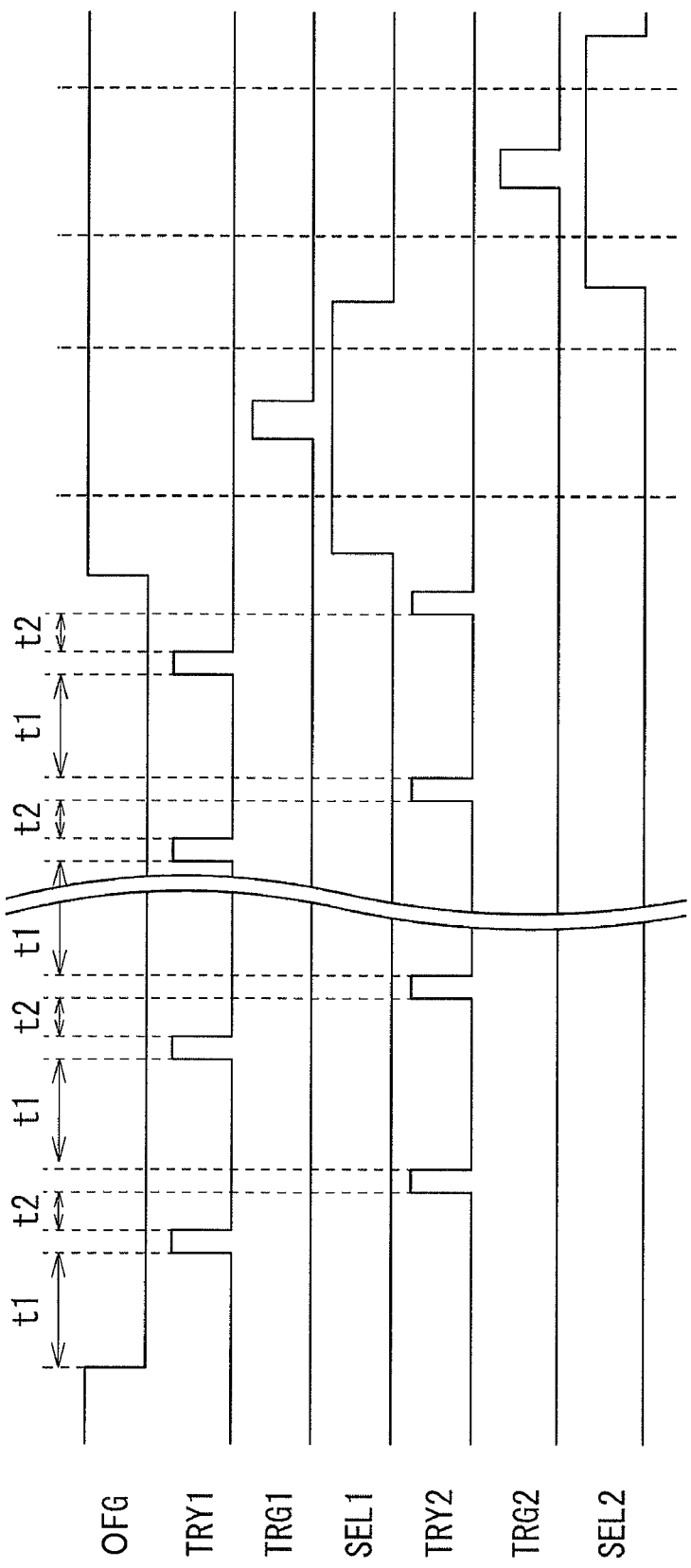
FIG. 18 is a timing chart illustrating an example of operations by the imaging device illustrated in FIG. 16.

FIG. 16 is a schematic illustration of an example of a plan-view configuration of four sensor pixels 110 (sensor pixels 1100, 1101, 1102, and 1103) of the pixel array unit 111 in the imaging device 100H according to Modification 4 of the present disclosure. FIG. 17 is an illustration of an example of a circuit configuration of the sensor pixels 110 in the imaging device 100H illustrated in FIG. 16. FIG. 18 illustrates an example of a timing chart for driving the sensor pixels 110 of the imaging device 100H.

The imaging device 100H of the present modification differs from the second embodiment above in that a discharge transistor OFG (discharge transistor 33) that initializes, or in other words resets, the PD is additionally provided as a pixel transistor. Note that resetting the PD means depleting the PD.

The discharge transistor OFG is provided between the first transfer transistor TRY1 and the first transfer transistor TRY2, and has for example a drain connected to the power line VDD and a source connected to the first transfer transistors TRY1 and TRY2. The discharge transistor OFG resets the PD according to a driving signal applied to the gate electrode.

In this way, in the imaging device 100H of the present modification, by providing the discharge transistor OFG that resets the PD, it is possible to reset the PD without going through MEM1 and MEM2. Consequently, in addition to the effects of the first and second embodiments above, pipeline exposure while the two units MEM1 and MEM2 are in a charge-storing state is possible.

Also, in the imaging device 100H of the present modification, by turning on the discharge transistor OFG outside of the global transfer period, charge overflowing from the PD is selectively discarded to the drain of the discharge transistor OFG without causing blooming in MEM1 and MEM2. Consequently, it is possible to reduce the occurrence of false signals.

Figure 19:
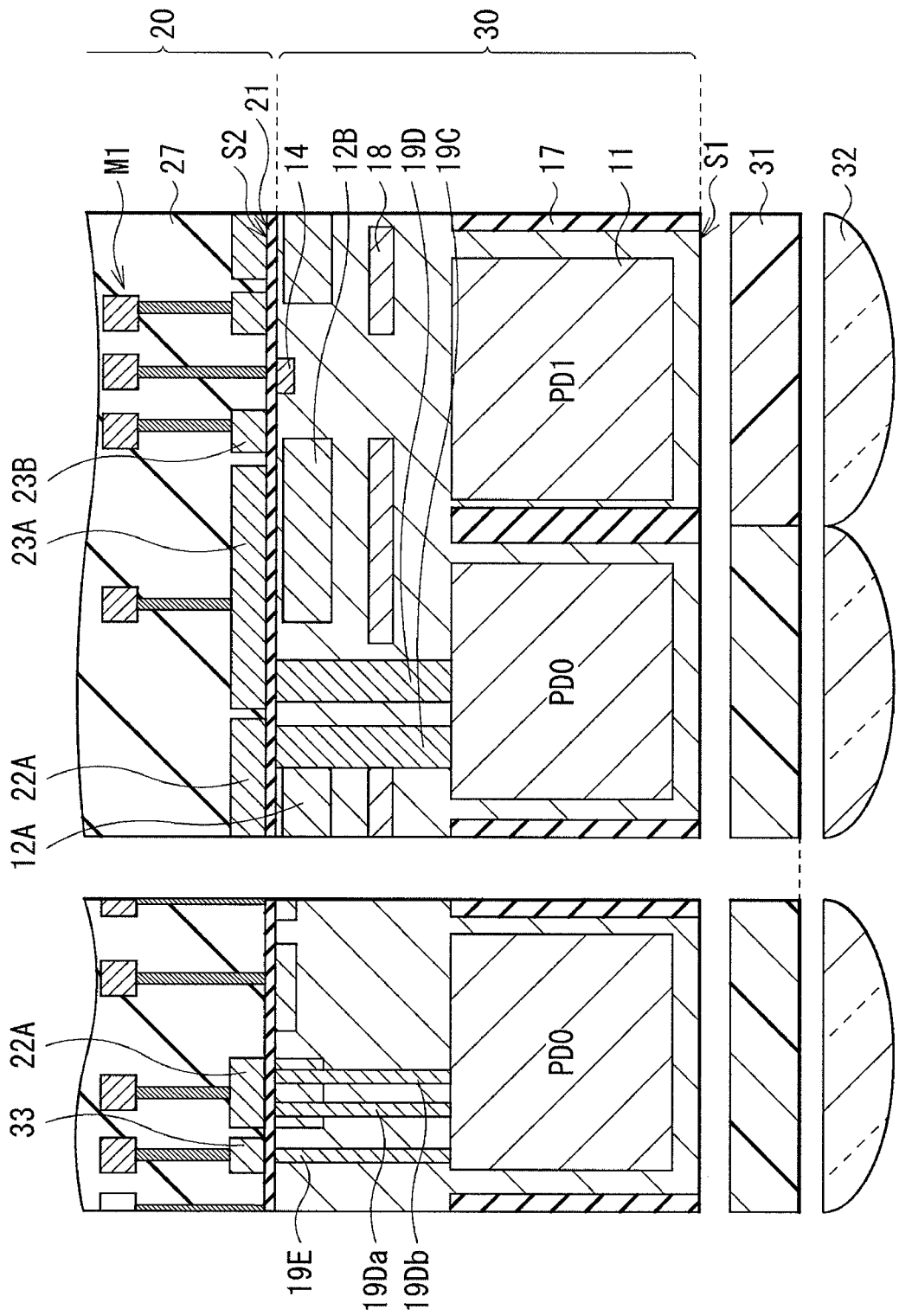
FIG. 19 is a schematic cross-section view illustrating another example of a configuration of an imaging device according to Modification 4 of the present disclosure.
Figure 20:
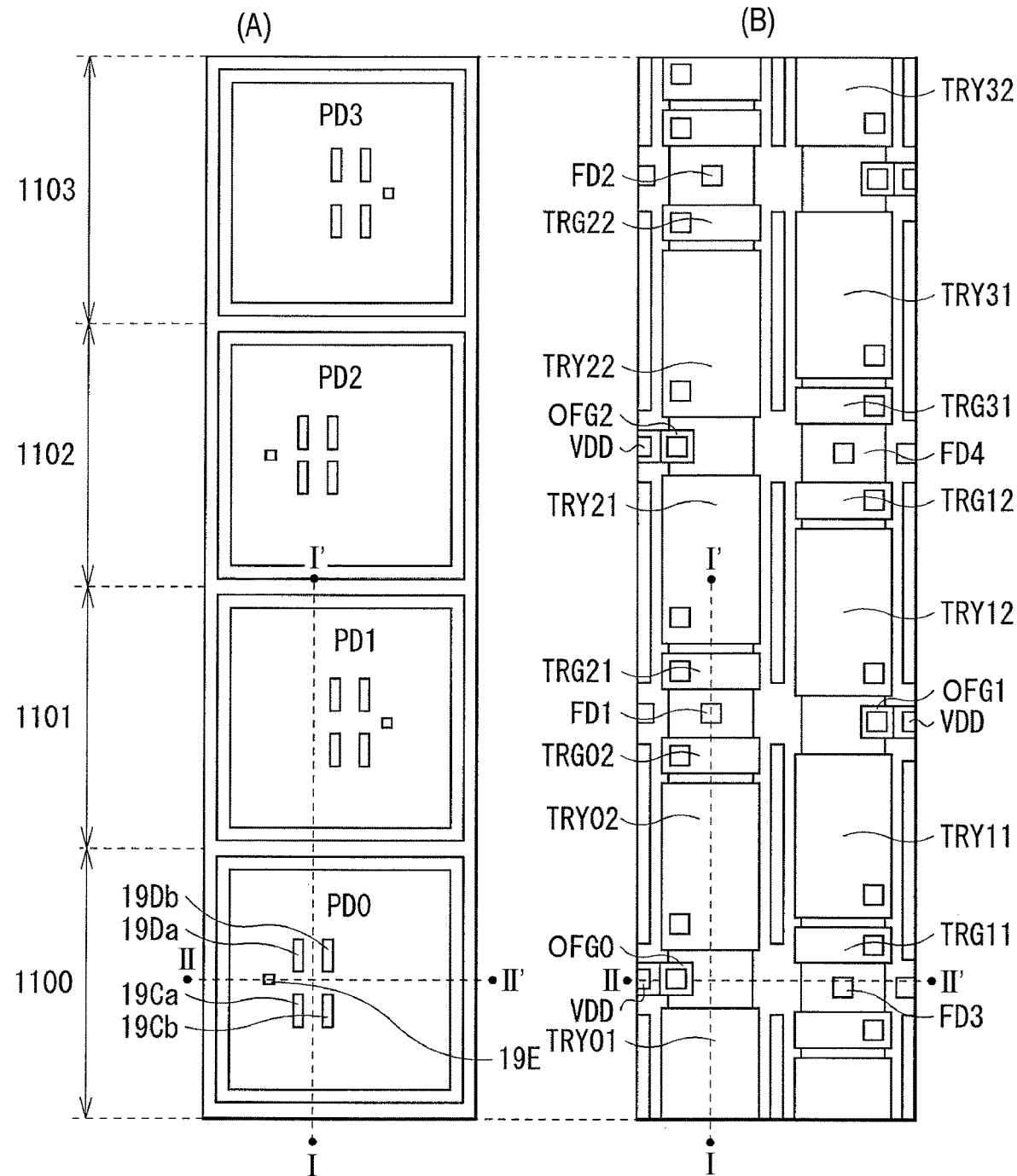
FIG. 20 is a schematic plan view illustrating one example of the configuration of sensor pixels in the imaging device illustrated in FIG. 19.

Note that in the imaging device 100H of the present modification, the third transfer transistor TRZ may be formed using a vertical transistor like in Modification 2 above, or alternatively, the first transfer transistors TRY1 and TRY2 may be formed vertically like Modification 3. For example, in the case of forming the first transfer transistors TRY1 and TRY2 vertically, the discharge transistor OFG also forms a discharge gate electrode 19E that reaches the PD as a vertical transistor similarly to the first transfer transistors TRY1 and TRY2, as illustrated in FIGS. 19, 20A, and 20B for example.

(3-5. Modification 5)

Figure 21:
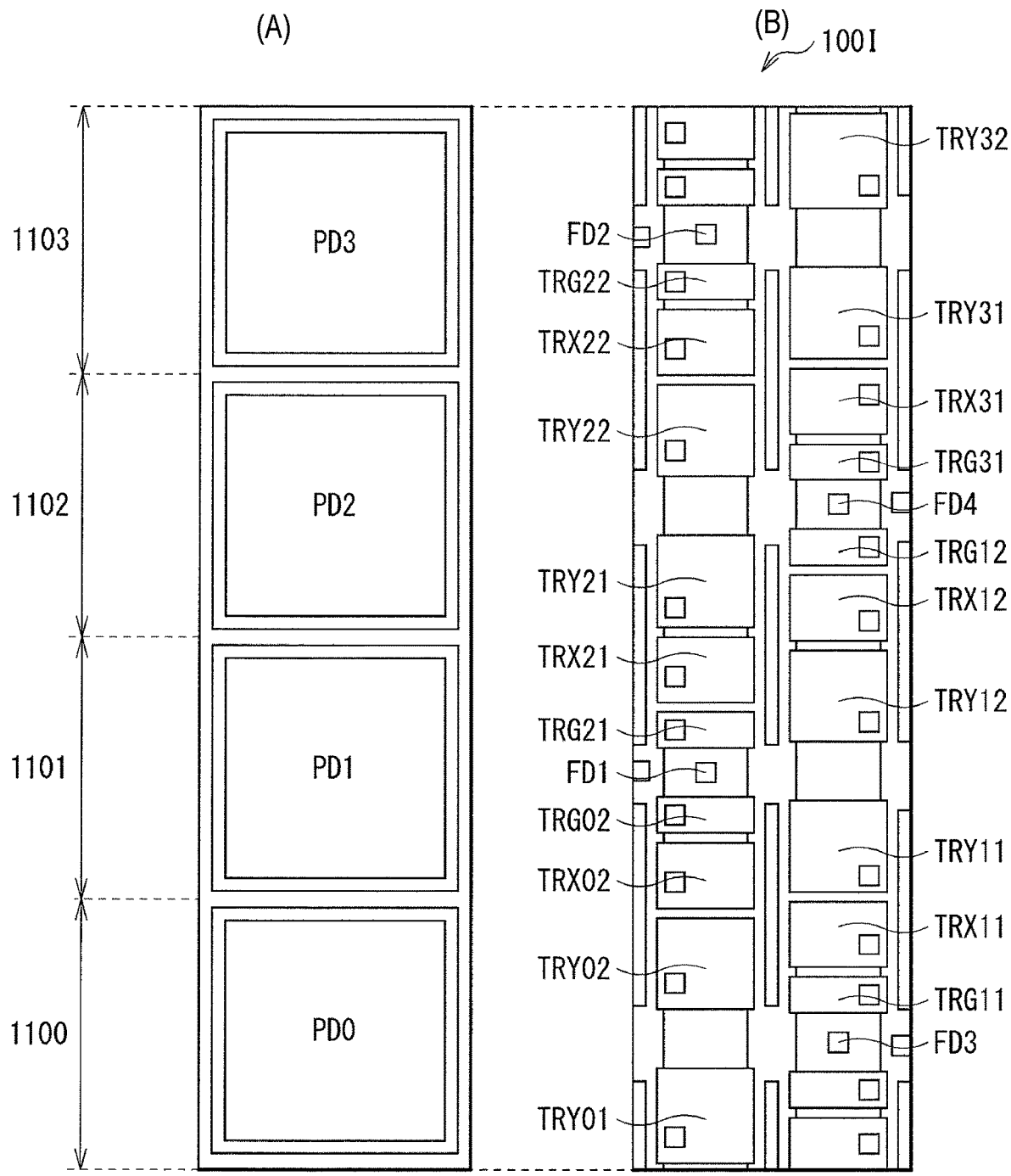
FIG. 21 is a schematic plan view illustrating one example of the configuration of sensor pixels in the imaging device according to Modification 5 of the present disclosure.
Figure 22:
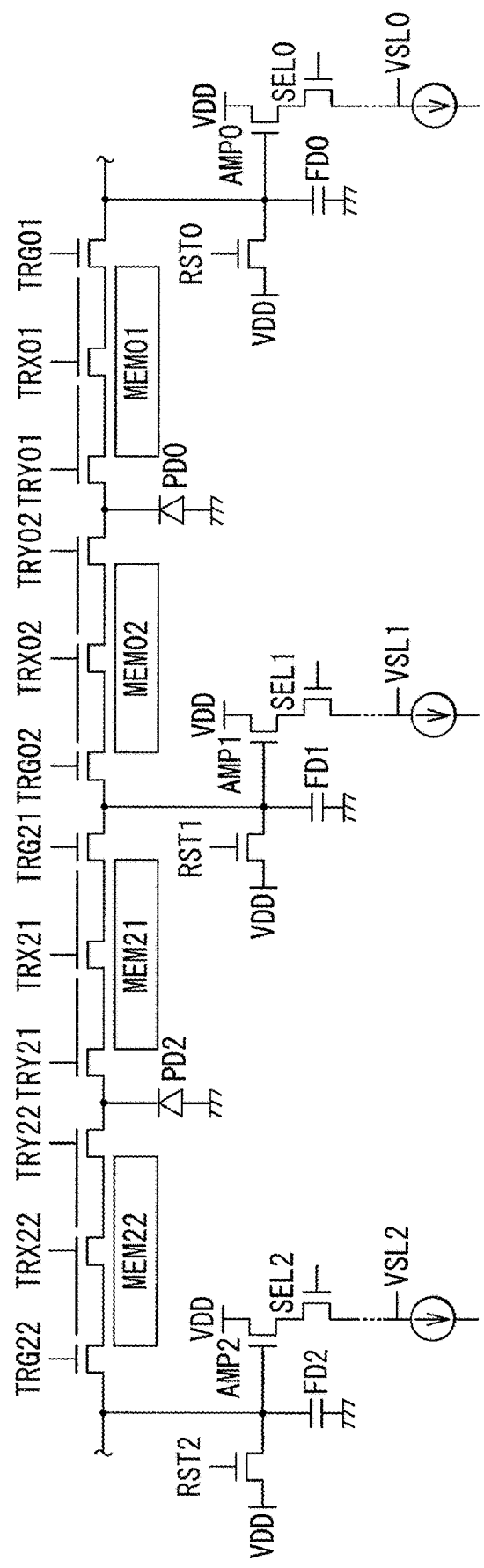
FIG. 22 is a circuit diagram illustrating a circuit configuration of the imaging device illustrated in FIG. 21.
Figure 23:
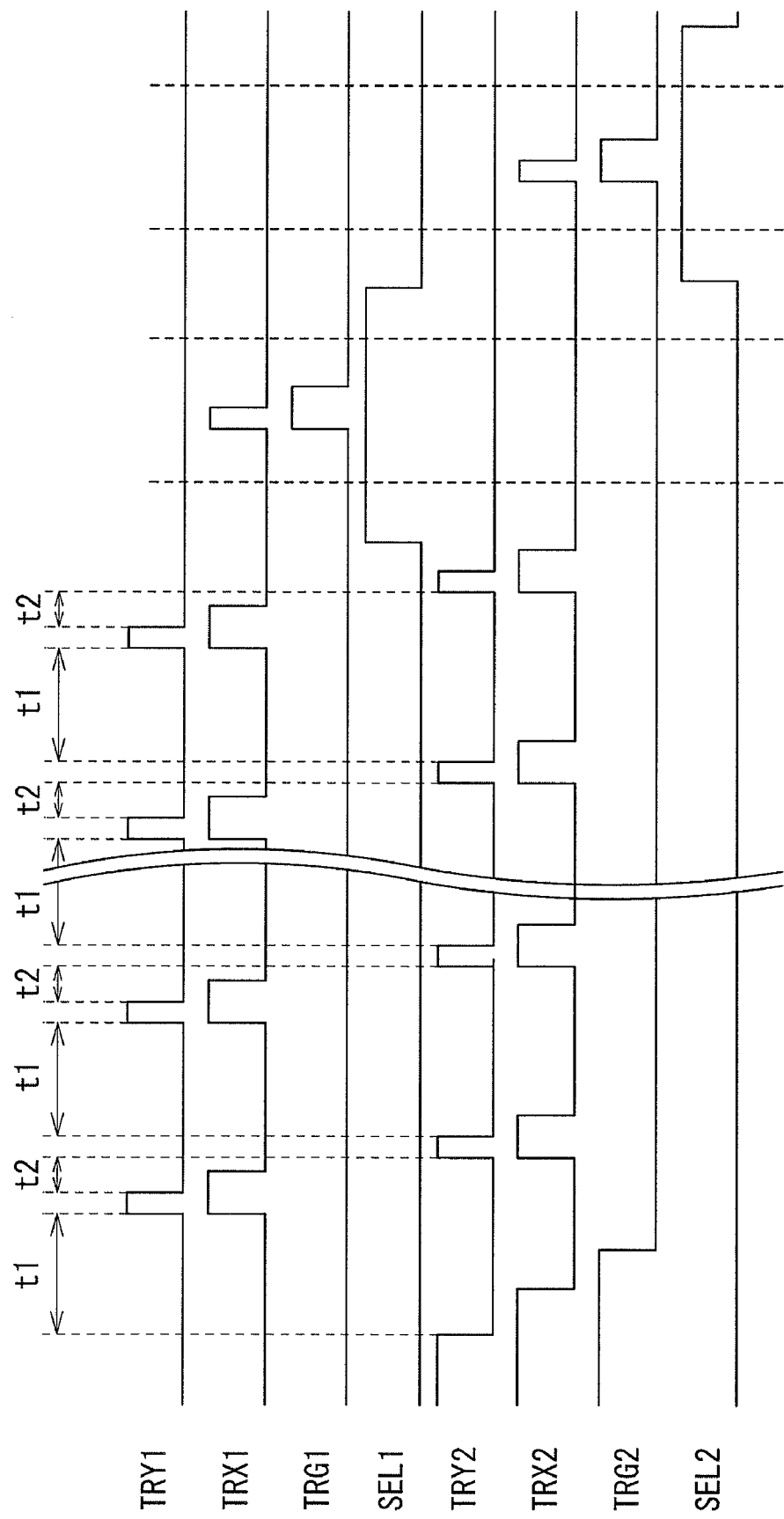
FIG. 23 is a timing chart illustrating an example of operations by the imaging device illustrated in FIG. 21.

FIG. 21 is a schematic illustration of an example of a plan-view configuration of four sensor pixels 110 (sensor pixels 1100, 1101, 1102, and 1103) of the pixel array unit 111 in the imaging device 100I according to Modification 5 of the present disclosure. FIG. 22 is an illustration of an example of a circuit configuration of the sensor pixels 110 in the imaging device 100I illustrated in FIG. 21. FIG. 23 illustrates an example of a timing chart for driving the sensor pixels 110 of the imaging device 100I.

The imaging device 100I of the present modification differs from the second embodiment above in that fourth transfer transistors TRX1 and TRX2 are provided between the first transfer transistor TRY1 and the second transfer transistor TRG1 and between the first transfer transistor TRY2 and the second transfer transistor TRG2, respectively.

The fourth transfer transistors TRX1 and TRX2 are for holding charge inside MEM1 and MEM2 and also transferring charge to the second transfer transistors TRG1 and TRG2, respectively.

In this way, in the imaging device 100I of the present modification, by providing the fourth transfer transistors TRX1 and TRX2 between the first transfer transistor TRY1 and the second transfer transistor TRG1 and between the first transfer transistor TRY2 and the second transfer transistor TRG2, respectively, the potential of MEM1 and MEM2 distanced from each FD (for example, FD0 and FD1) can be deepened. Consequently, it is possible to increase the MEM saturation charge (Qs) in addition to the effects of the first and second embodiments above.

Note that although the present modification illustrates an example of providing one of each of the fourth transfer transistors TRX1 and TRX2, two or more transistors may also be formed as the fourth transfer transistors TRX1 and TRX2.

(3-6. Modification 6)

Figure 24:
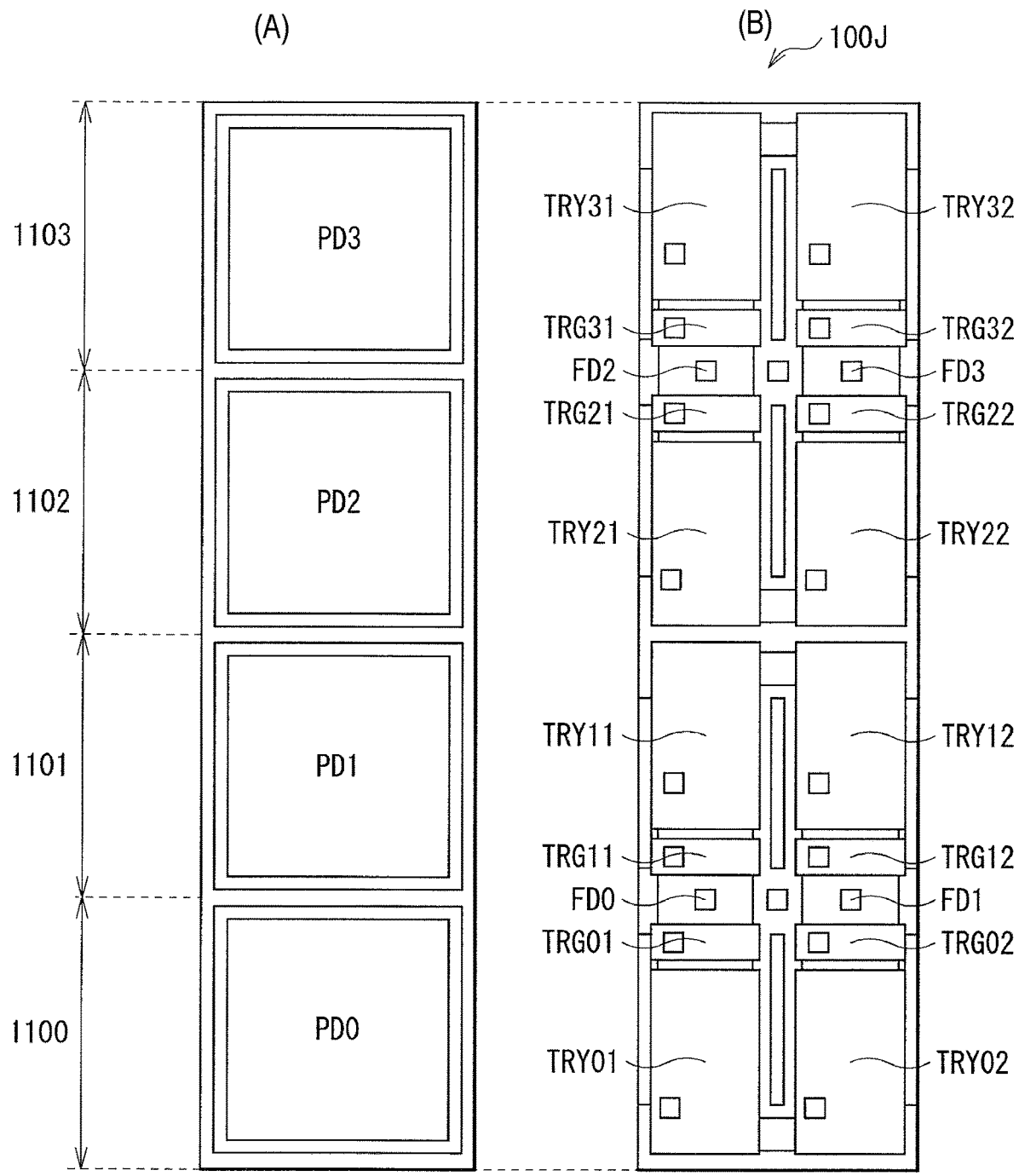
FIG. 24 is a schematic plan view illustrating one example of the configuration of sensor pixels in the imaging device according to Modification 6 of the present disclosure.
Figure 25:
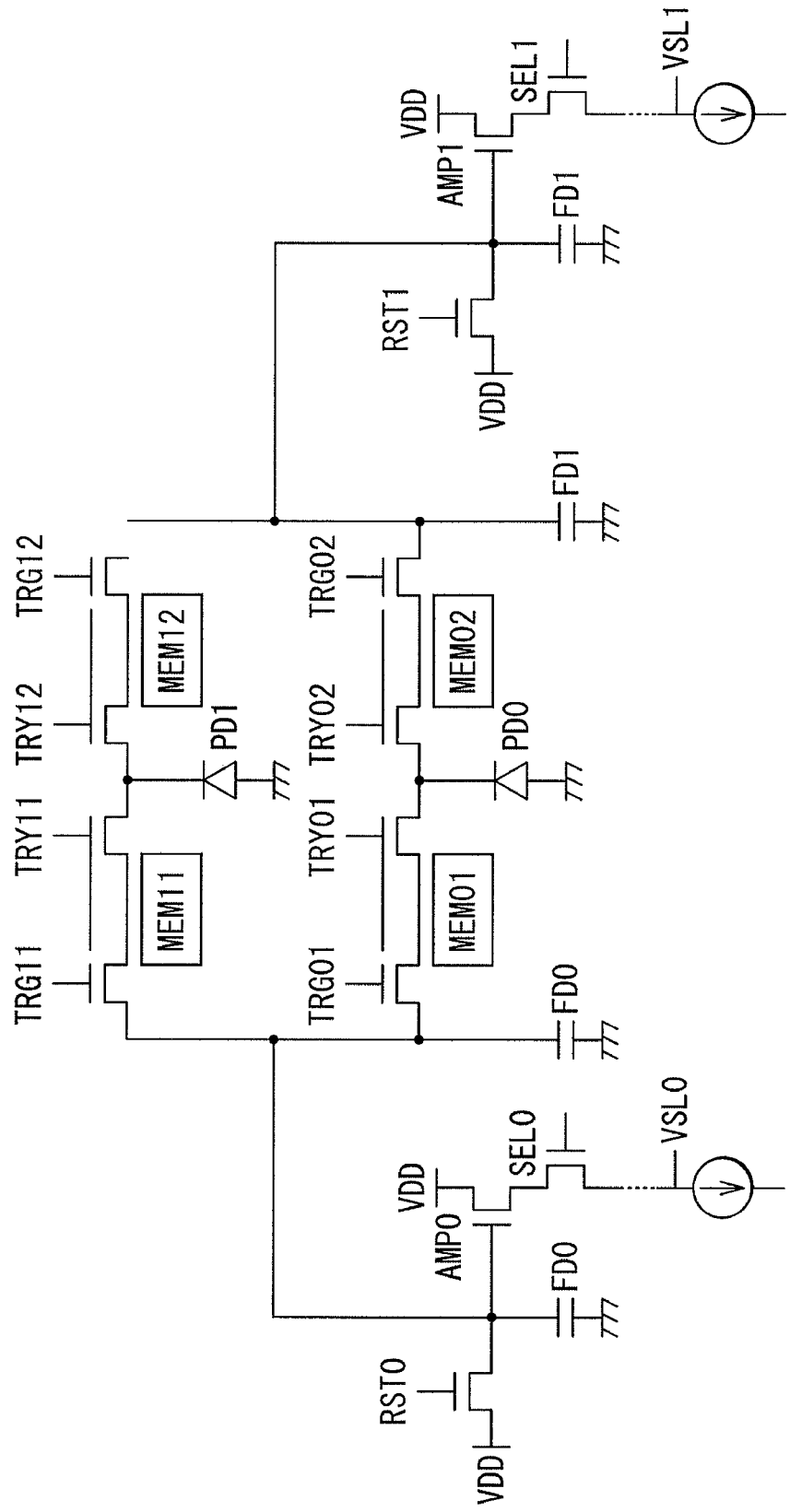
FIG. 25 is a circuit diagram illustrating a circuit configuration of the imaging device illustrated in FIG. 24.

FIG. 24 is a schematic illustration of an example of a plan-view configuration of four sensor pixels 110 (sensor pixels 1100, 1101, 1102, and 1103) of the pixel array unit 111 in the imaging device 100J according to Modification 6 of the present disclosure. FIG. 25 is an illustration of an example of a circuit configuration of the sensor pixels 110 in the imaging device 100J illustrated in FIG. 24.

In the first and second embodiments above, the charge generated by the photoelectric conversion unit 11 is transferred in opposite directions, and the two FDs to which the charge is respectively transferred are each shared by sensor pixels 110 two pixels away from each other. In contrast, in the imaging device 100J of the present modification, the two FDs (for example, FD0 and FD1) are shared by two adjacent sensor pixels 110 (for example, the sensor pixels 1100 and 1101). This point is different from the second embodiment above.

In the present modification, the two units MEM1 and MEM2 are disposed in parallel inside each sensor pixel 110, and the charge generated by the PD is transferred in the same direction. Also, in the present modification, as described above, the two FDs (for example, FD0 and FD1) are shared by two adjacent sensor pixels 110 (for example, the sensor pixels 1100 and 1101). With this arrangement, in adjacent sensor pixels 110 (for example, the sensor pixel 1100 and the sensor pixel 1101), the charge generated by each PD (for example, PD0 and PD1) is transferred in opposite directions. Also, in the present modification, because the two units MEM1 and MEM2 are disposed in parallel inside each sensor pixel 110, the pitch of the two units MEM1 and MEM2 is the same pitch as the pitch of the PD.

In this way, even in a case where the two units MEM1 and MEM2 are disposed in parallel within the pitch of the PD, effects similar to those of the second embodiment above can be obtained.

(3-7. Modification 7)

Figure 26:
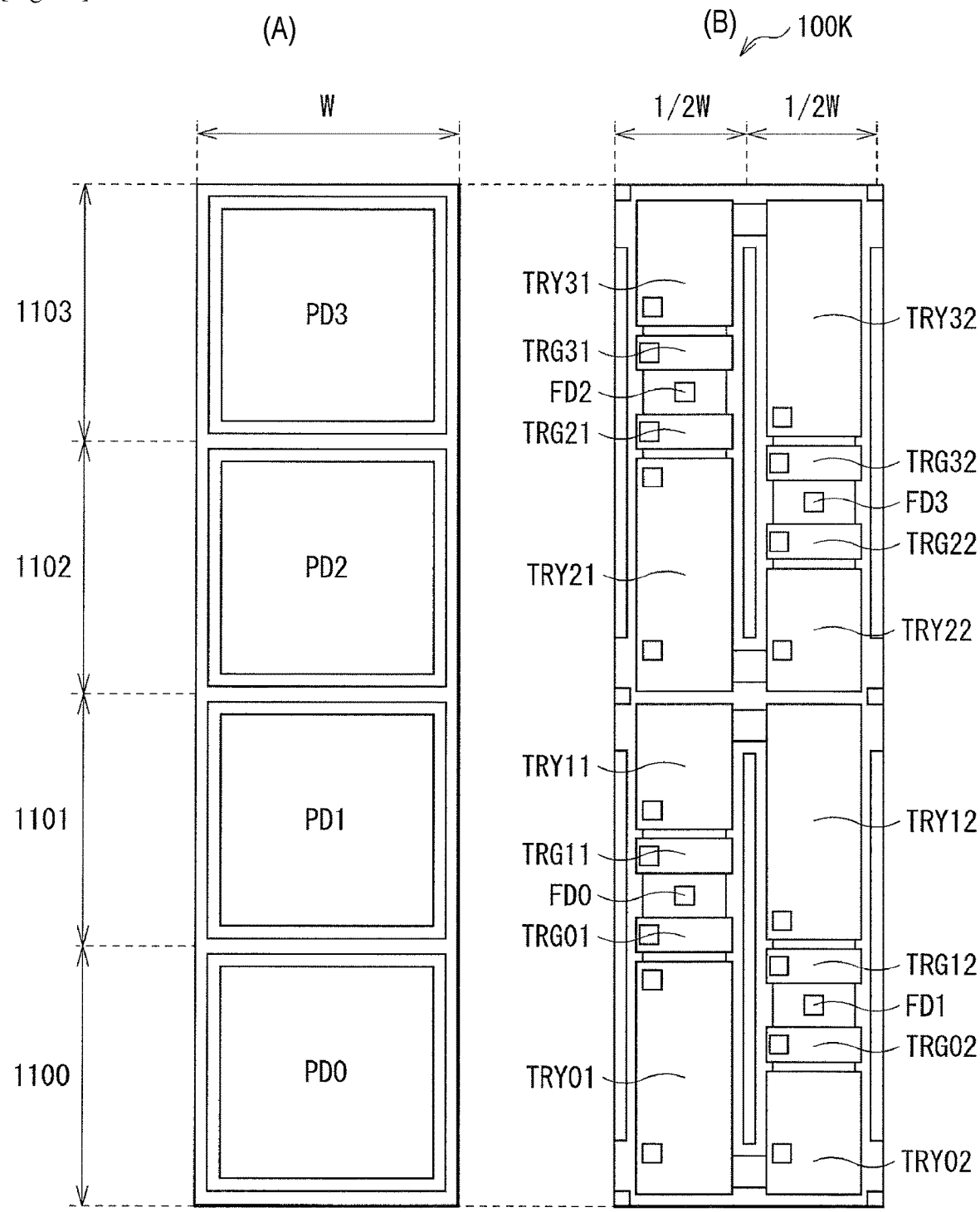
FIG. 26 is a schematic plan view illustrating one example of the configuration of sensor pixels in the imaging device according to Modification 7 of the present disclosure.

FIG. 26 is a schematic illustration of an example of a plan-view configuration of four sensor pixels 110 (sensor pixels 1100, 1101, 1102, and 1103) of the pixel array unit 111 in the imaging device 100K according to Modification 7 of the present disclosure.

The first and second embodiments above and the like illustrate an example in which the two units MEM1 and MEM2 have the same area, but the two units MEM1 and MEM2 may also be different sizes.

With this arrangement, in the imaging device 100K of the present modification, a capacity ratio can be given to the two units MEM1 and MEM2. In other words, for example, in a case where a sensitivity difference (for example, a difference in the exposure time) exists between MEM1 and MEM2, it is possible to vary the MEM saturation charge (Qs) according to the sensitivity difference. Consequently, it is possible to hold signals of higher sensitivity in addition to the effects of the first and second embodiments above.

(3-8. Modification 8)

Figure 27:
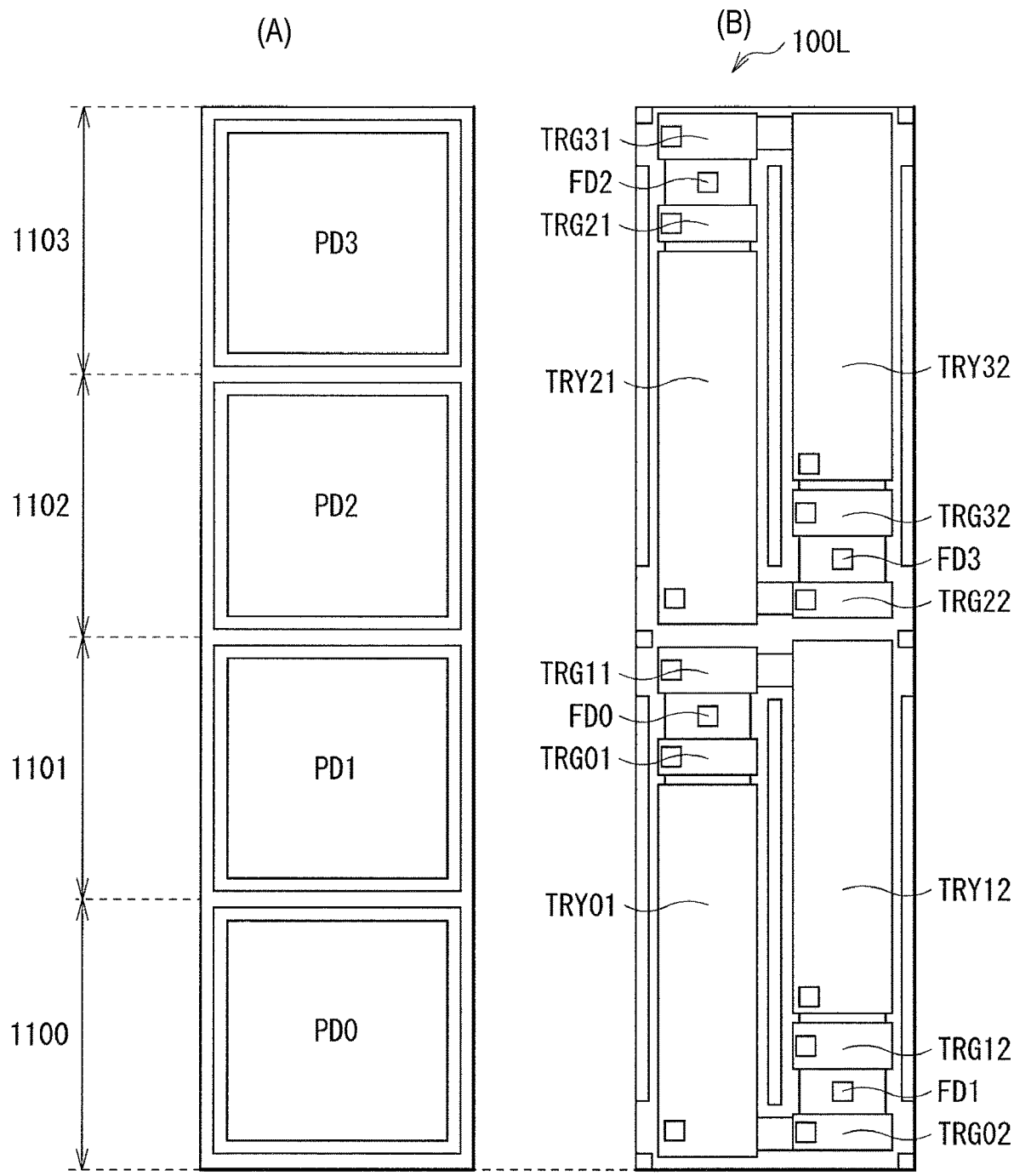
FIG. 27 is a schematic plan view illustrating one example of the configuration of sensor pixels in the imaging device according to Modification 8 of the present disclosure.
Figure 28:
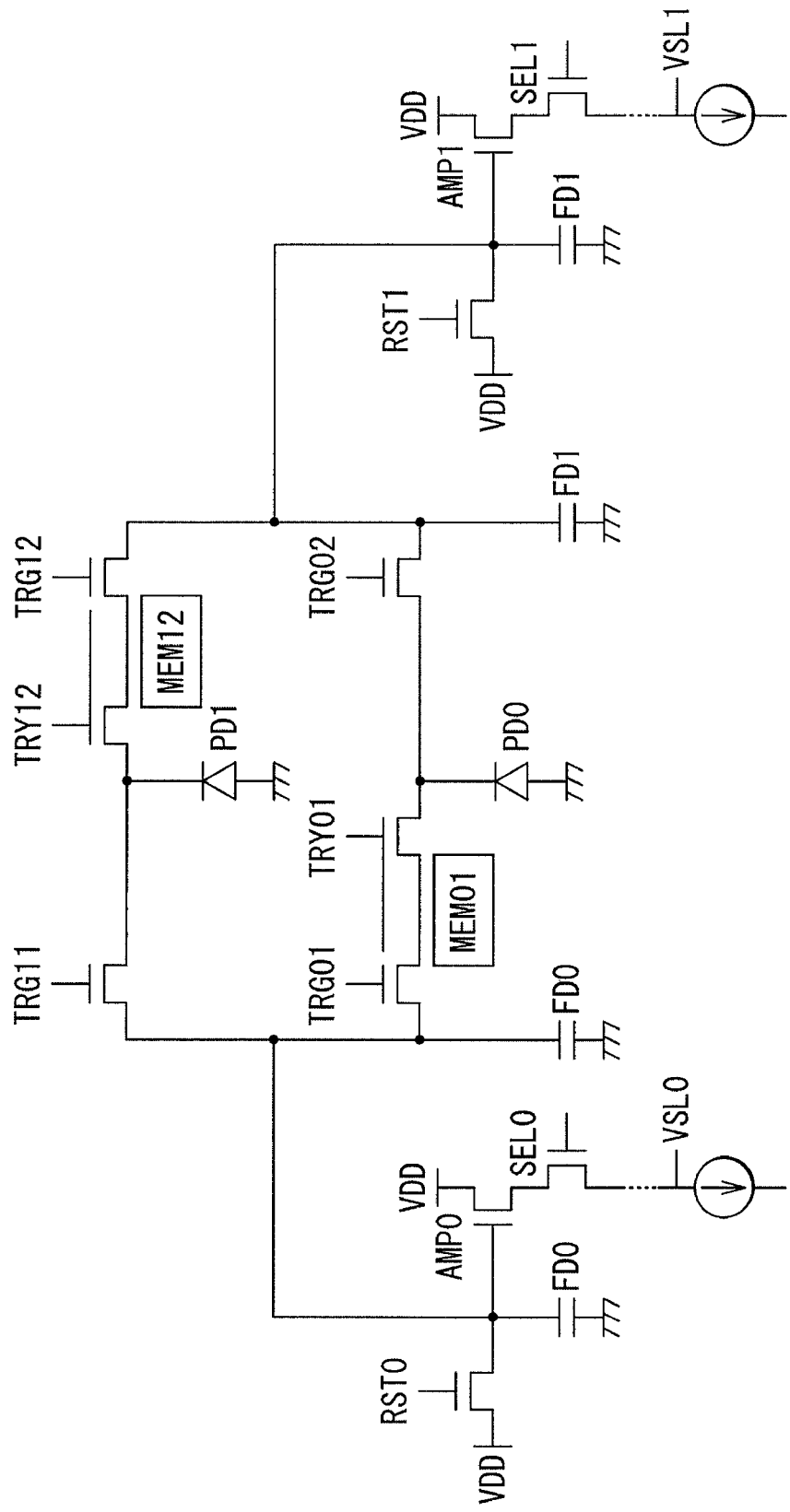
Figure 29:
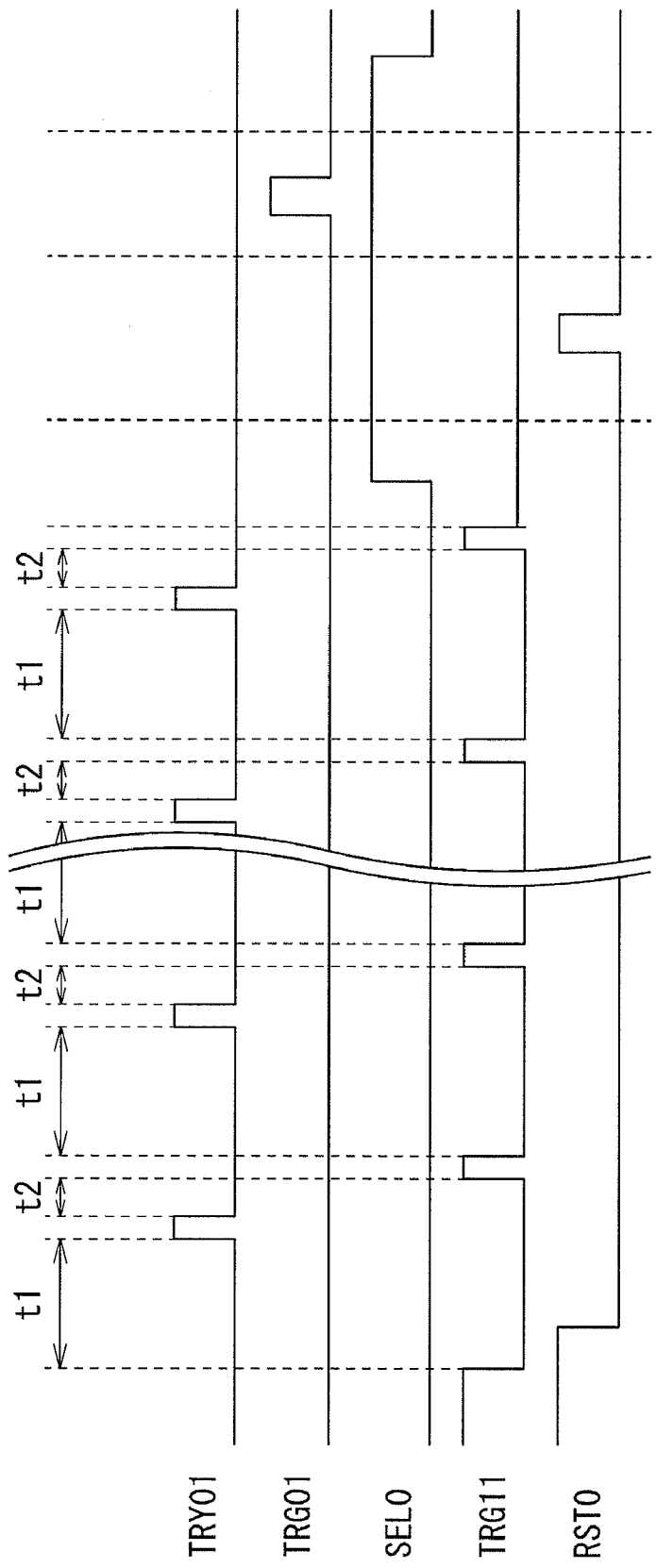

FIG. 27 is a schematic illustration of an example of a plan-view configuration of four sensor pixels 110 (sensor pixels 1100, 1101, 1102, and 1103) of the pixel array unit 111 in the imaging device 100L according to Modification 8 of the present disclosure. FIG. 28 is an illustration of an example of a circuit configuration of the sensor pixels 110 in the imaging device 100L illustrated in FIG. 27. FIG. 29 illustrates an example of a timing chart for driving the sensor pixels 110 of the imaging device 100L.

The first and second embodiments above and the like illustrate an example in which the two units MEM1 and MEM2 are provided, but one MEM (for example, MEM2) may also double as an FD (for example, FD1), for example. In other words, in the imaging device 100L of the present modification, a portion of the charge generated by the photoelectric conversion unit 11 is transferred directly to the floating diffusion FD.

Also, in the imaging device 100L of the present modification, for example, FD1 to which charge is transferred directly from PD0 in the sensor pixel 1100 is the destination of charge transfer from PD1 through a MEM (for example, MEM12) in the adjacent sensor pixel 1101. In this case, for example, the charge generated by PD0 and PD1 is stored in MEM01 and FD1, respectively. In the rolling readout period, first, the potential of FD0 is output in the state in which the charge from PD1 is stored in FD0. Thereafter, the potential is output after being reset, and finally the potential is output after transferring the charge stored in MEM01.

In this way, in the imaging device 100L of the present modification, because one of the two units MEM1 and MEM2 doubles as the floating diffusion FD, it is possible to maximize the area of the other MEM. With this arrangement, in addition to the effects of the first and second embodiments above, it is possible for signals of different sensitivities to be stored at the same time and read out separately.

(3-9. Modification 9)

Figure 30:
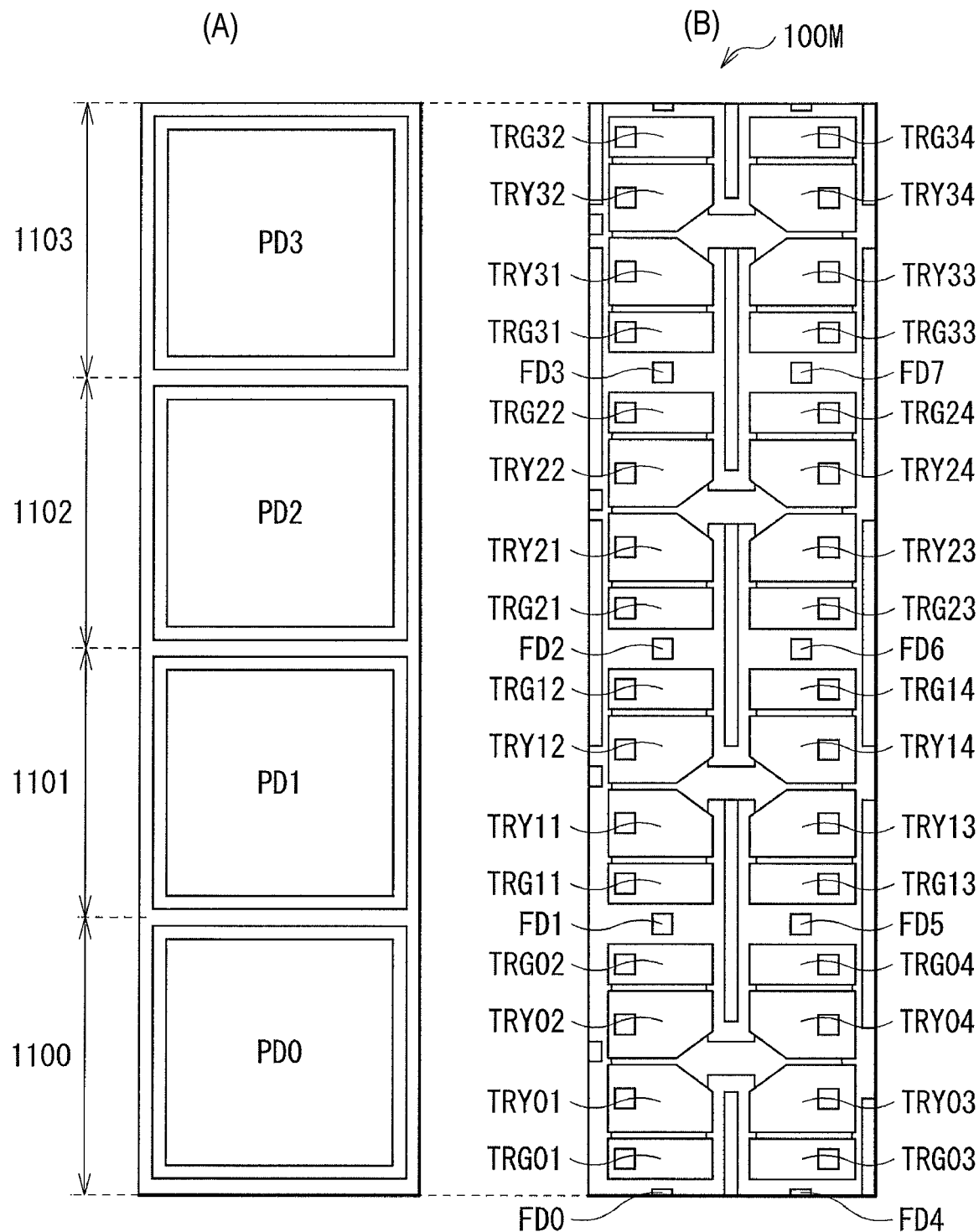
FIG. 30 is a schematic plan view illustrating one example of the configuration of sensor pixels in the imaging device according to Modification 9 of the present disclosure.
Figure 31:
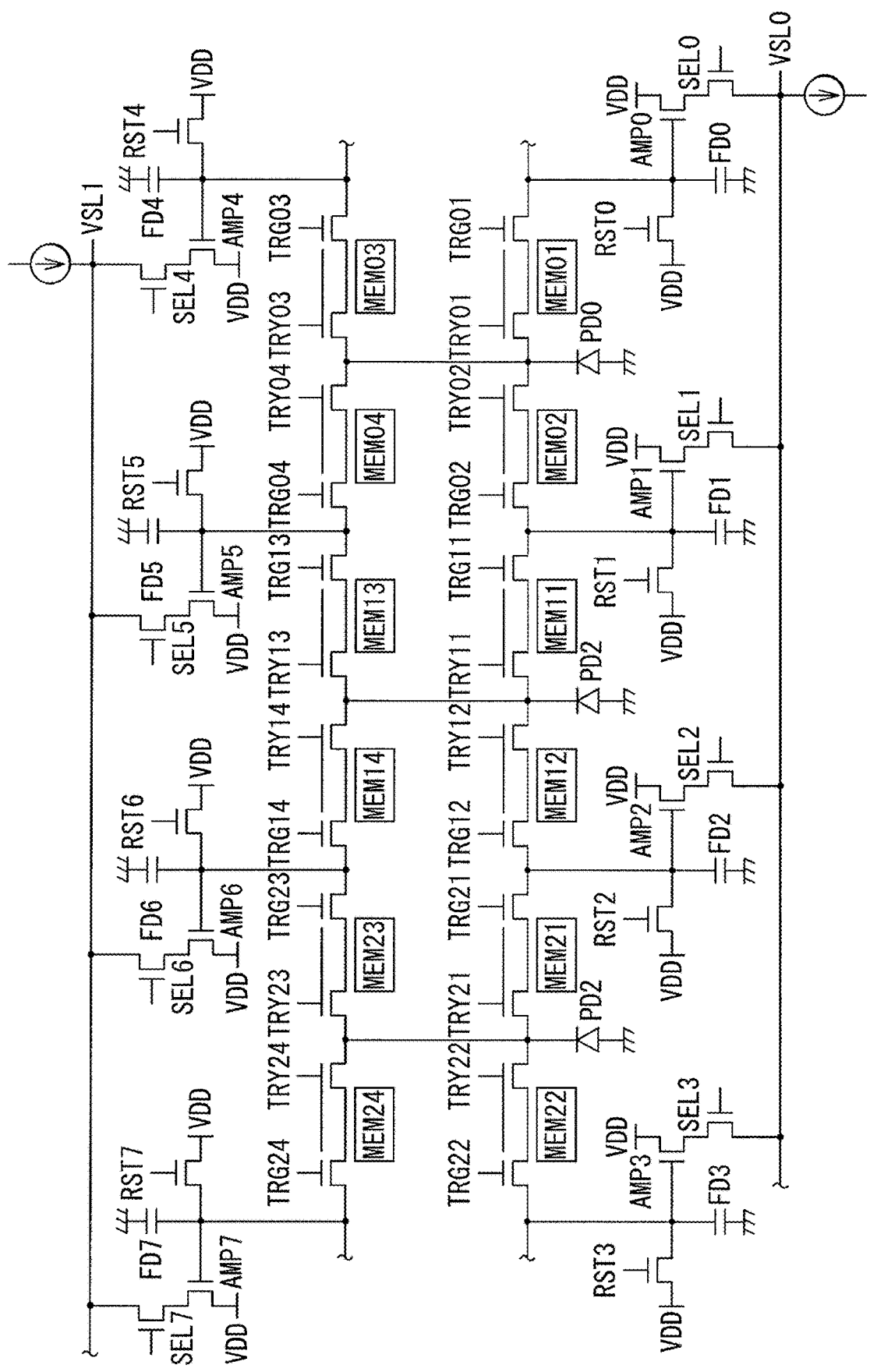
FIG. 31 is a circuit diagram illustrating a circuit configuration of the imaging device illustrated in FIG. 30.

FIG. 30 is a schematic illustration of an example of a plan-view configuration of four sensor pixels 110 (sensor pixels 1100, 1101, 1102, and 1103) of the pixel array unit 111 in the imaging device 100M according to Modification 9 of the present disclosure. FIG. 31 is an illustration of an example of a circuit configuration of the sensor pixels 110 in the imaging device 100M illustrated in FIG. 30.

The first and second embodiments above illustrate an example of providing the two units MEM1 and MEM2 with respect to one PD, but the number of MEMs is not limited to the above. For example, as illustrated in FIG. 30, four units MEM1, MEM2, MEM3, and MEM4 may be provided with respect to one photoelectric conversion unit PD.

Figure 32:
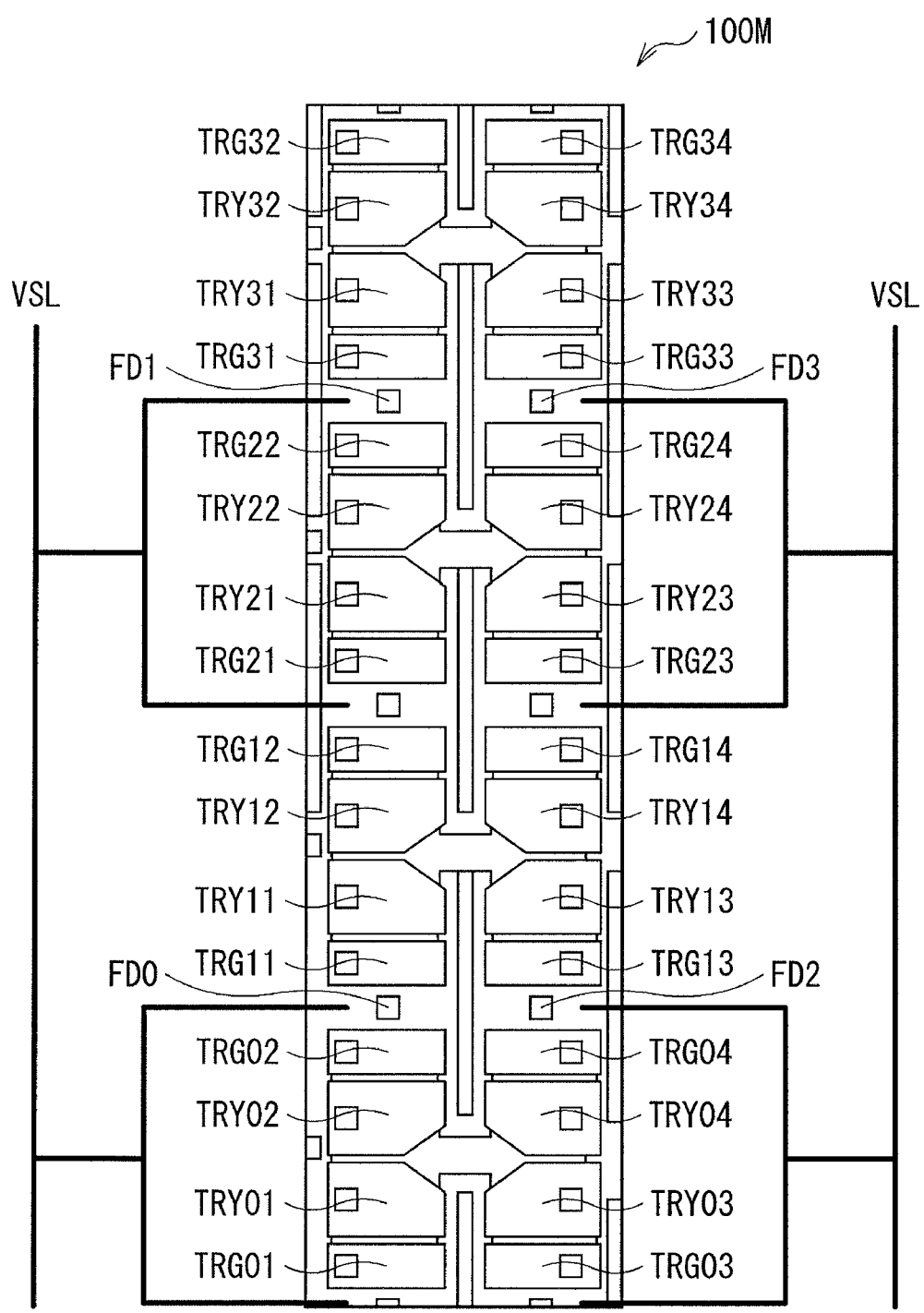
FIG. 32 is a schematic plan view illustrating another example of the configuration of sensor pixels in the imaging device according to Modification 9 of the present disclosure.
Figure 33:
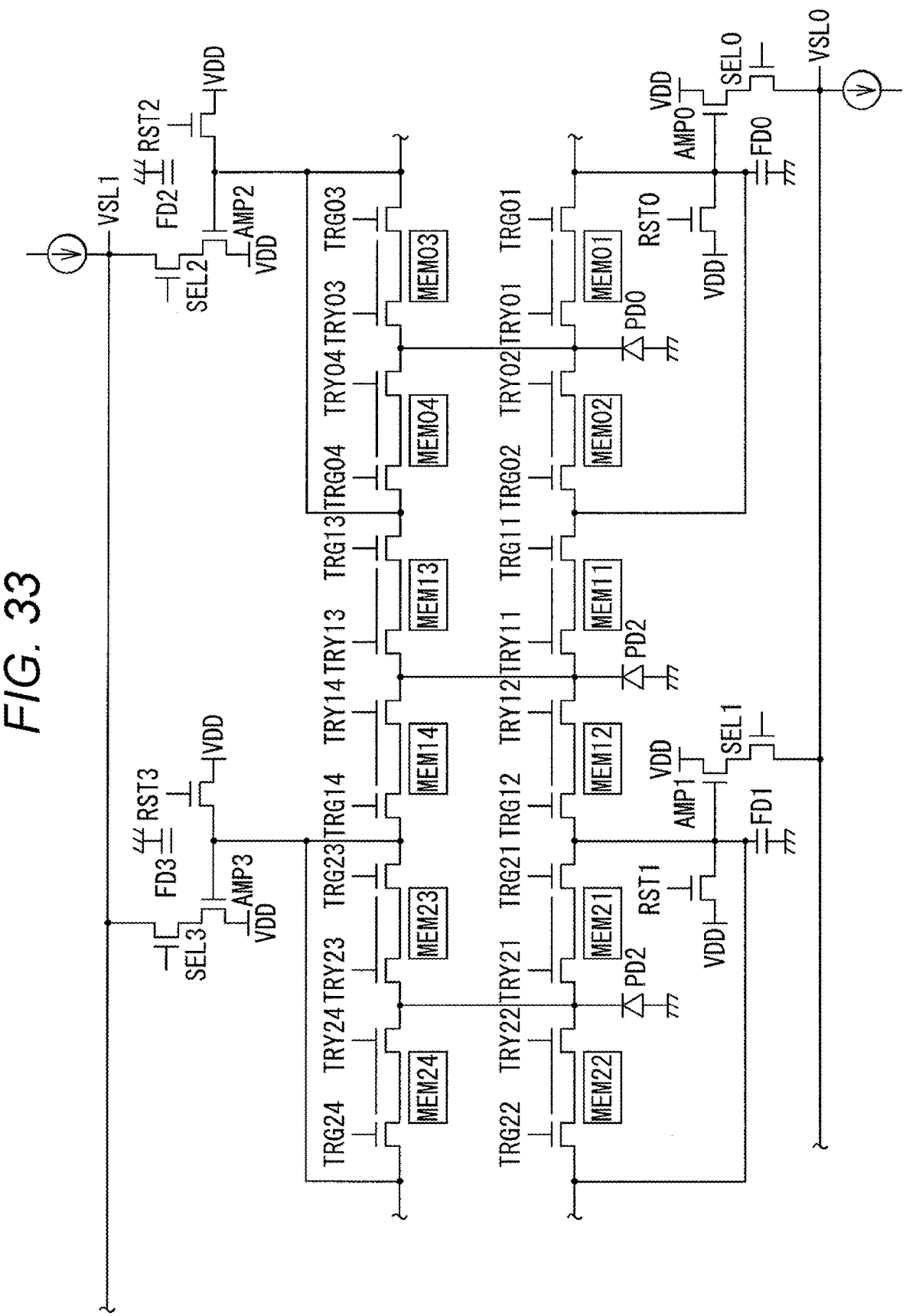
FIG. 33 is a circuit diagram illustrating a circuit configuration of the imaging device illustrated in FIG. 32.

FIG. 32 is a schematic illustration of another example of a plan-view configuration of four sensor pixels 110 (sensor pixels 1100, 1101, 1102, and 1103) of the pixel array unit 111 in the imaging device 100M according to Modification 9 of the present disclosure. FIG. 33 is an illustration of an example of a circuit configuration of the sensor pixels 110 in the imaging device 100M illustrated in FIG. 32.

As illustrated in FIG. 32, in the imaging device 100M of the present modification, two adjacent FDs (for example, FD0 and FD1, or FD2 and FD3) may be shorted by a vertical signal line VSL, for example. Also, FIGS. 32 and 33 illustrate an example of shorting two adjacent FDs, but four FDs may also be shorted for example. With this arrangement, the number of vertical signal lines VSL per pixel can be reduced, making it possible to improve the degree of freedom in interconnect layout. Furthermore, the occurrence of short failures between interconnects can be reduced, making it possible to improve manufacturing yield.

4. EXAMPLES OF APPLICATION

Figure 34:
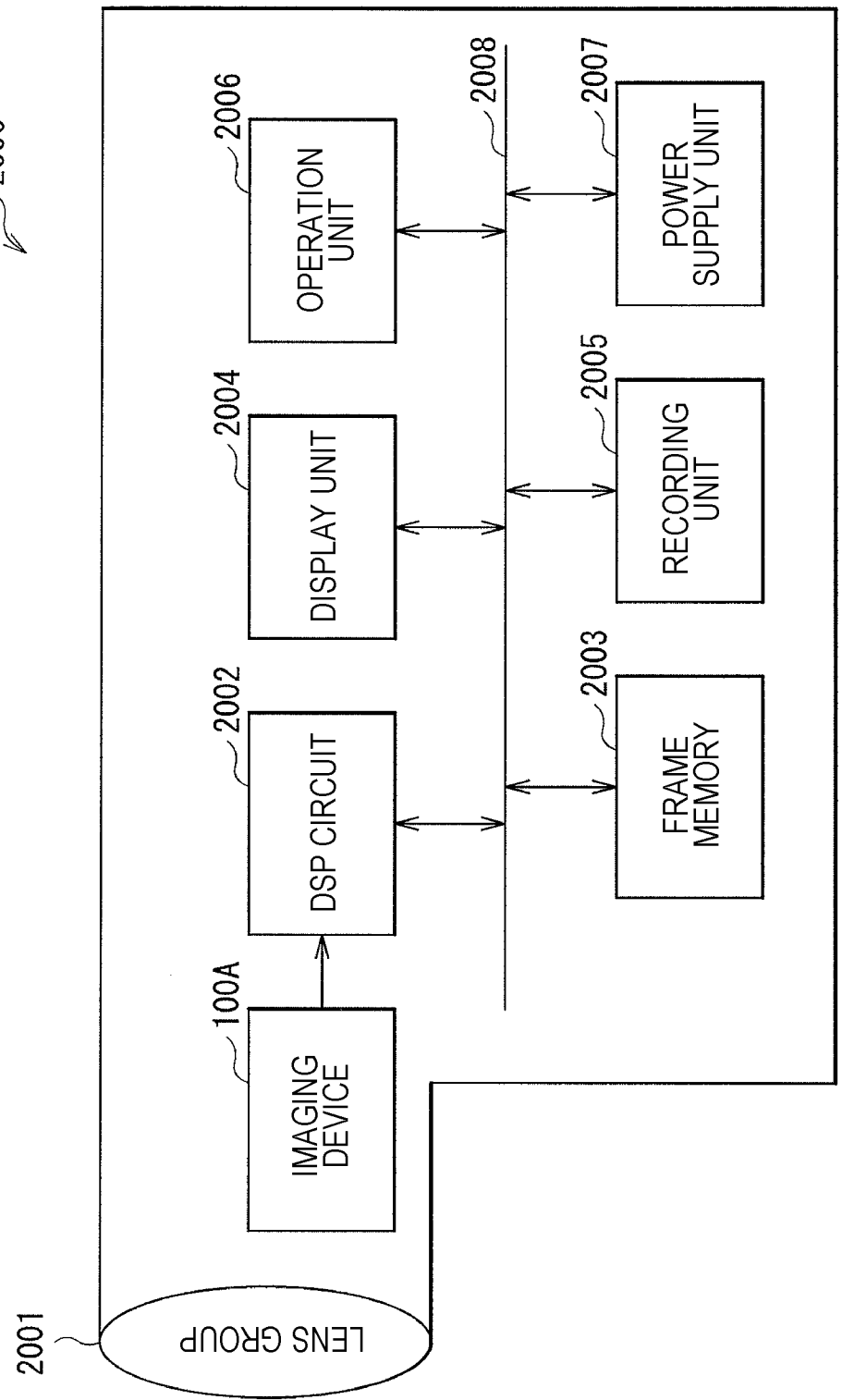
FIG. 34 is a schematic diagram illustrating an exemplary overall configuration of an electronic device (camera).

FIG. 34 is a block diagram showing a configuration example of a camera 2000 that is an electronic device to which the present technology is applied.

The camera 2000 includes an optical unit 2001 including lens groups and the like, an imaging device (capturing image device) 100A to which the above-described imaging device (for example, 100A or the like) is applied, and a digital signal processor (DSP) circuit 2002 which is a camera signal processing circuit. In addition, the camera 2000 includes a frame memory 2003, a display unit 2004, a recording unit 2005, an operation unit 2006, and a power supply unit 2007. The DSP circuit 2002, the frame memory 2003, the display unit 2004, the recording unit 2005, the operation unit 2006, and the power supply unit 2007 are connected to one another through a bus line 2008.

The optical unit 2001 captures incident light (image light) from a subject to form an image on the imaging surface of the imaging device 100A. The imaging device 100A converts a light intensity of incident light formed as an image on the imaging surface by the optical unit 2001 into electrical signals in units of pixels, and outputs the converted signals as pixel signals.

The display unit 2004 includes a panel type display device, for example, a liquid crystal panel, an organic EL panel, or the like, and displays a moving image or a still image captured by the imaging device 100A. The recording unit 2005 records the moving image or the still image captured by the imaging device 100A in a recording medium such as a hard disk or a semiconductor memory.

The operation unit 2006 issues an operation command regarding various functions of the camera 2000 according to an operation performed by a user. The power supply unit 2007 appropriately supplies various power supplies which are operation power supplies for the DSP circuit 2002, the frame memory 2003, the display unit 2004, the recording unit 2005, and the operation unit 2006 to these supply targets.

As described above, by using the imaging device 100A and the like described above as the imaging device, the acquisition of favorable images can be anticipated.

Figure 35:
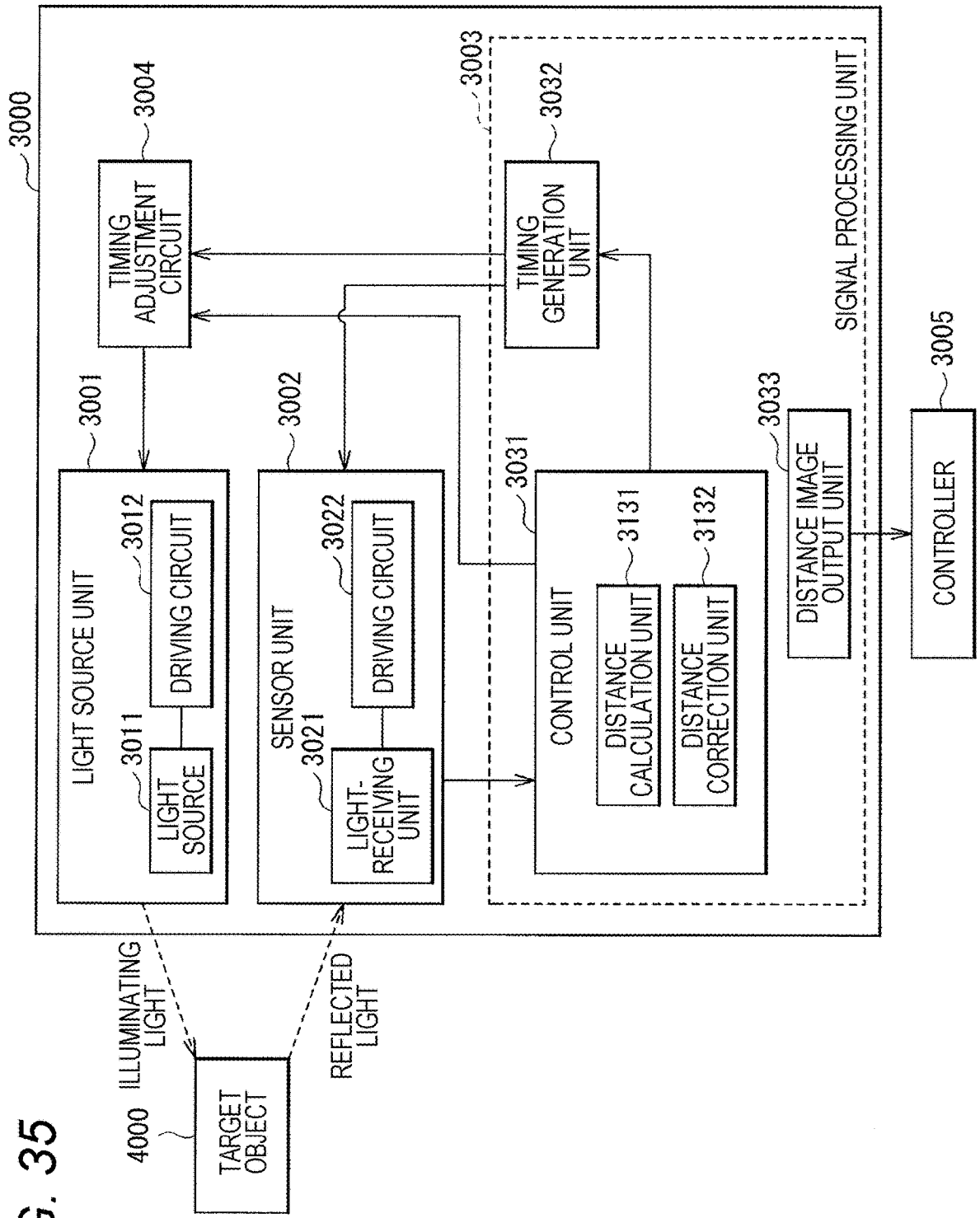
FIG. 35 is a schematic diagram illustrating an exemplary overall configuration of an electronic device (distance measuring device).

FIG. 35 is a block diagram illustrating an exemplary configuration of a distance-measuring device 3000 as an electronic device to which the present technology is applied.

The distance-measuring device 3000 measures distance according to a method of measuring the spatial propagation time of light (time of flight; TOF). The distance-measuring device 3000 includes a light source unit 3001, a sensor unit 3002, a signal processing unit 3003, a timing adjustment circuit 3004, and a controller 3005.

The light source unit 3001 includes a light source 3011 and a driving circuit 3012, for example. The sensor unit 3002 includes a light-receiving unit 3021 and a driving circuit 3022, for example. The signal processing unit 3003 includes a control unit 3031, a timing generation unit 3032, and a distance image output unit 3033, for example. The control unit 3031 includes a distance calculation unit 3131 and a distance correction unit 3132.

In the distance-measuring device 3000, the driving of the light source unit 3001 and the sensor unit 3002 is synchronized by the timing generation unit 3032. In the light source unit 3001, a target object 4000 is irradiated with illuminating light on the basis of a trigger from the timing adjustment circuit 3004. In the sensor unit 3002, when irradiating the target object 4000 with illuminating light, the intensity of reflected light reflected from the target object 4000 is received by the light-receiving unit 3021. The intensity of reflected light is correlated with the distance between the driving timing of the sensor unit 3002 and the distance to the target object 4000. The sensor unit 3002 outputs a signal voltage corresponding to the intensity of the reflected light incident on the sensor unit 3002 as an output signal to the control unit 3031. In the control unit 3031, the distance to the target object 4000 is calculated in the distance calculation unit 3131 from the output signal and the driving timing, corrected in the distance correction unit 3132, and distance image data is output. The distance image output unit 3033 outputs the distance image data obtained from the control unit 3031 to the controller 3005.

Figure 36:
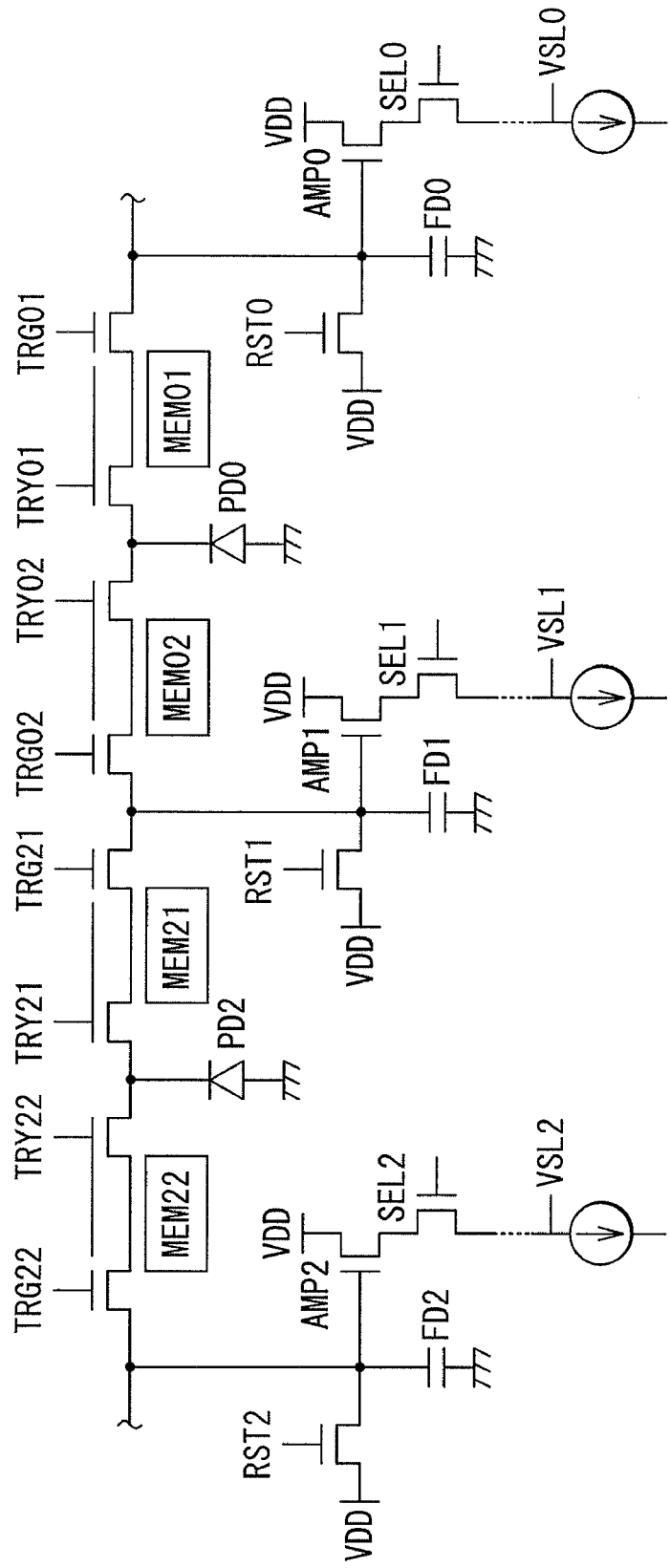
FIG. 36 is a circuit diagram illustrating a circuit configuration in a sensor unit of the distance measuring device illustrated in FIG. 35.

FIG. 36 illustrates one example of a circuit configuration of sensor pixels included in the sensor unit 3002 of the distance-measuring device 3000. FIG. 37 illustrates a timing chart for driving the sensor pixels included in the sensor unit 3002. The illuminating light radiated from the light source unit 3001 reflects off the target object 4000. The reflected light reflected from the target object 4000 is incident on the sensor unit 3002 after a delay by t1. At this time, for example, the charge generated by PD0 is distributed to MEM01 and MEM02 by a ratio corresponding to t2 and t3. From the output of MEM01 and MEM02 and the driving timings of the first transfer transistor TRY01 and the first transfer transistor TRY02, the distance to the target object 4000 can be calculated.

5. EXAMPLES OF PRACTICAL USE

The technology (present technology) according to an embodiment of the present disclosure is applicable to a variety of products. For example, the technology according to an embodiment of the present disclosure is implemented as devices mounted on any type of mobile objects such as automobiles, electric vehicles, hybrid electric vehicles, motorcycles, bicycles, personal mobilities, airplanes, drones, ships, and robots.

FIG. 38 is a block diagram illustrating a schematic configuration example of a vehicle control system which is an example of a mobile object control system to which a technology according to an embodiment of the present technology is applicable.

The vehicle control system 12000 includes a plurality of electronic control units connected to each other via a communication network 12001. In the example depicted in FIG. 21, the vehicle control system 12000 includes a driving system control unit 12010, a body system control unit 12020, an outside-vehicle information detecting unit 12030, an in-vehicle information detecting unit 12040, and an integrated control unit 12050. In addition, as functional configurations of the integrated control unit 12050, a microcomputer 12051, a sound/image output section 12052, and a vehicle-mounted network interface (I/F) 12053 are illustrated.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electrical signal corresponding to a received light amount of the light. The imaging section 12031 can output the electrical signal as an image, or can output the electrical signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or auditorily notifying an occupant of the vehicle or the outside of the vehicle of information. In the example of FIG. 38, an audio speaker 12061, a display section 12062, and an instrument panel 12063 are exemplified as the output device. The display section 12062 may, for example, include at least one of an on-board display or a head-up display.

FIG. 39 is a diagram illustrating an example of an installation position of the imaging section 12031.

In FIG. 39, imaging sections 12101, 12102, 12103, 12104, and 12105 are included as the imaging section 12031.

Imaging sections 12101, 12102, 12103, 12104, and 12105 are positioned, for example, at the front nose, a side minor, the rear bumper, the back door, and the upper part, or the like, of the windshield in the vehicle compartment of a vehicle 12100. The imaging section 12101 provided to the front nose and the imaging section 12105 provided to the upper portion of the windshield within the interior of the vehicle obtain mainly an image of the front of the vehicle 12100. The imaging sections 12102 and 12103 attached to the side mirrors chiefly acquire images of the areas on the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Additionally, FIG. 39 illustrates an example of the imaging ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the side view minors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, and other three-dimensional objects such as a utility pole, etc. on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. Further, the sound/image output section 12052 may also control the display section 12062 so that an icon or the like representing the pedestrian is displayed at a desired position.

In the above, an example of the vehicle control system to which the technology related to the present technology can be applied is described. The technology according to the present disclosure can be applied to the imaging section 12031 within the above-described configuration. Specifically, the imaging device 100A or the like illustrated in FIG. 1 or the like can be applied to the imaging section 12031. By applying the technology of the present disclosure to the imaging section 12031, excellent operation of the vehicle control system can be expected.

The above describes the present disclosure by citing the first and second embodiments, Modifications 1 to 9, and examples of application as well as examples of practical use, but the present disclosure is not limited to the embodiments and the like above, and various modifications are possible. For example, the first embodiment and the like describe an example of a back-illuminated image sensor of the global shutter method, but the imaging device of the present disclosure is not limited to a back-illuminated image sensor, and is also applicable to a front-illuminated image sensor.

Also, the imaging device of the present disclosure may take the form of a module in which an imaging section and a signal processing unit or an optical system are packaged together.

Note that effects described in the present specification are merely examples, and the effects are not limited to the effects described in the present specification. There may be effects other than those described in the present specification.

Additionally, the present technology may also be configured as below. According to an embodiment of the present technology with the following configuration, a photoelectric conversion unit is disposed on a first surface of a semiconductor substrate while two charge storage units are disposed on a second surface of the semiconductor substrate, and therefore the area of the photoelectric conversion unit and the two charge storage units inside a sensor pixel is expanded. Consequently, it is possible to achieve an imaging device having a greater saturation charge as well as higher sensitivity.

(1)
An imaging device including:
a first semiconductor substrate of a first conductivity type that includes a first surface and a second surface on an opposite side from the first surface;
a photoelectric conversion unit of a second conductivity type, embedded into the first surface of the first semiconductor substrate, that generates a charge corresponding to an amount of received light by photoelectric conversion;
a first charge storage unit and a second charge storage unit both which are the second conductivity type, embedded in parallel into the second surface of the first semiconductor substrate, that store the charge generated in the photoelectric conversion unit;
a first charge transfer unit that transfers the charge from the photoelectric conversion unit to the first charge storage unit; and
a second charge transfer unit that transfers the charge from the photoelectric conversion unit to the second charge storage unit.

(2)
The imaging device according to (1), in which a pitch in a first direction of the first charge storage unit and the second charge storage unit is substantially half of a pitch in a first direction of the photoelectric conversion unit.

(3)
The imaging device according to (1) or (2), in which a direction of the transfer of the charge from the photoelectric conversion unit to the first charge storage unit is the opposite direction of a direction of the transfer of the charge from the photoelectric conversion unit to the second charge storage unit.

(4)
The imaging device according to any one of (1) to (3), further including:
a first charge-voltage conversion unit to which the charge is transferred from the first charge storage unit; and
a second charge-voltage conversion unit to which the charge is transferred from the second charge storage unit.

(5)
The imaging device according to (2) or (3), further including:
a first charge-voltage conversion unit to which the charge is transferred from the first charge storage unit; and
a second charge-voltage conversion unit to which the charge is transferred from the second charge storage unit, in which
a plurality of the photoelectric conversion units is disposed in a second direction orthogonal to the first direction,
the plurality of photoelectric conversion units includes a first photoelectric conversion unit, a second photoelectric conversion unit, a third photoelectric conversion unit, and
a fourth photoelectric conversion unit disposed in order, and
the first charge-voltage conversion unit is shared by the first photoelectric conversion unit and the third photoelectric conversion unit, and the second charge-voltage conversion unit is shared by the second photoelectric conversion unit and the fourth photoelectric conversion unit.

(6)
The imaging device according to (5), in which the first photoelectric conversion unit and the second photoelectric conversion unit share the first charge-voltage conversion unit and the second charge-voltage conversion unit with each other.

(7)
The imaging device according to (6), in which a pitch in the first direction of the first charge storage unit and the second charge storage unit is the same pitch as the pitch in the first direction of the photoelectric conversion unit.

(8)
The imaging device according to any one of (1) to (7), in which a part of the photoelectric conversion unit extends toward the second surface.

(9)
The imaging device according to any one of (1) to (8), in which the first semiconductor substrate additionally includes one or a plurality of vertical transistors that is provided on the first surface and reaches the photoelectric conversion unit.

(10)
The imaging device according to (9), in which
the first semiconductor substrate includes a first vertical transistor and a second vertical transistor as the plurality of vertical transistors, and
a line joining the first vertical transistor and the second vertical transistor is orthogonal to an array direction of the first charge storage unit and the second charge storage unit.

(11)
The imaging device according to any one of (1) to (10), in which
the first semiconductor substrate additionally includes a plurality of vertical transistors that is provided on the first surface and reaches the photoelectric conversion unit, and
the plurality of vertical transistors doubles as a part of the first charge transfer unit and the second charge transfer unit.

(12)
The imaging device according to any one of (1) to (11), further including: a discharge transistor that resets the photoelectric conversion unit.

(13)
The imaging device according to (12), in which a direction of the transfer of the charge from the photoelectric conversion unit to the first charge storage unit and the second charge storage unit is orthogonal to a direction of the transfer of the charge from the photoelectric conversion unit to the discharge transistor.

(14)
The imaging device according to any one of (1) to (13), in which the first charge storage unit and the second charge storage unit have mutually different sizes.

(15)
The imaging device according to any one of (4) to (14), in which the first charge-voltage conversion unit doubles as the first charge storage unit.

(16)
The imaging device according to any one of (4) to (15), in which the first semiconductor substrate additionally includes a readout circuit that performs a readout of signals output from the first charge-voltage conversion unit and the second charge-voltage conversion unit.

(17)
The imaging device according to any one of (4) to (16), further including: a second semiconductor substrate provided with a pixel circuit that performs a readout of signals output from the first charge-voltage conversion unit and the second charge-voltage conversion unit, in which
the second semiconductor substrate is laminated onto the second surface of the first semiconductor substrate with an interlayer insulating film in between.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST 10, 40 Semiconductor substrate
11 Photoelectric conversion unit (PD)
12A, 12B Charge storage unit (MEM)
13, 14 Floating diffusion (FD)
15 VDD contact region
16 VSL contact region
17 Pixel isolation part
18 Isolating film
19A, 19B, 19C, 19D Transfer gate electrode
19E Discharge gate electrode
20, 50 Interconnect layer
21, 51 Insulating film
22A, 23A First transfer transistor (TRY)
22B, 23B Second transfer transistor (TRG)
24 Reset transistor (RST)
25 Select transistor (SEL)
26 Amplification transistor (AMP)
27, 52 Interlayer insulating film
28, 53 Pad electrode
54 Vias
31 Color filter
32 On-chip lens
100A to 100M Imaging device
110, 1100, 1101, 1102, 1103 Sensor pixel
111 Pixel array unit
112 Vertical driving unit
113 Column signal processing unit
114 Horizontal driving unit
115 System control unit
116 Pixel driving line
117 Vertical signal line (VSL)
118 Signal processing unit
119 Data storage unit

What is claimed is:
1. An imaging device, comprising:
a first semiconductor substrate of a first conductivity type that includes a first surface and a second surface on an opposite side from the first surface;
a photoelectric conversion unit of a second conductivity type, embedded into the first surface of the first semiconductor substrate, that generates a charge corresponding to an amount of received light by photoelectric conversion;
a first charge storage unit and a second charge storage unit both of which are the second conductivity type, embedded in parallel into the second surface of the first semiconductor substrate, that store the charge generated in the photoelectric conversion unit;
a first charge transfer unit that transfers the charge from the photoelectric conversion unit to the first charge storage unit;
a second charge transfer unit that transfers the charge from the photoelectric conversion unit to the second charge storage unit;

a first charge-voltage conversion unit to which the charge is transferred from the first charge storage unit; and a second charge-voltage conversion unit to which the charge is transferred from the second charge storage unit, wherein a pitch in a first direction of the first charge storage unit and the second charge storage unit is substantially half of a pitch in a first direction of the photoelectric conversion unit, wherein a plurality of the photoelectric conversion units is disposed in a second direction orthogonal to the first direction, wherein the plurality of photoelectric conversion units includes a first photoelectric conversion unit, a second photoelectric conversion unit, a third photoelectric conversion unit, and a fourth photoelectric conversion unit disposed in order, wherein the first charge-voltage conversion unit is shared by the first photoelectric conversion unit and the third photoelectric conversion unit, and wherein the second charge-voltage conversion unit is shared by the second photoelectric conversion unit and the fourth photoelectric conversion unit.

2. The imaging device according to claim 1, wherein the first photoelectric conversion unit and the second photoelectric conversion unit share the first charge-voltage conversion unit and the second charge-voltage conversion unit with each other.

3. The imaging device according to claim 2, wherein a pitch in the first direction of the first charge storage unit and the second charge storage unit is the same as the pitch in the first direction of the photoelectric conversion unit.

4. The imaging device according to claim 1, wherein a part of the photoelectric conversion unit extends toward the second surface.

5. The imaging device according to claim 1, wherein the first semiconductor substrate additionally includes one or a plurality of vertical transistors that is provided on the first surface and reaches the photoelectric conversion unit.

6. The imaging device according to claim 5, wherein
the first semiconductor substrate includes a first vertical transistor and a second vertical transistor as the plurality of vertical transistors, and
a line joining the first vertical transistor and the second vertical transistor is orthogonal to an array direction of the first charge storage unit and the second charge storage unit.

7. The imaging device according to claim 1, wherein
the first semiconductor substrate additionally includes a plurality of vertical transistors that is provided on the first surface and reaches the photoelectric conversion unit, and
the plurality of vertical transistors doubles as a part of the first charge transfer unit and the second charge transfer unit.

8. The imaging device according to claim 1, further comprising:
a discharge transistor that resets the photoelectric conversion unit.

9. The imaging device according to claim 8, wherein a direction of the transfer of the charge from the photoelectric conversion unit to the first charge storage unit and the second charge storage unit is orthogonal to a direction of the transfer of the charge from the photoelectric conversion unit to the discharge transistor.

10. The imaging device according to claim 1, wherein the first charge storage unit and the second charge storage unit have mutually different sizes.

11. The imaging device according to claim 1, wherein the first charge-voltage conversion unit doubles as the first charge storage unit.

12. The imaging device according to claim 1, wherein a direction of the transfer of the charge from the photoelectric conversion unit to the first charge storage unit is the opposite direction of a direction of the transfer of the charge from the photoelectric conversion unit to the second charge storage unit.

13. An imaging device, comprising:
a first semiconductor substrate of a first conductivity type that includes a first surface and a second surface on an opposite side from the first surface;
a photoelectric conversion unit of a second conductivity type, embedded into the first surface of the first semiconductor substrate, that generates a charge corresponding to an amount of received light by photoelectric conversion;
a first charge storage unit and a second charge storage unit both which are of the second conductivity type, embedded in parallel into the second surface of the first semiconductor substrate, that store the charge generated in the photoelectric conversion unit;
a first charge transfer unit that transfers the charge from the photoelectric conversion unit to the first charge storage unit;
a second charge transfer unit that transfers the charge from the photoelectric conversion unit to the second charge storage unit;
a first charge-voltage conversion unit to which the charge is transferred from the first charge storage unit; and
a second charge-voltage conversion unit to which the charge is transferred from the second charge storage unit, wherein the first semiconductor substrate additionally includes a readout circuit that performs a readout of signals output from the first charge-voltage conversion unit and the second charge-voltage conversion unit.

14. The imaging device according to claim 13, wherein a part of the photoelectric conversion unit extends toward the second surface.

15. The imaging device according to claim 13, wherein the first semiconductor substrate additionally includes one or a plurality of vertical transistors that is provided on the first surface and reaches the photoelectric conversion unit.

16. The imaging device according to claim 15, wherein
the first semiconductor substrate includes a first vertical transistor and a second vertical transistor as the plurality of vertical transistors, and
a line joining the first vertical transistor and the second vertical transistor is orthogonal to an array direction of the first charge storage unit and the second charge storage unit.

17. The imaging device according to claim 13, wherein
the first semiconductor substrate additionally includes a plurality of vertical transistors that is provided on the first surface and reaches the photoelectric conversion unit, and
the plurality of vertical transistors doubles as a part of the first charge transfer unit and the second charge transfer unit.

18. The imaging device according to claim 13, further comprising:

a discharge transistor that resets the photoelectric conversion unit.

19. The imaging device according to claim 18, wherein a direction of the transfer of the charge from the photoelectric conversion unit to the first charge storage unit and the second charge storage unit is orthogonal to a direction of the transfer of the charge from the photoelectric conversion unit to the discharge transistor.

20. An imaging device, comprising:
- a first semiconductor substrate of a first conductivity type that includes a first surface and a second surface on an opposite side from the first surface;
- a photoelectric conversion unit of a second conductivity type, embedded into the first surface of the first semiconductor substrate, that generates a charge corresponding to an amount of received light by photoelectric conversion;
- a first charge storage unit and a second charge storage unit both which are of the second conductivity type, embedded in parallel into the second surface of the first semiconductor substrate, that store the charge generated in the photoelectric conversion unit;
- a first charge transfer unit that transfers the charge from the photoelectric conversion unit to the first charge storage unit;
- a second charge transfer unit that transfers the charge from the photoelectric conversion unit to the second charge storage unit;
- a first charge-voltage conversion unit to which the charge is transferred from the first charge storage unit;
- a second charge-voltage conversion unit to which the charge is transferred from the second charge storage unit; and
- a second semiconductor substrate provided with a pixel circuit that performs a readout of signals output from the first charge-voltage conversion unit and the second charge-voltage conversion unit,
- wherein the second semiconductor substrate is laminated onto the second surface of the first semiconductor substrate with an interlayer insulating film in between.

* * * * *